(12) United States Patent
Hansen et al.

(10) Patent No.: US 9,563,135 B2
(45) Date of Patent: Feb. 7, 2017

(54) PROCESS TUNING WITH POLARIZATION

(75) Inventors: Steven George Hansen, Phoenix, AZ (US); Heine Melle Mulder, Veldhoven (NL); Tsann-Bim Chiou, Hsinchu (TW)

(73) Assignee: ASML NETHERLANDS B.V., Veldhoven (NL)

( * ) Notice: Subject to any disclaimer, the term of this patent is extended or adjusted under 35 U.S.C. 154(b) by 1196 days.

(21) Appl. No.: 13/239,034

(22) Filed: Sep. 21, 2011

(65) Prior Publication Data

US 2012/0075603 A1   Mar. 29, 2012

Related U.S. Application Data

(60) Provisional application No. 61/385,825, filed on Sep. 23, 2010, provisional application No. 61/472,431, filed on Apr. 6, 2011.

(51) Int. Cl.
*G03B 27/68* (2006.01)
*G03B 27/54* (2006.01)
(Continued)

(52) U.S. Cl.
CPC ......... *G03F 7/70566* (2013.01); *G03F 7/7005* (2013.01); *G03F 7/70625* (2013.01)

(58) Field of Classification Search
CPC .. G03F 7/7005; G03F 7/7055; G03F 7/70566; G03F 7/70558; G03F 7/70625; G03F 7/705; G03F 7/70516
(Continued)

(56) References Cited

U.S. PATENT DOCUMENTS 7,292,315 B2   11/2007   Socha et al.
7,525,642 B2   4/2009   Mulder et al.
(Continued)

FOREIGN PATENT DOCUMENTS

JP   H02-042567   2/1990
JP   2005-183938   7/2005
(Continued)

OTHER PUBLICATIONS

Japanese Office Action mailed Oct. 30, 2012 in corresponding Japanese Patent Application No. 2011-202518.

*Primary Examiner* — Christina Riddle
(74) *Attorney, Agent, or Firm* — Pillsbury Winthrop Shaw Pittman LLP

(57) ABSTRACT

A method for configuring an illumination source of a lithographic apparatus, the method including dividing the illumination source into pixel groups, each pixel group including one or more illumination source points in a pupil plane of the illumination source; changing a polarization state of each pixel group and determining an incremental effect on each of the plurality of critical dimensions resulting from the change of polarization state; calculating a first plurality of sensitivity coefficients for each of the plurality of critical dimensions using the determined incremental effects; selecting an initial illumination source; iteratively calculating a lithographic metric as a result of a change of polarization state using the calculated first plurality of sensitivity coefficients, the change of the polarization state of the pixel group in the initial illumination source creating a modified illumination source; and adjusting the initial illumination source based on the iterative results of calculations.

19 Claims, 45 Drawing Sheets

(51) Int. Cl.
  *G03B 27/32* (2006.01)
  *G03F 7/20* (2006.01)
(58) Field of Classification Search
  USPC ......... 355/52, 53, 55, 67–71, 77; 250/492.1, 250/492.2, 492.22, 548; 430/8, 22, 30, 311, 430/321; 716/50–56
  See application file for complete search history.

(56) References Cited

U.S. PATENT DOCUMENTS

| | | | |
|---|---|---|---|
| 2005/0134822 A1* | 6/2005 | Socha et al. | 355/69 |
| 2006/0046168 A1* | 3/2006 | Fukuhara | 430/30 |
| 2006/0126046 A1* | 6/2006 | Hansen | 355/55 |
| 2007/0195305 A1 | 8/2007 | Mulder et al. | |
| 2008/0158529 A1* | 7/2008 | Hansen | G03F 1/144 355/53 |
| 2009/0053621 A1* | 2/2009 | Socha | 430/5 |
| 2009/0070083 A1* | 3/2009 | Zhang et al. | 703/4 |
| 2009/0217218 A1* | 8/2009 | Adam | 716/2 |
| 2009/0265148 A1 | 10/2009 | Zhang et al. | |
| 2009/0287461 A1* | 11/2009 | Lee et al. | 703/2 |
| 2010/0003605 A1* | 1/2010 | Gil et al. | 430/1 |
| 2010/0141925 A1* | 6/2010 | Cao | G03F 7/705 355/77 |
| 2010/0281449 A1* | 11/2010 | RosenBluth et al. | 716/19 |
| 2011/0116067 A1* | 5/2011 | Ye et al. | 355/67 |
| 2011/0139027 A1* | 6/2011 | Hansen | G03F 7/70125 101/450.1 |
| 2011/0230999 A1 | 9/2011 | Chen et al. | |

FOREIGN PATENT DOCUMENTS

| | | |
|---|---|---|
| JP | 2007-227918 | 9/2007 |
| JP | 2009-111223 | 5/2009 |
| JP | 2010-087389 | 4/2010 |
| WO | 2010/059954 | 5/2010 |

* cited by examiner

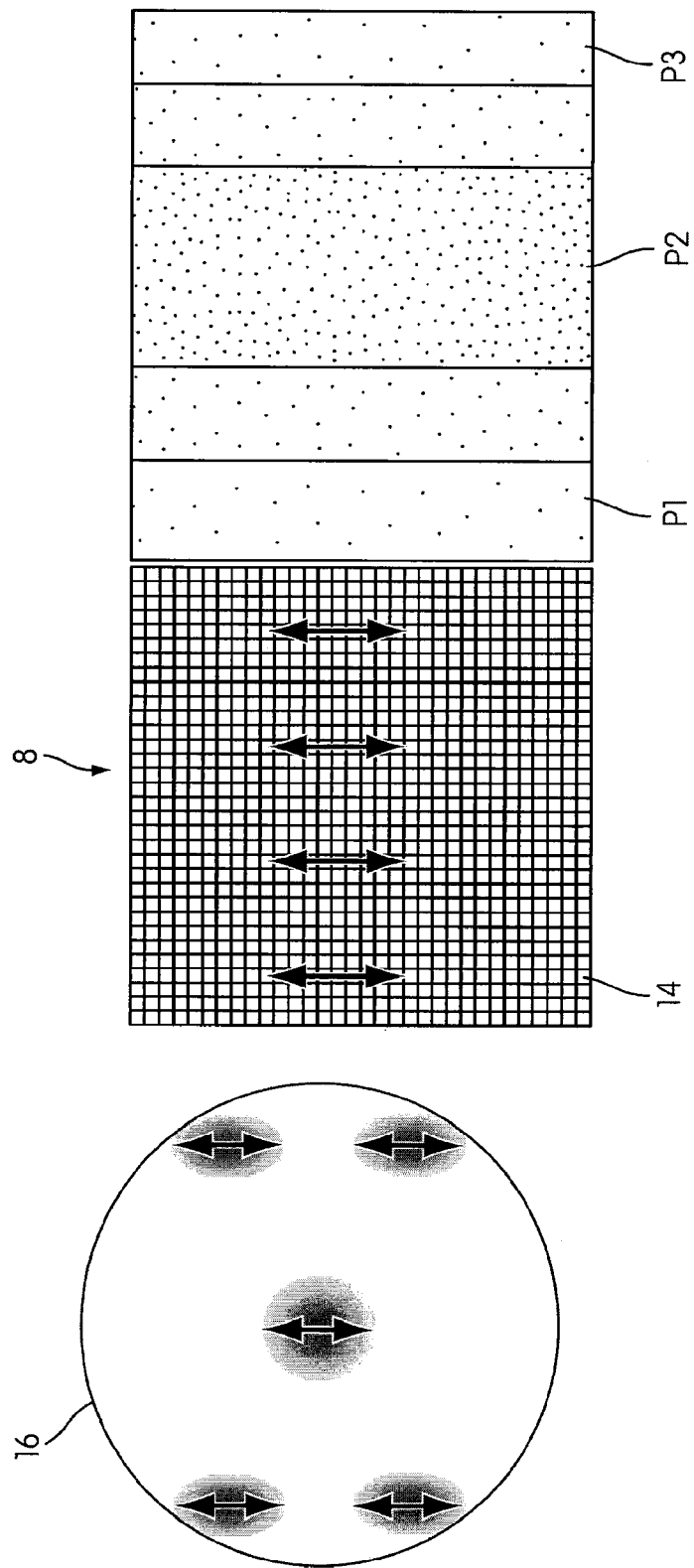

PROCESS TUNING WITH POLARIZATION

CROSS REFERENCE TO RELATED APPLICATIONS

This application claims priority and benefit under 35 U.S.C. §119(e) to U.S. Provisional Patent Application No. 61/385,825, entitled "Process Tuning With Polarization", filed on Sep. 23, 2010 and U.S. Provisional Patent Application No. 61/472,431, entitled "Process Tuning With Polarization", filed on Apr. 6, 2011. The contents of these applications are incorporated herein in their entirety by reference.

FIELD

The present invention relates to a lithographic apparatus and an illumination system.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes an illumination system, referred to hereafter as an illuminator. The illuminator receives radiation from a source, for example a laser, and produces an illumination beam for illuminating a patterning device. Within a typical illuminator, the beam is shaped and controlled such that at a pupil plane the beam has a desired spatial intensity distribution, also referred to as an illumination mode. Examples of types of illumination modes are conventional, dipole, asymmetric, quadrupole, hexapole and annular illumination modes. This spatial intensity distribution at the pupil plane effectively acts as a secondary radiation source for producing the illumination beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the illumination beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitude when an image of the illuminated object is projected onto a substrate. In particular, spatial intensity distributions with dipolar, annular or quadrupole off-axis illumination modes have been proposed to enhance the resolution and/or other parameters of the projection, such as sensitivity to projection system aberrations, exposure latitude and depth of focus.

Furthermore, the beam may be polarized. A correctly polarized beam may enhance image contrast and/or improve exposure latitude. These effects may result in an improved dimension uniformity of the imaged features. This eventually leads to an improved yield of the product.

SUMMARY

According to an aspect of the invention, there is provided a method for configuring an illumination source of a lithographic apparatus to enhance the imaging of a mask pattern on a substrate, the image of the mask pattern on the substrate having a plurality of critical dimensions, the method comprising dividing the illumination source into pixel groups, each pixel group including one or more illumination source points in a pupil plane of the illumination source; changing a polarization state of each pixel group and determining an incremental effect on each of the plurality of critical dimensions resulting from the change of polarization state of each pixel group; calculating a first plurality of sensitivity coefficients for each of the plurality of critical dimensions using the determined incremental effects; selecting an initial illumination source; iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source; and adjusting the initial illumination source based on the iterative results of calculations.

According to another aspect of the invention, there is provided a computer product having machine executable instructions, the instructions being executable by a machine to perform a method for configuring an illumination source of a lithographic apparatus to enhance the imaging of a mask pattern on a substrate, the image of the mask pattern on the substrate having a plurality of critical dimensions, the method comprising: dividing the illumination source into pixel groups, each pixel group including one or more illumination source points in a pupil plane of the illumination source; changing a polarization state of each pixel group and determining an incremental effect on each of the plurality of critical dimensions resulting from the change of polarization state of each pixel group; calculating a first plurality of sensitivity coefficients for each of the plurality of critical dimensions using the determined incremental effects; selecting an initial illumination source; iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source; and adjusting the initial illumination source based on the iterative results of calculations.

According to an aspect of the invention, there is provided a lithographic apparatus comprising: an illumination source configured to condition a beam of radiation; a substrate table configured to hold a substrate; a projection system configured to project a beam of radiation patterned by a patterning device onto a surface of the substrate; and a processor configured to perform a method for configuring the illumination source to enhance the imaging of a pattern on a substrate, the image of the pattern on the substrate having a plurality of critical dimensions, the method comprising: dividing the illumination source into pixel groups, each pixel group including one or more illumination source points in a pupil plane of the illumination source; changing a polarization state of each pixel group and determining an incremental effect on each of the plurality of critical dimensions resulting from the change of polarization state of each pixel group; calculating a first plurality of sensitivity coefficients for each of the plurality of critical dimensions using the determined incremental effects; selecting an initial illumination source; iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source; and adjusting the initial illumination source based on the iterative results of calculations.

In another aspect of the invention, there is provided a method for configuring an illumination source of a lithographic apparatus to enhance the imaging of a mask pattern, the method comprising: dividing a pupil plane of the illumination source into pixel groups, each pixel group including one or more illumination source pixels in the pupil plane; selecting an initial set of pixel groups of the illumination source as an initial illumination source; iteratively changing a polarization state of a pixel group from at least a subgroup of the set of selected pixel groups in the initial illumination source, calculating a lithographic metric associated with at least a part of the mask pattern as a result of the changed polarization state, and applying the change of the polarization state of the pixel group to generate a modified illumination source when the calculated lithographic metric is improved due to the changed polarization state; and adjusting the initial set of pixel groups of the illumination source based on the iterative results of calculations.

In yet another aspect of the invention, there is provided a method for configuring a transfer of an image of a pattern onto a substrate in a lithographic apparatus, said pattern to be illuminated by an illumination source of the lithographic apparatus, the method comprising: determining a first illumination source configured to illuminate the pattern; performing a source mask polarization optimization procedure that takes into account three dimensional effects associated with the pattern, the source mask polarization optimization procedure performed using the first illumination source as an initial illumination source in the source mask polarization optimization procedure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6a-d show a method for creating a freeform polarization in accordance with an embodiment of the invention;

DETAILED DESCRIPTION

Figure 1:
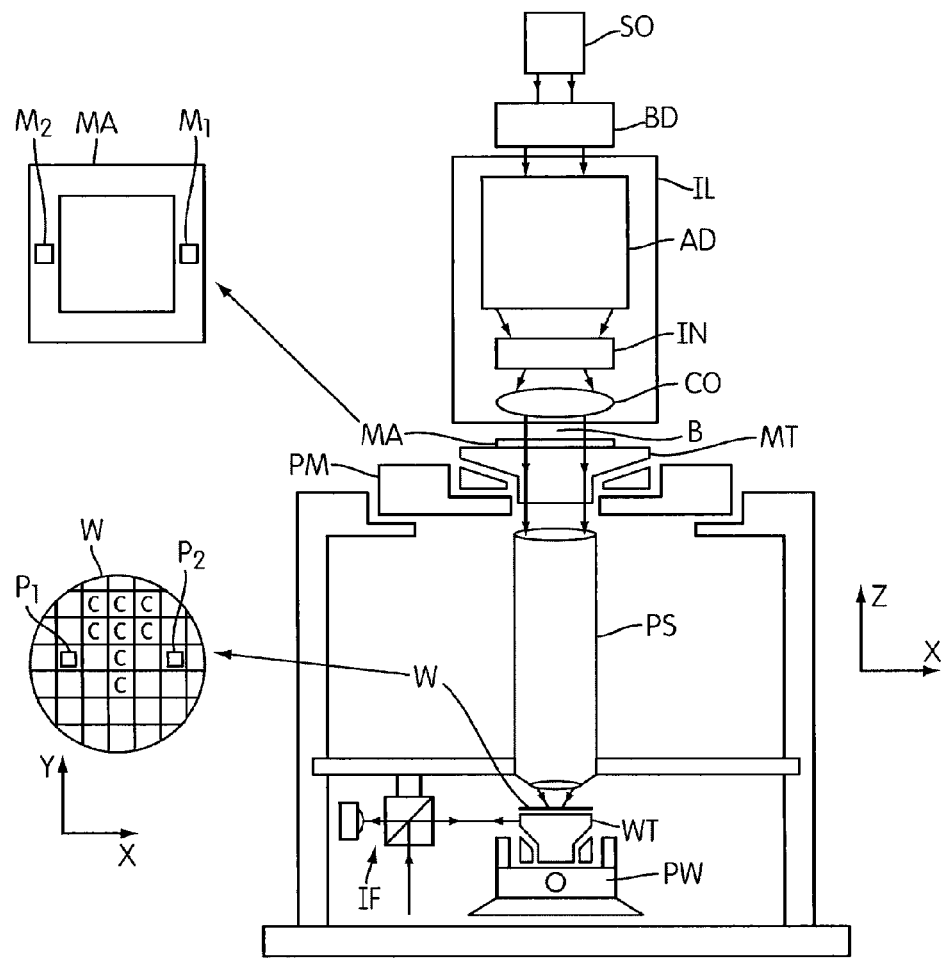
FIG. 1 shows a lithographic apparatus according to an embodiment of the invention.

FIG. 1 schematically shows a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, diffractive, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
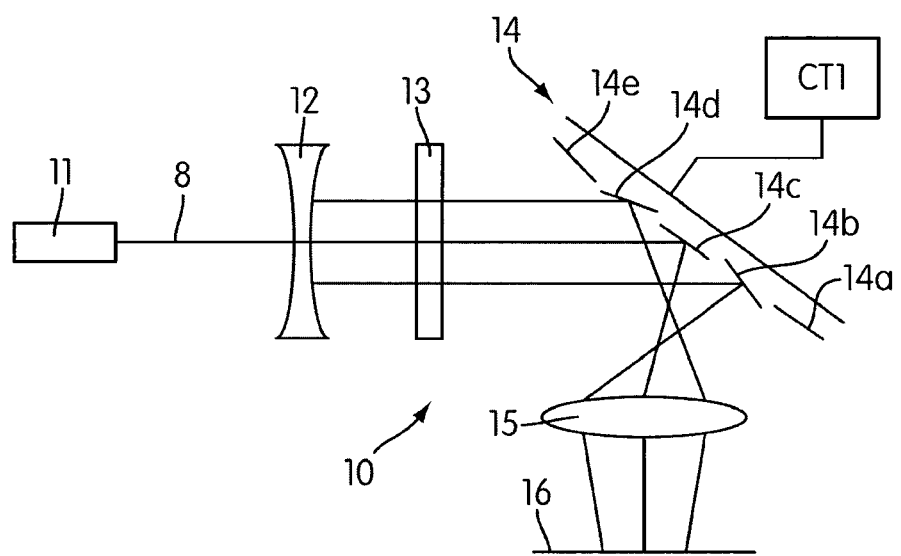
FIG. 2 shows an illumination system according to an embodiment of the invention.

FIG. 2 shows an example of an illuminator 10 connected to a radiation source 11, for example a Hg-lamp or laser or an EUV light source. The illuminator comprises in this order beam diverging optics 12, a polarization member 13, an array of reflective elements 14 and redirecting optics 15. In operation, the radiation source generates a collimated beam which is directed to the array of reflective elements 14 via the beam diverging optics 12 and the polarization member 13. The beam diverging optics expands the beam into a number of sub-beams, associating each of the sub-beams with a reflective element 14a, 14b, 14c, 14d, 14e of array 14 of reflective elements. The beam diverging optics 12 renders collimated beams. The cross-section of the expanded beam is sufficient such that the beam is incident at all or a subset of reflective elements 14a to 14e. FIG. 2 shows, by way of example, three sub-beams of the expanded beam. The beam diverging optics may additionally include a positive lens or lens array to set the divergence of the sub-beams. The polarization member 13, which polarizes the beam in a manner described further below, is located at or near a plane optically conjugate to the array of reflective elements 14.

FIG. 2 shows a first sub-beam incident at reflective element 14b. Like the other reflective elements 14a and 14c to 14e of the array 14, the reflective element 14b reflects the sub-beam to an intermediate plane 16 via re-directing optics 15. The reflective elements 14a-e of the array 14 are controlled by a controller CT1. The re-directing optics 15, for example a focusing lens, directs the sub-beam to a desired area in the intermediate plane 16 of the illuminator. The intermediate plane 16 may coincide with the pupil plane which acts as a secondary radiation source (as described above). Furthermore, the reflective elements 14c, 14d reflect the other two sub-beams shown to other areas of the intermediate plane 16 via the re-directing optics 15. By adjusting the orientations of the reflective elements 14a to 14e and thus determining the areas of the intermediate plane 16 on which the sub-beams are incident, almost any spatial intensity distribution in the intermediate plane 16 can be produced.

Although the array of reflective elements 14 is shown in FIG. 2 as five reflective elements 14a-e, in practice a significantly larger number of reflective elements may be provided in the array. The array may, for example, comprise a two-dimensional array. The array may, for example, comprise 100 reflective elements or more. In one embodiment, the array may include more than 1000 reflective elements.

Figure 3A:
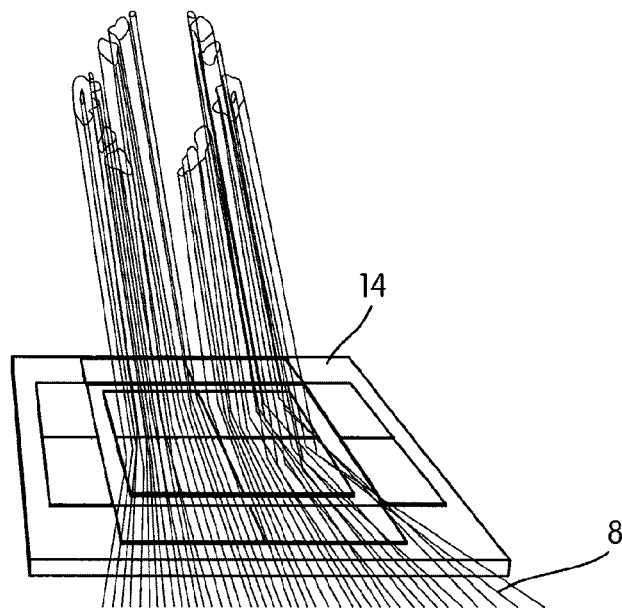
FIGS. 3a, b show an array of reflective elements in accordance with an embodiment of the invention.
Figure 3B:
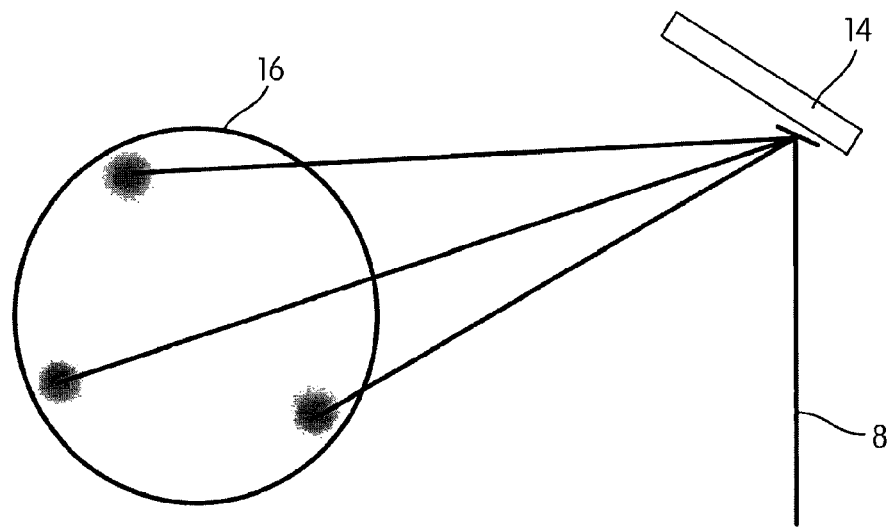

Referring to FIGS. 3a-b, these figures show an array 14 of reflective elements in accordance with an embodiment of the invention. The array 14 of reflective elements includes a plurality of reflective elements (over 1000) or mirrors that are configured to reflect the incident beam of radiation 8 to various desired areas in the pupil plane 16. In one embodiment, each reflective element or mirror of the array 14 is adapted to direct the incident beam of radiation 8 to any position in the pupil plane 16.

Figure 4:
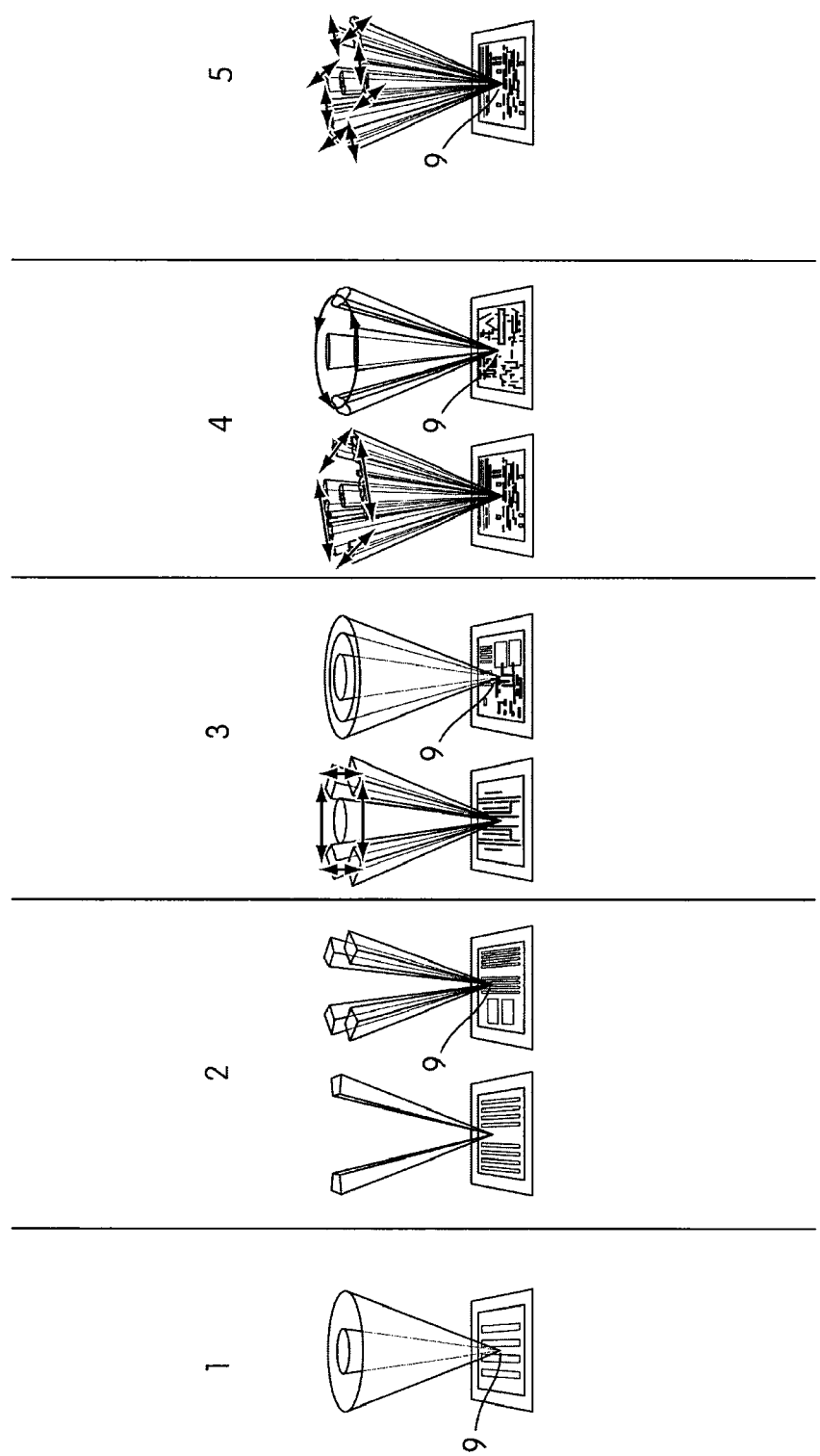
FIG. 4 shows various approaches for optimizing the imaging of a selected pattern.

Referring to FIG. 4, this figure shows various approaches for optimizing the imaging of a selected mask pattern 9. Approach one consists of optimizing the printing of the selected pattern 9 with a conventional and annular illumination. Approach 1 ("1") was developed in the early 1990's. Approach 2 ("2") consists of optimizing the printing of a pattern 9 with a dipole or quadrupole illumination. The dipole or quadrupole illumination can be generated with diffractive optical elements (DOE). Approach 3 ("3") consists of optimizing the printing of the selected pattern 9 with 6 or more poles and/or with soft poles (i.e. poles having reduced intensities) and/or with multiple ring illumination. The optimization approach 3 can also use X, Y and/or X/Y polarization. The X, Y and/or X/Y polarization can be provided by various polarization wave plates located in the illumination system. The illumination in approach 3 can be generated with diffractive optical elements. Approach 4 ("4") consists of optimizing the printing of a pattern 9 with the array of reflective elements 14 shown in FIG. 2 and X, Y, X/Y, TE and/or TM polarization with a flexible illuminator. The illuminator of approach 4 can provide free-form illumination shapes. In approaches 3 and 4, a separate polarization wave plate is required to create the desired X, Y, X/Y polarization or the TE or TM polarization. That is, in approach 4, if one wants to change the polarization from X, Y, X/Y to a TE or TM polarization, a new plate must be inserted in the illumination system, which is undesirable.

Additional information regarding the use of diffractive optical elements or reflective elements to create illumination shapes in the pupil plane of the illuminator can be gleaned from U.S. Pat. Nos. 7,015,491, 6,737,662, 7,525,642 and U.S. Publication No. 2009-0174877, the contents of which are incorporated herein in their entireties by reference.

Figure 5:
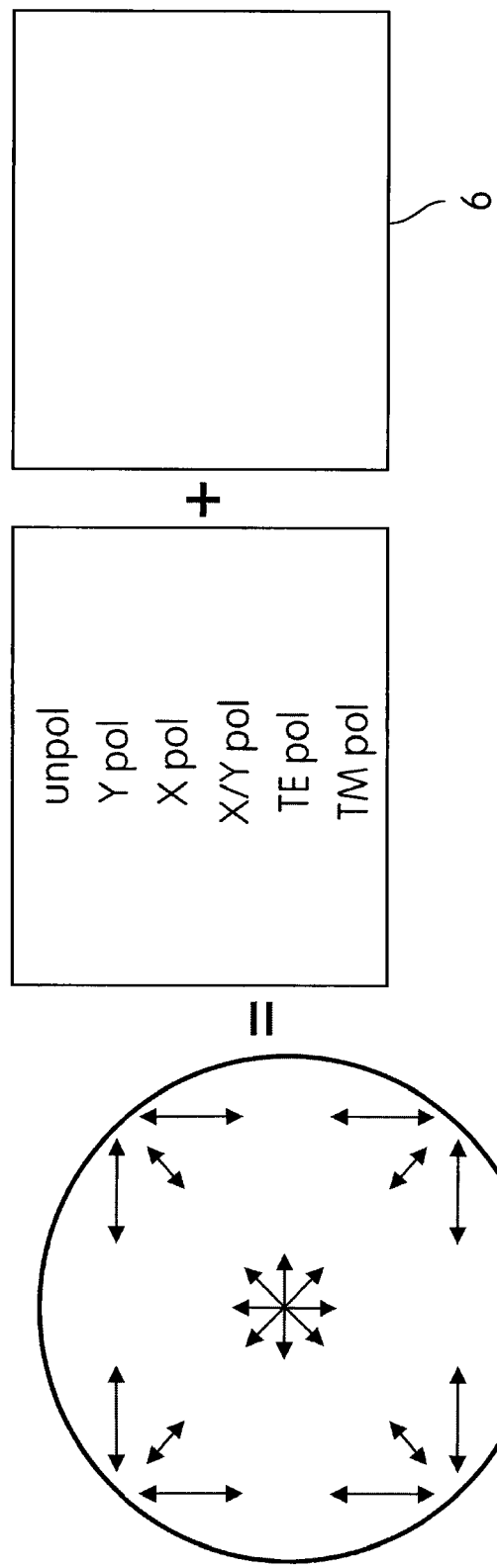
FIG. 5 shows a method for optimizing the imaging of a pattern in accordance with an embodiment of the invention.

In accordance with an embodiment of the invention, approach 5 ("5") consists of using the flexible illumination (using a flexible illuminator to provide free-form illumination shapes) of FIG. 2 and a freeform type of polarization (referred to as "6" in FIG. 5) in order to create any desired polarization (X, Y, X/Y, TE and/or TM) at any location within the pupil plane 16 of the illumination system (see FIG. 5—showing a programmable polarization scheme). The freeform type of polarization can be referred to as a programmable polarization. The benefit of using unpolarization, Y, X, X/Y, TE and TM polarization, or any combination thereof, is that these modes can be available on one lithographic system. However, this might create backward compatibility and flexibility. The benefit of using a freeform polarization is that an enhanced imaging with more advanced polarization can be created. In the current freeform polarization, any position in the pupil can be polarized in 45° steps.

Figure 6B:
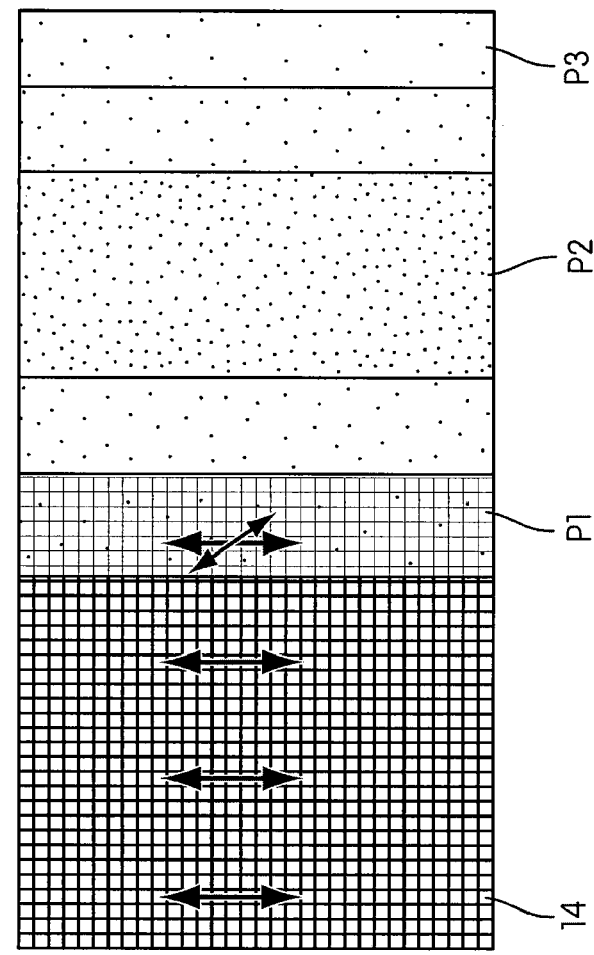
Figure 6B:
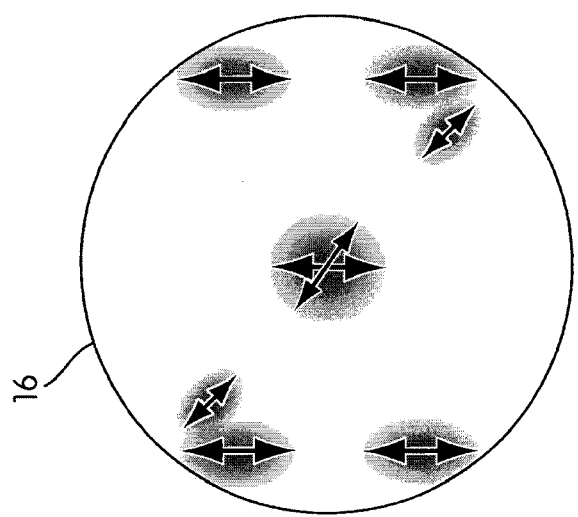
Figure 6C:
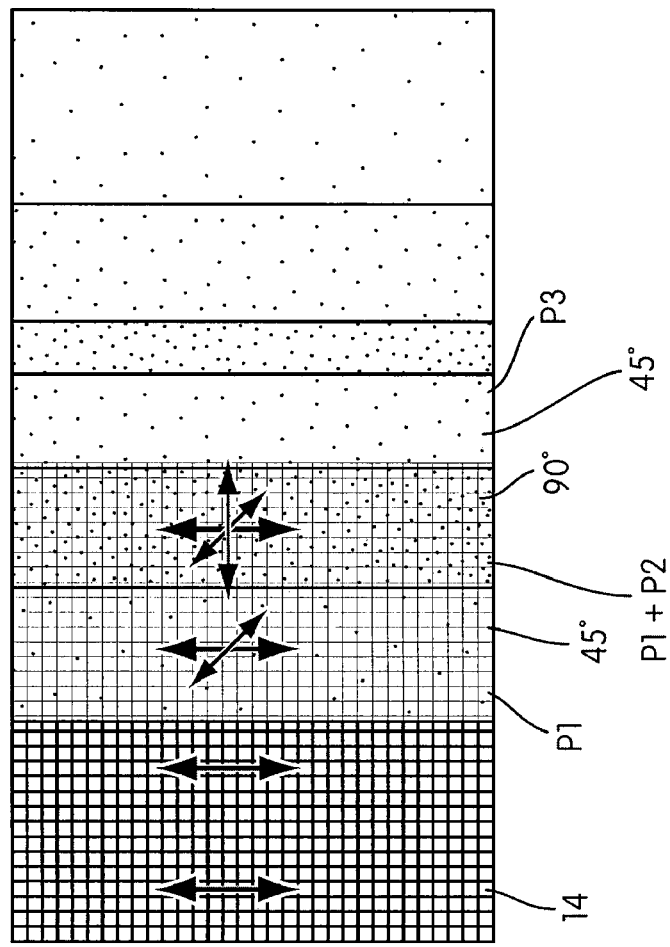
Figure 6C:
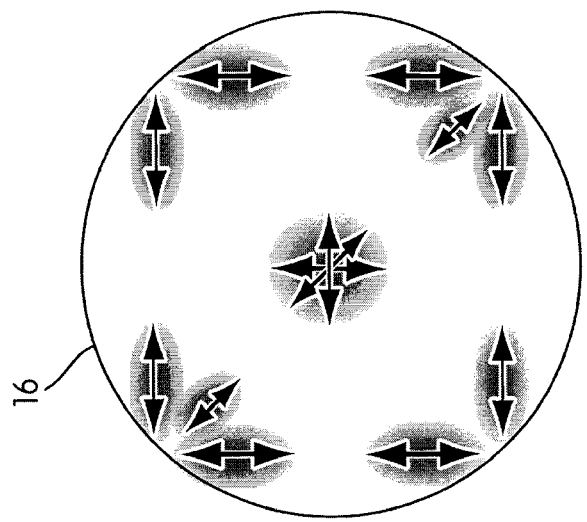
Figure 6D:
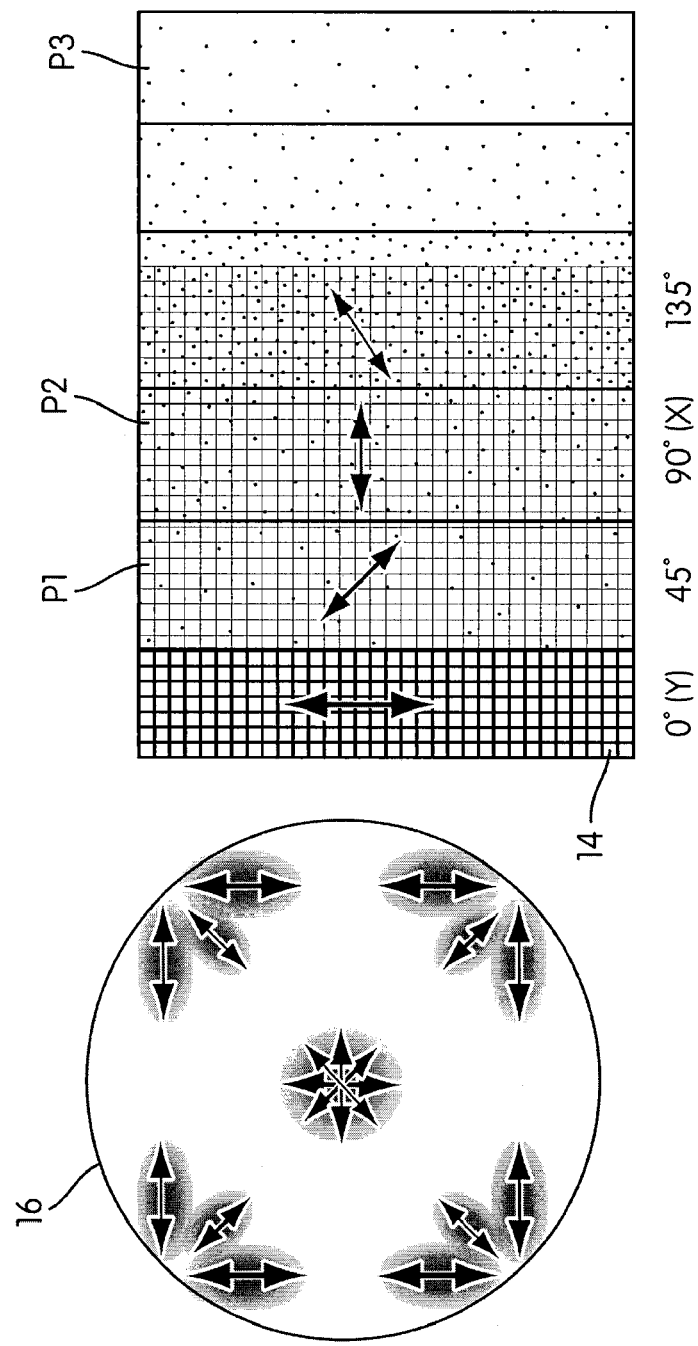

Referring now to FIGS. 6a-d, these figures show a method for creating a freeform polarization in accordance with an embodiment of the invention. The freeform polarization is obtained by changing the polarization of selected portions of the incident beam 8 so that the reflective elements of the array 14 will reflect beams having different polarizations. The change of polarization is effected with three different 45° polarized movable wave plates 1-3 (referred to as "P1", "P2" and "P3" in FIGS. 6a-d). For example, referring to FIG. 6a, this figure shows the incoming radiation 8 having a Y polarization. If the polarization of the incoming radiation beam 8 is not changed, the illumination pattern created in the pupil plane 16 will be Y polarized. By contrast, as shown in FIG. 6b, if a first wave plate 1 is inserted into a portion of the incoming radiation 8, that portion of the incoming radiation beam 8 will have its polarization changed from Y to X/Y (45°). As a result, part of the reflective elements of the array 14 will be able to reflect a X/Y polarized beam anywhere within the pupil plane 16 of the illumination. FIG. 6c and FIG. 6d show how X and 135° polarizations can be obtained by superposing the plates 1-3 in the remaining portions of the incident beam 8. The wave plates 1-3 can be movable or fixed as will be described hereinafter in more detail. It will be appreciated by the person skilled in the art that using different or more polarization changing plates, more polarization states may be generated without departing from the scope of the invention.

Figure 7:
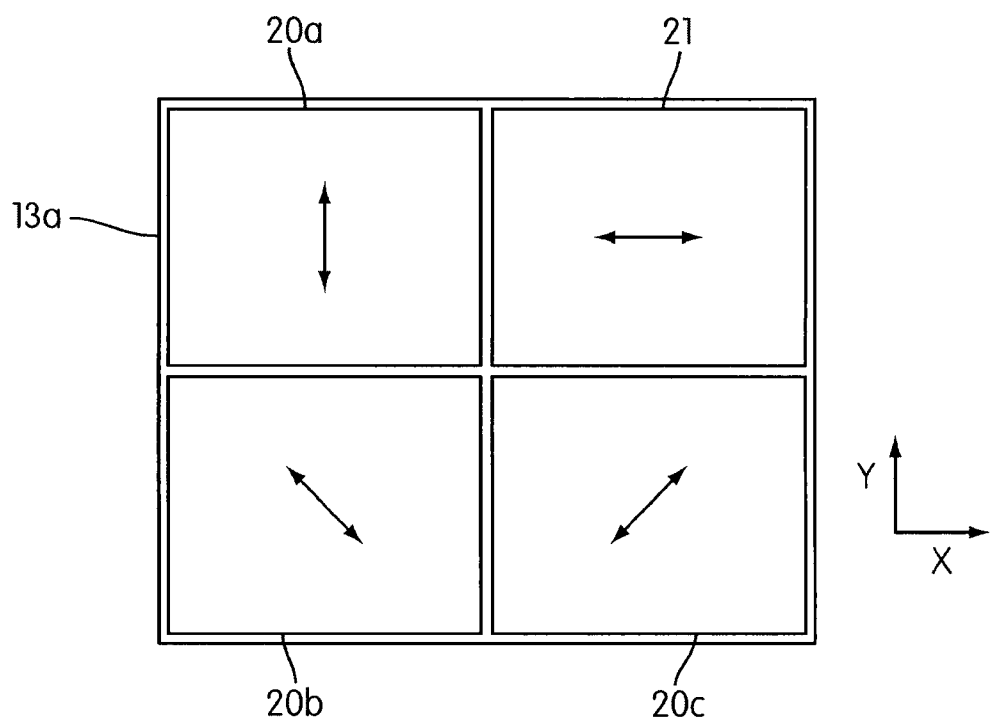
FIGS. 7-8 show a polarization member which may form part of the illumination system.
Figure 8:
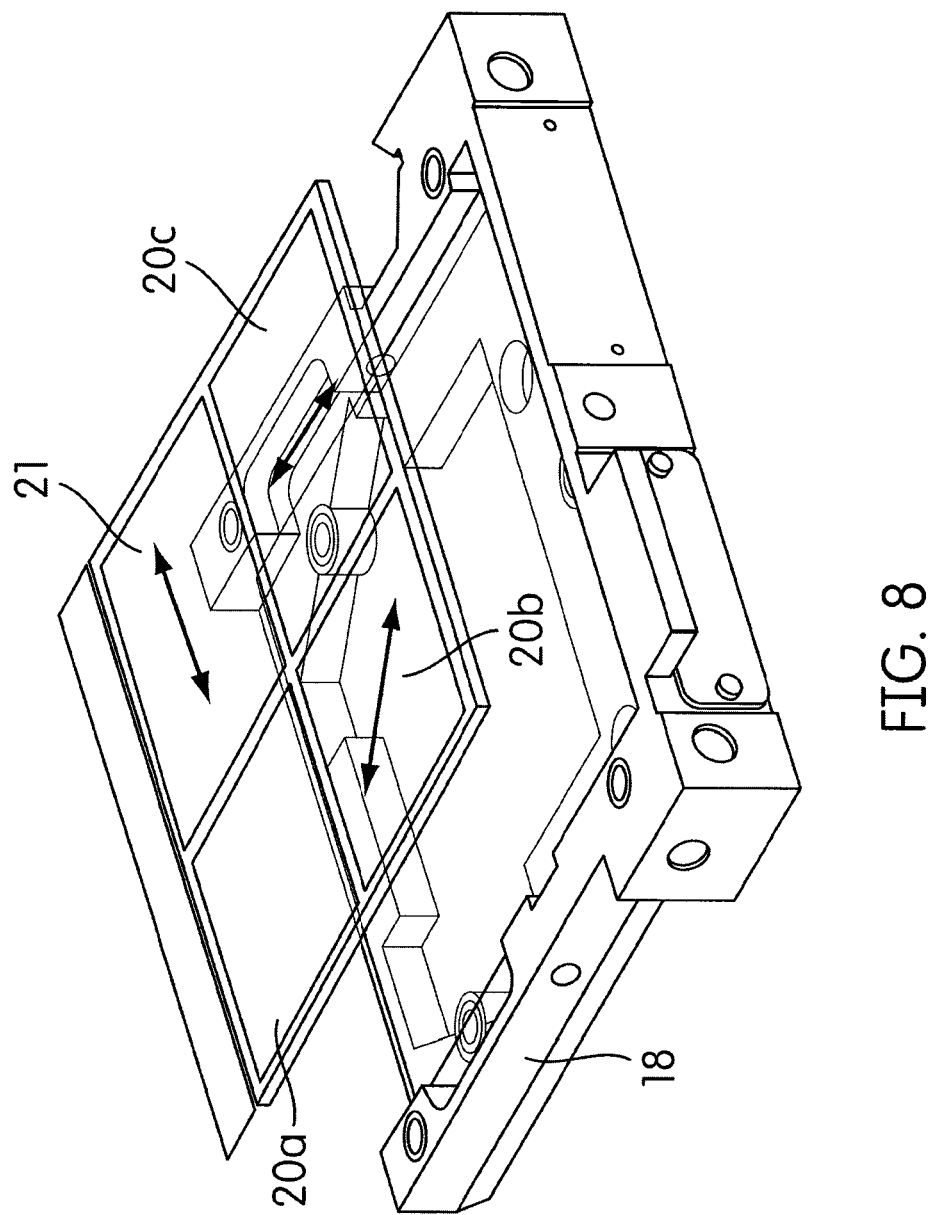

FIGS. 7 and 8 show schematically viewed from one side a different embodiment 13a of the polarization member 13. The polarization member comprises three wave plates 20a-c and a window 21 arranged on a frame 18 and fixed with respect to the mirror array 14. Each of the wave plates 20a-c is configured to apply a different polarization to the radiation beam 8 delivered from the radiation source 11. In this embodiment, the radiation beam delivered from the radiation source is linearly polarized in the x-direction (in this example TE polarization). This polarization is represented schematically by a horizontal double headed arrow in the window 21. The first wave plate 20a is configured to rotate the polarization of the radiation beam through 90°, such that the radiation beam is then polarized in the y-direction (in this example TM polarization). This is represented schematically by the vertical double headed arrow in the first waveplate 20a. The second waveplate 20b is configured to rotate the polarization of the radiation beam such that it lies in the plane x=−y. This is indicated schematically by the back-sloping double headed arrow in the second wave plate 20b. The third wave plate 20c is configured to rotate the polarization of the radiation beam such that it lies in the plane x=y. This is shown schematically by the forward sloping double headed arrow in the third wave plate 20c.

In use, a pattern being projected from the patterning device MA onto the substrate W by the lithographic apparatus (see FIG. 1) may be projected using radiation which is polarized in the x-direction. Where this is the case, the controller CT1 may control the orientations of the reflective elements 14a-e such that only reflective elements which have received radiation that passed through the window 21 are used to form the illumination mode used by the lithographic apparatus. Radiation incident upon the reflective elements 14a-e which has passed through the wave plates 20a-c may, for example, be directed by the reflective elements 14a-e towards a beam dump, or towards another location which does not contribute to the illumination mode. Thus, an embodiment of the invention allows selection, via the controller CT1, of only x-polarized radiation in the illumination system of the lithographic apparatus.

If the pattern to be projected from the patterning device MA onto the substrate W would be better projected using radiation polarized in the y-direction, then the controller CT1 may control the reflective elements 14a-e of the reflective elements array 14 such that only radiation which has passed through the first wave plate 20a is used to form the illumination mode. Similarly, if the pattern is such that radiation polarized in the plane x=−y would provide better imaging, then the controller CT1 may control the reflective elements 14a-e such that only radiation which has passed through the second wave plate 20b is used to form the illumination mode. Similarly, if the pattern is such that radiation polarized in the plane x=y would provide better imaging, then the controller CT1 may control the reflective elements 14a-e such that only radiation which has passed through the second wave plate 20C is used to form the illumination mode.

In some instances it may be desired to use a radiation beam which does not have one of the four polarizations shown in FIG. 7. Where this is the case, radiation which has passed through more than one wave plate 20a-c, or radiation which has passed through the window 21 and one or more wave plates 20a-c, may be used to obtain the desired polarization. For example, radiation which has passed through the window 21 and radiation which has passed through the third wave plate 20c may be used to form the illumination mode. The radiation will in this instance have a polarization which has an angle of approximately 22.5° from the x-direction. In a further example, radiation which has passed through the first and third wave plates 20a,c may be used to form the illumination mode. In this instance, the radiation may have a polarization which forms an angle of approximately 22.5° relative to the y-direction.

In some instances it may be desired to use radiation which is not polarized, or which approximates radiation which is not polarized. Where this is the case, radiation which has passed through the window 21 and the first wave plate 20a may be used. Alternatively radiation which has passed through the second and third wave plates 20b,c may be used. In a further alternative, radiation which has passed through all three wave plates 20a-c and through the window 21 may be used.

The window 21 may have the same optical path length as the wave plates 20a-c in order to provide consistency of optical path length traveled by the radiation beam in the illumination system.

The polarization member 13a may be used to apply any polarization to the radiation beam which is a combination of the four polarizations shown in FIG. 7 (i.e. x-direction, y-direction, x=−y plane and x=y plane). If it is desired to provide radiation with a polarization which cannot be formed from a simple combination of the polarizations shown in FIG. 7, then a modified approach may be used. The modified approach comprises combining different beams of radiation which are reflected by different reflective elements of the array 14 that are under the different wave plates 20a-c and/or window 21. For example, a radiation beam may be formed using the polarization member and the reflective elements by directing a subset of the radiation which passed through the window 21 into the illumination mode and passing only half of the radiation which passed through the third wave plate 20c into the illumination mode. This will provide a polarization which is approximately 12° from the x-direction. As will be appreciated by one skilled in the art, other combinations of reflected beams of radiation may be used to obtain other polarizations (e.g. combining 4 beams of radiation polarized by the wave plate 20a and 2 beams of radiation polarized by the wave plate 20b).

A polarization member 13b according to a further embodiment of the invention is shown schematically in FIG. 9. The polarization member comprises a first wave plate 30a, a second wave plate 30b and a third wave plate 30c. Each wave plate is connected to a window 31a-c. Each window is connected to an actuator 32a-c which is operated by a controller CT2.

The controller CT2 may be used to move each of the actuators 32a-c independently, such that the radiation beam (indicated by a hollow arrow) passes through one or more of the wave plates 30a-c, or passes through none of the wave plates. When the radiation beam does not pass through a wave plate it instead passes through the window 31a-c associated with that wave plate 30a-c, thereby providing consistency of the path length traveled by the radiation beam.

Figure 9A:
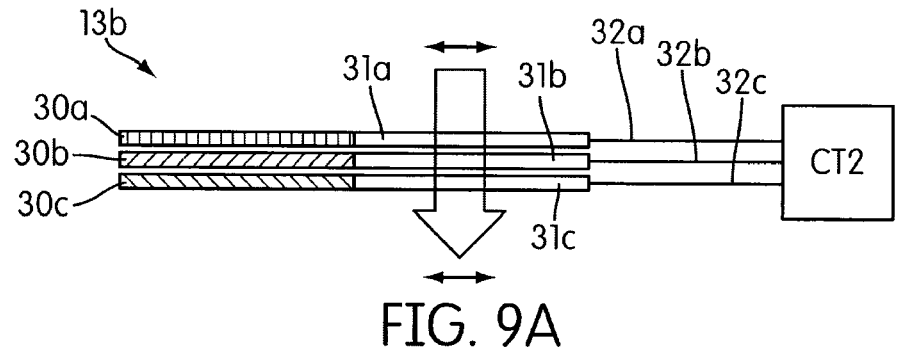
FIGS. 9A-D show a further polarization member which may form part of the illumination system.

Referring to FIG. 9A, the actuator 32a-c may be positioned such that the radiation beam passes through windows 31a-c and does not pass through any wave plates 30a-c. In this instance, the polarization of the radiation beam is unchanged. This is indicated by the double headed arrows which show the radiation beam as being polarized in the x-direction prior to passing through the windows, and which show the radiation beam being polarized in the x-direction after having passed through the windows.

Figure 9B:
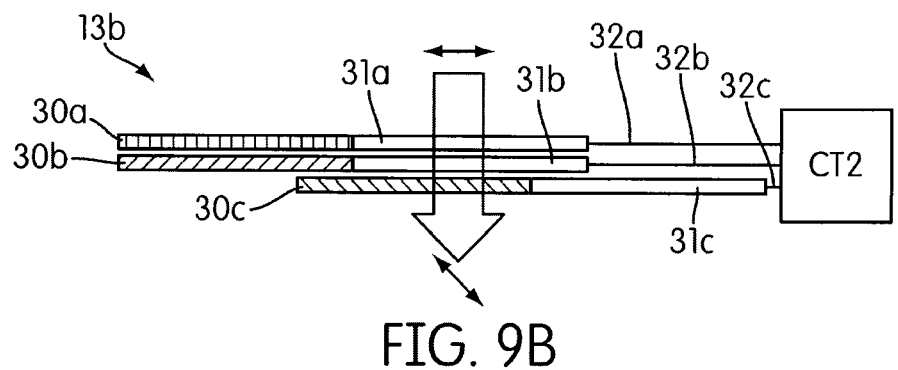

In FIG. 9B the actuators have been arranged such that the radiation beam passes through two windows 31a,b and passes through the third wave plate 30c. As is indicated by the double headed arrows, this causes the polarization of the radiation beam to change from the x-direction to be in the x=−y plane.

Figure 9C:
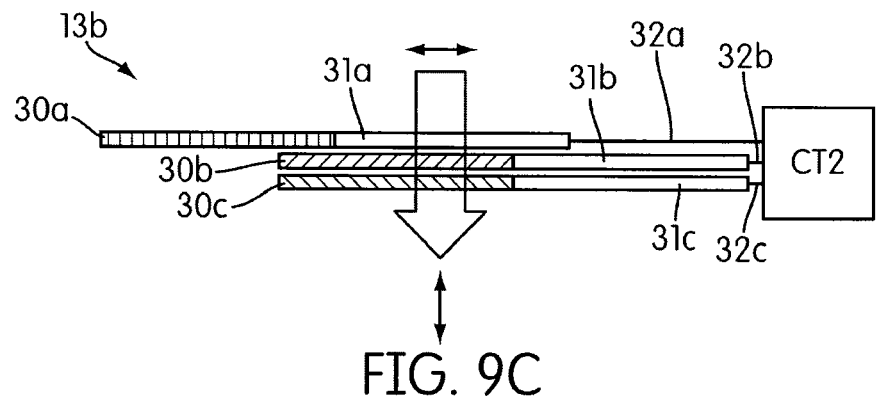

In FIG. 9C the actuators have been arranged such that the radiation passes through one window 31a, and passes through the second and third wave plates 30b,c. As shown by the double headed arrows, this causes the polarization of the radiation beam to change from the x-direction to be in the y-direction.

Figure 9D:
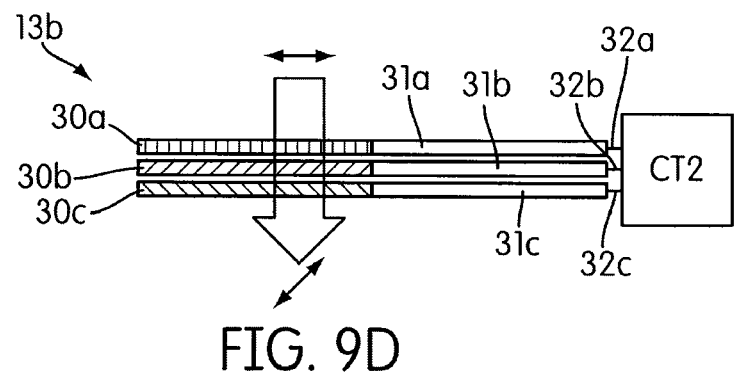

In FIG. 9D the actuators have been positioned such that the radiation beam passes through the first, second and third wave plates 30a-c. As is shown in FIG. 4B, this causes the polarization of the radiation beam to change from the x-direction to polarization which lies in the plane x=y.

As may be surmised from FIG. 9, each of the wave plates 30a-c has the effect of rotating the polarization of the radiation beam through 45°. Thus, when only one wave plate is used, the polarization is rotated by 45°, when two wave plates are used the polarization is rotated by 90°, and when three wave plates are used the polarization is rotated by 135°.

The polarization member 13b shown in FIG. 9 allows the polarization of the radiation beam to be controlled without significant loss of intensity from the radiation beam.

Although the polarization member 13 is shown in FIG. 2 as being located between the beam diverging optics 12 and the array of reflective elements 14, it may be provided in a suitable location. The embodiment of the polarization member 13b shown in FIG. 4 may comprise wave plates provided at different locations in the illumination system (it is not necessary for the wave plates to be located adjacent to one another).

In the above embodiments, the beam of radiation emitted from the source 11 was polarized, and the polarization was modified using the polarization member 13 comprising one or more wave plates. In some instances, the beam of radiation emitted from the source 11 may be unpolarized.

Where this is the case, the wave plates shown in FIG. 3 may be replaced with polarizers, each polarizer configured to apply a different polarization. For example, the polarizations may correspond to the directions of the double headed arrows shown in FIG. 3.

Figure 10:
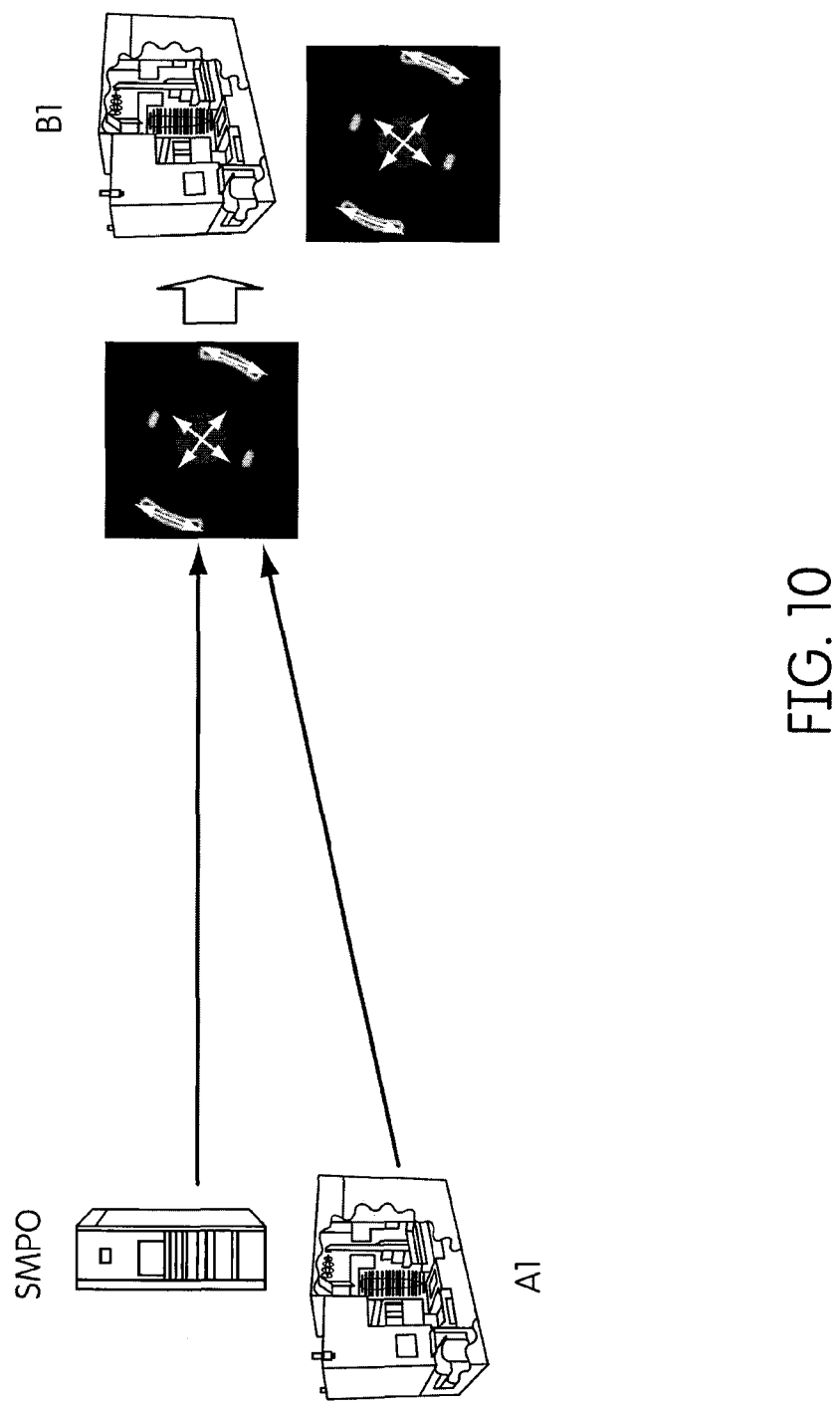
FIG. 10 shows a method for creating and maintaining optimized pupils (using a source mask polarization optimization (SMPO)) in accordance with an embodiment of the invention.

Referring now to FIG. 10, in one embodiment, a target polarized pupil is obtained by optimizing an existing (measured pupil on system A, or "A1", with required polarization) pupil with a source mask polarization optimization method (SMPO). A new pupil can be calibrated or simulated using the SMPO method and each new calibrated polarized pupil can be stored in a memory of the lithographic apparatus (system B, or "B1") to create a library of calibrated polarized pupils. The measured pupils can be provided with a lithographic apparatus including diffractive optical elements or a flexible illuminator. Each calibrated polarized pupil that is stored in the library can be re-loaded almost instantly by the user of the lithographic apparatus to create the desired polarization shape (X, Y, XY, TE, TM, or freeform) in the pupil plane 16. In addition, in an embodiment, any desired freeform gray scale source (i.e. with optimized positions/angles and intensities) can be obtained for any polarization shape in order to obtain maximum productivity.

Further, in an embodiment, the user interface of the lithographic apparatus is adapted to include freeform polarization. In one embodiment, the freeform polarization provided by the user interface is selectable for each mask layer. In one embodiment of the invention, pupil quality is assured during production by closed-loop control of each mirror of the array 14 and closed loop control of the polarizer wave plates (plates 1-3 in FIGS. 6a-d and wave plates 20a-c in FIGS. 7 and 8).

Figure 11:
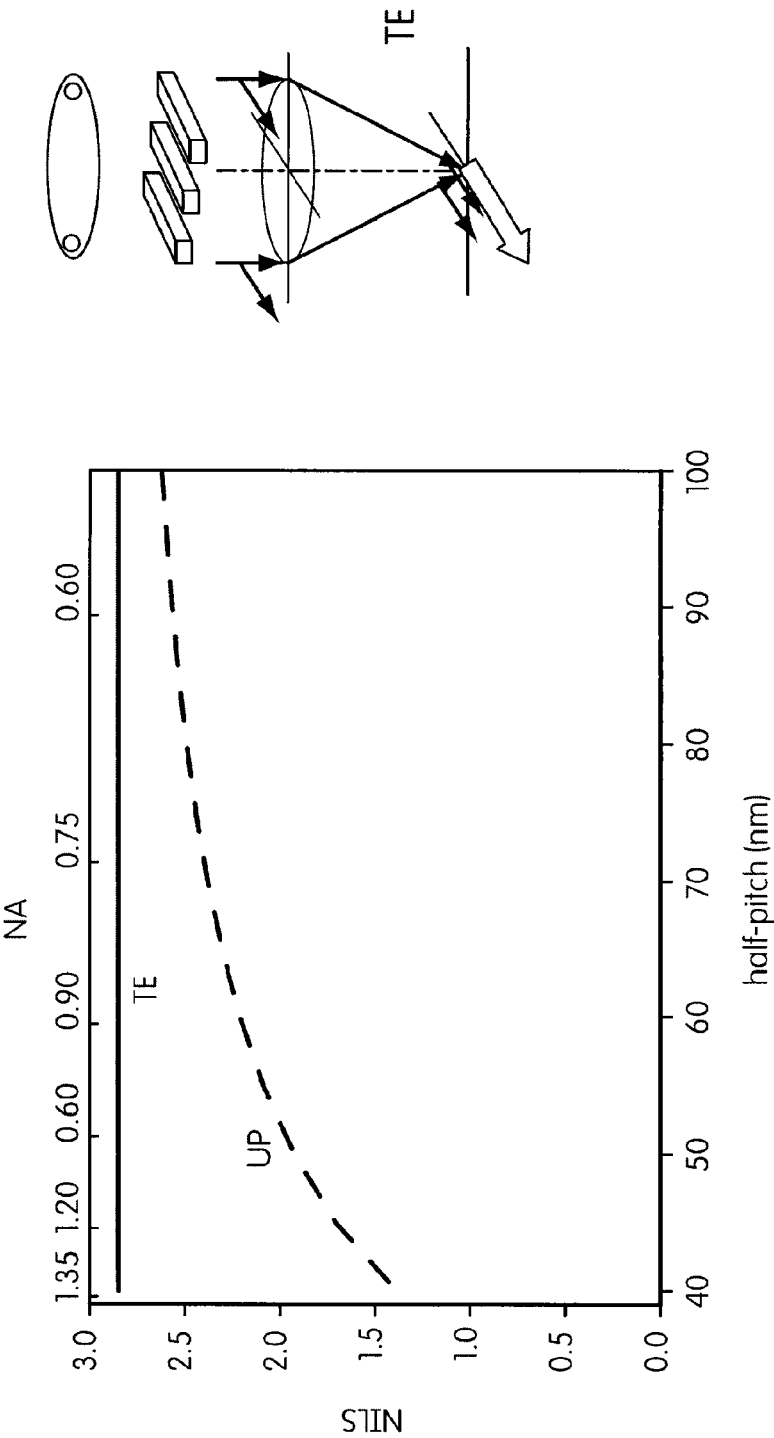
FIG. 11 shows the image contrast (as measured by NILS) as a function of the half pitch distance of an array of lines illuminated with a TE polarized beam and an unpolarized beam.

Referring to FIG. 11, this figure shows the image contrast (as measured by NILS) as a function of the half pitch distance of an array of lines illuminated with a TE polarized beam and an unpolarized beam (referred to as "UP" in FIG. 11). The array of lines (1:1 arrangement: line spacing=line width) is illuminated with a dipole (0.9σ) at 193 nm with a binary mask (BIM) without any bias and an optimized numerical aperture (NA). The film refractive index (RI) is 1.7. As can be seen in FIG. 11, the polarization benefits increase as the numerical aperture (NA) of the illumination system increases (and k1 is reduced).

Figure 13A:
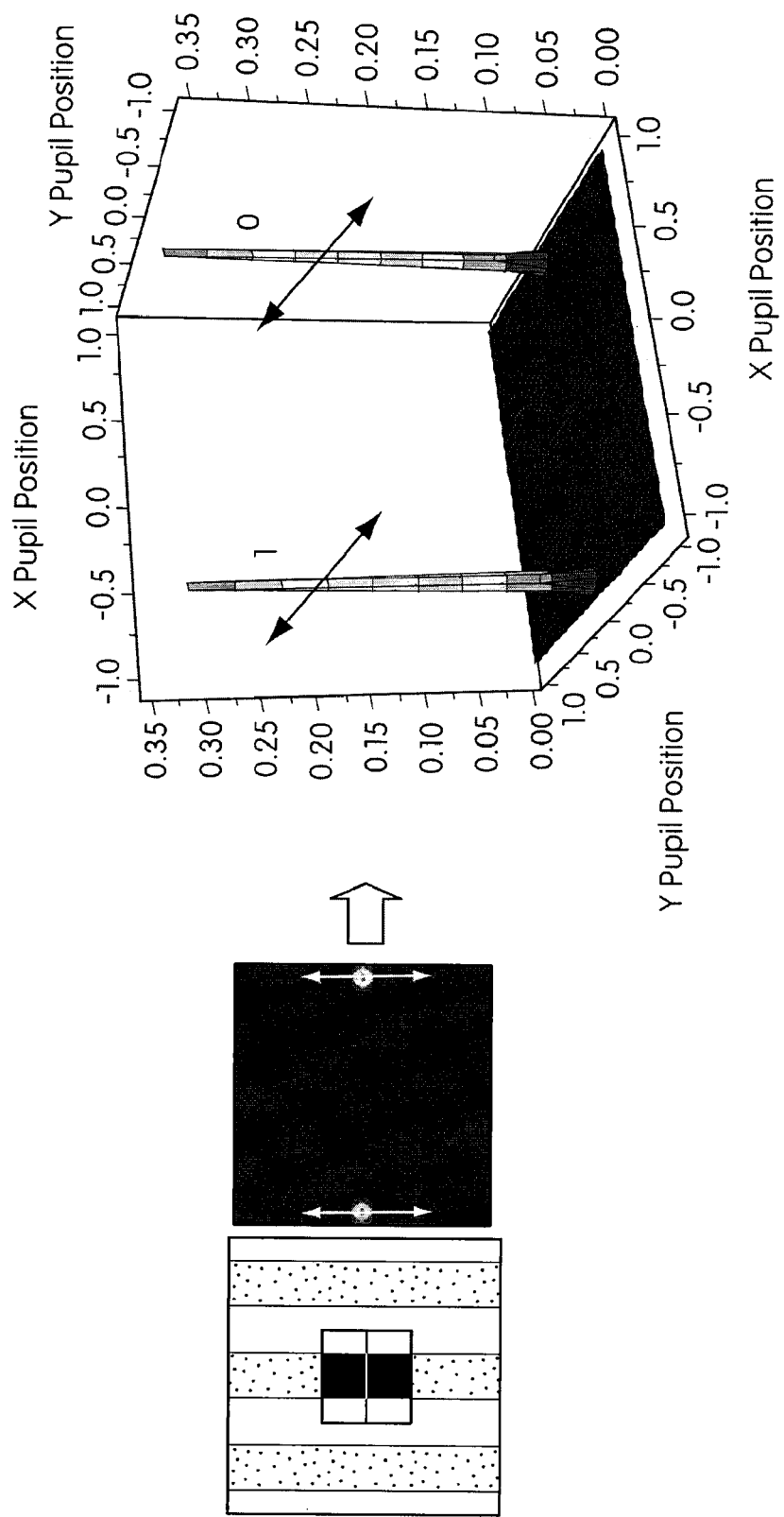
FIGS. 13a-b show that optimal polarization can be determined based on diffraction patterns.

FIG. 13a shows that optimal polarization can be determined based on diffraction patterns. For example, in order to optimize the printing of the dense line array of FIG. 11, it is desirable to use the 0 and $1^{st}$ diffraction orders and the best results are obtained when the polarization vectors of the 0 and $1^{st}$ diffraction orders are aligned. This corresponds to the TE polarization. In FIG. 13a, the pattern is a dense line array (1:1), illuminated with a dipole and a binary mask (BIM), with k1=0.28.

Figure 12:
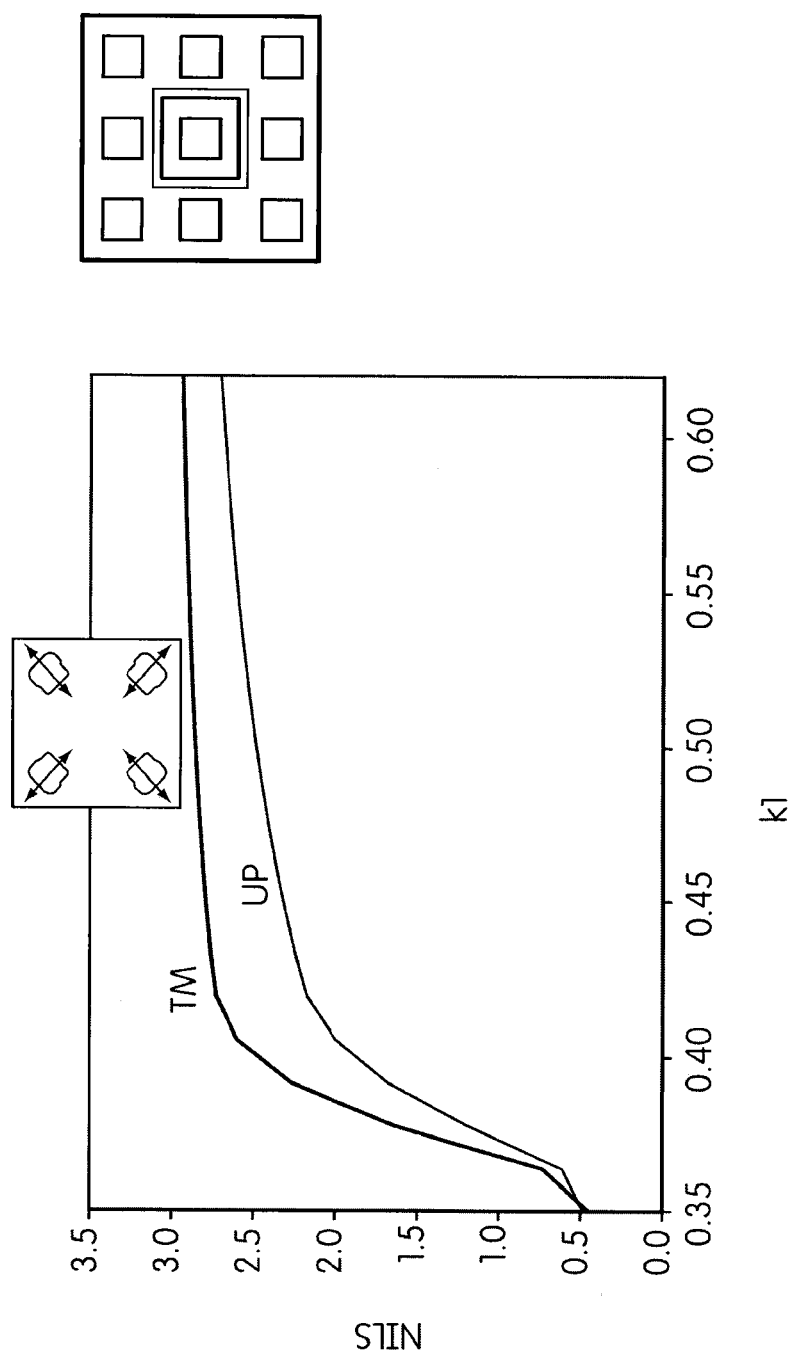
FIG. 12 shows the image contrast (as measured by NILS) as a function of k1 for an array of holes illuminated with a TM polarized beam and an unpolarized beam.

Referring to FIG. 12, this figure shows the image contrast (as measured by NILS) as a function of k1 for an array of holes (1:1 arrangement: hole spacing=hole diameter) illuminated with a TM polarized beam and an unpolarized beam (referred to as "UP") at 193 nm with a 1.35 NA and a 6% attenuated phase shift mask without bias. The film refractive index (RI) is 1.7. The holes are illuminated with a quadrupole (Quasar™ illumination) with k1>0.36 and an attenuated phase shift mask. The array of holes is illuminated with a quadrupole. As can be seen in FIG. 12, dense hole arrays can be imaged with higher contrast using a TM polarized beam. Additional information about the benefits of using TM polarization to print dense hole arrays can be gleaned from the article by N. Baba-Ali, H. Sewell, J. Kreuzer (ASML) Proc. SPIE 5040, 1352 (2003) and U.S. Pat. No. 7,090,964, which are incorporated herein in their entireties by reference.

Figure 13B:
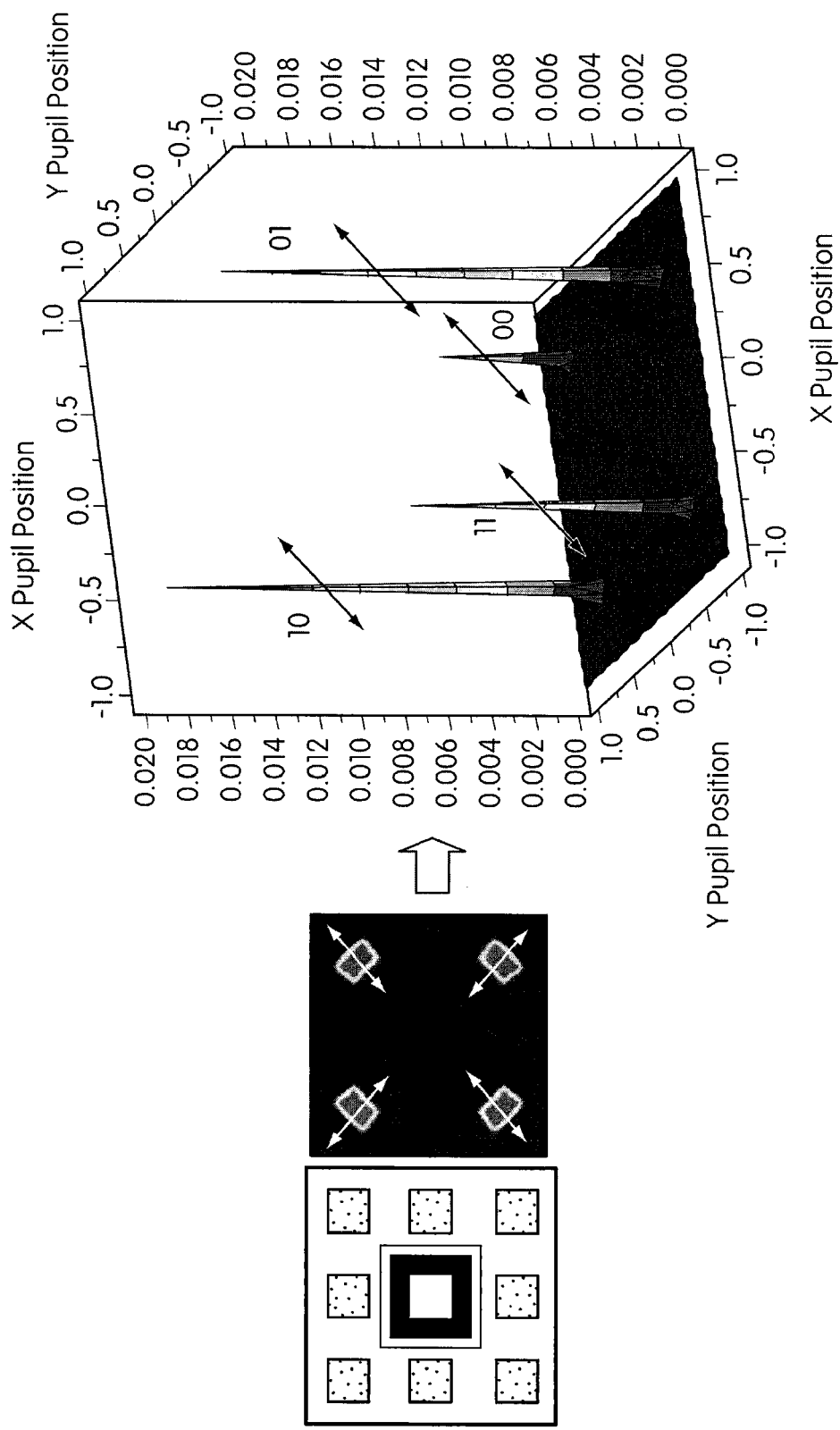

FIG. 13b shows that optimal polarization can be determined based on diffraction patterns. For example, in order to optimize the printing of the dense line array of FIG. 12, it is desirable to use the "01" and "10" diffraction orders ($1^{st}$ diffraction orders) because the "00" order is weak and imaging is dominated by higher diffraction orders. The best results are obtained when the polarization vectors of the "01" and "10" diffraction orders are aligned. This corresponds to the TM polarization.

Figure 14:
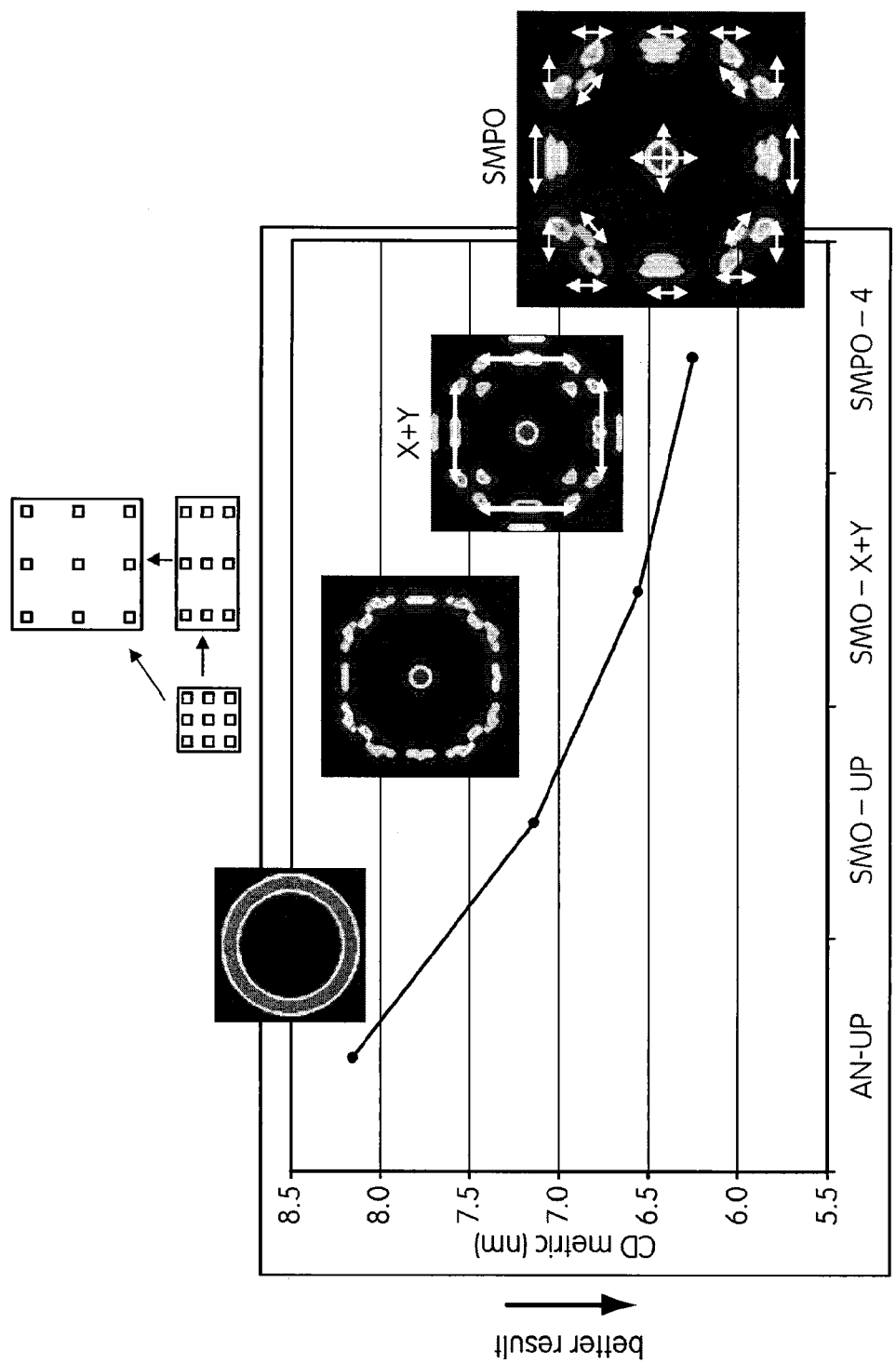
FIG. 14 shows the critical dimension (CD) variations for a grid of 50 nm rectangular holes arranged in various pitches.

FIG. 14 shows the critical dimension (CD) variations for a grid of 50 nm holes arranged in various two-dimensional rectangular arrays. The CD variations of FIG. 14 are obtained with different optimization methods. The pitches of the grids are varied in the X and Y directions (X/Y) (e.g. 95/95, 100/100, 110/110, 110/130, 110/150, 110/170, 110/190, 130/130, 130/150, 130/170, 130/190, 150/150, 150/170, 150/190, 170/170, 170/190, 190/190 nm pitch Manhattan (i.e. a grid array of holes) printed at 50 nm target). As can be seen in FIG. 14, CD variations greater than 8 nm are obtained when using a conventional annular illumination without further optimization or polarization (referred to as "AN-UP" in FIG. 14). Those CD variations can be reduced by about 12% when using a source optimization without polarization (referred to as "SMO-UP" in FIG. 14). The CD variations can be further reduced by about 8% by changing the polarization (e.g. X/Y polarization) in the pupil plane of the illumination system. Finally, the CD variations can be reduced even further (by about 4%) when using a freeform polarization (4 angles polarization, referred to as SMPO—4 in FIG. 14) in the pupil plane of the illumination system. As explained above and shown in FIG. 14, when using freeform polarization, various locations of the pupil planes have different polarizations. It is envisioned that freeform polarization optimization can reduce CD variations even further for other types of patterns.

As will be appreciated by one skilled in the art, freeform polarization in the pupil plane gives significant imaging improvements. Those improvements are remarkable for 2 dimensional structures such as random contact holes or contact holes arranged in various pitches. In an embodiment, the critical dimension uniformity (CDU) can be improved by about 19%. In an embodiment, the source mask polarization optimization (SMPO) can be supported by a simulator (for example Tachyon™).

Figure 15:
FIG. 15 shows an illumination pattern 150 that can be generated in the pupil plane with the illumination system of FIG. 2 in accordance with an embodiment of the invention.

Referring to FIG. 15, this figure shows an illumination pattern 150 that can be generated in the pupil plane using the illumination system of FIG. 2. In FIG. 15, the pattern 150 includes a plurality of poles arranged along a ring and central pole "F". The plurality of poles have a TE type of polarization and the central pole is unpolarized. It will be appreciated that any types of illumination/polarization shapes can be obtained with the illumination system of FIG. 2.

Figure 16:
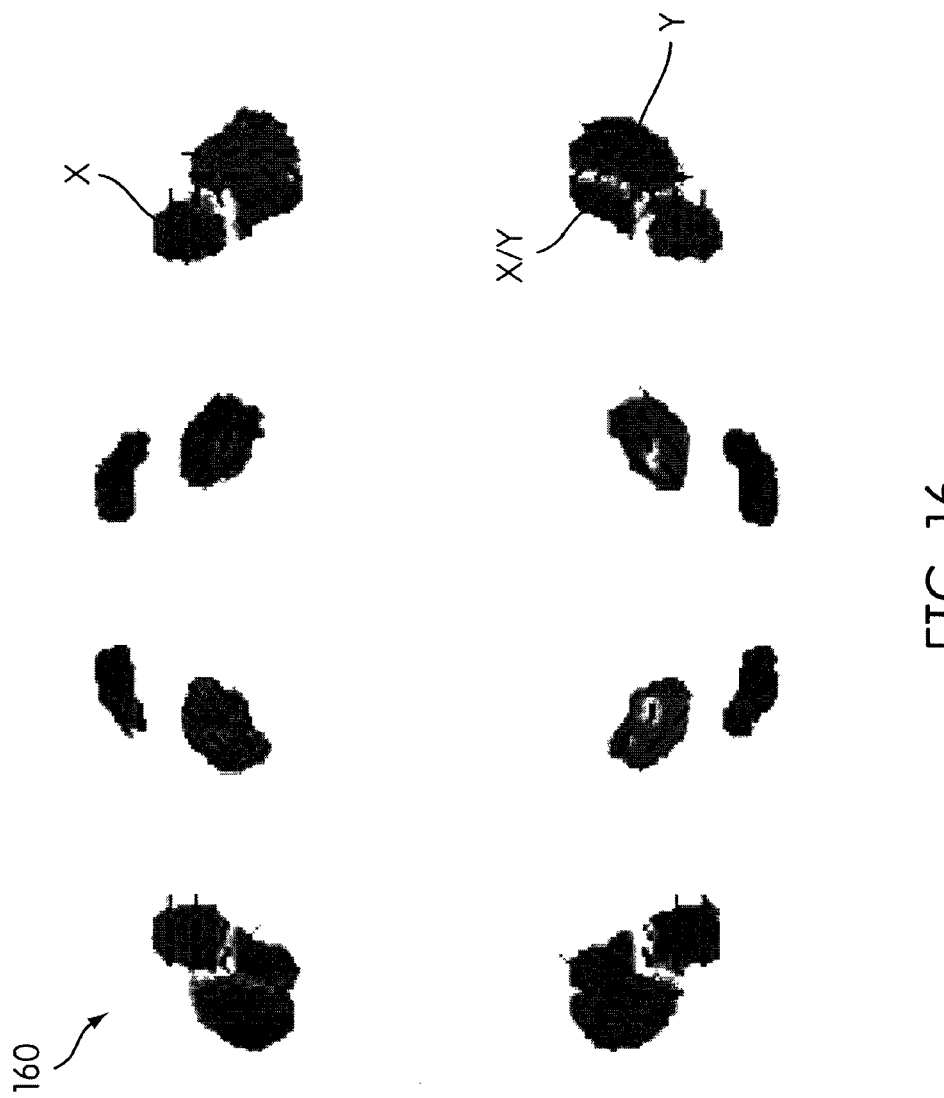
FIG. 16 shows an illumination pattern 160 that can be generated in the pupil plane with the illumination system of FIG. 2 in accordance with an embodiment of the invention.

FIG. 16 shows an illumination pattern 160 that can be generated in the pupil plane using the illumination system of FIG. 2 in accordance with an embodiment of the invention. In FIG. 16, various types of polarization can be generated within a same pole and the polarization direction (X, Y and X/Y) varies in the illumination source as indicated by the black lines.

Figure 17:
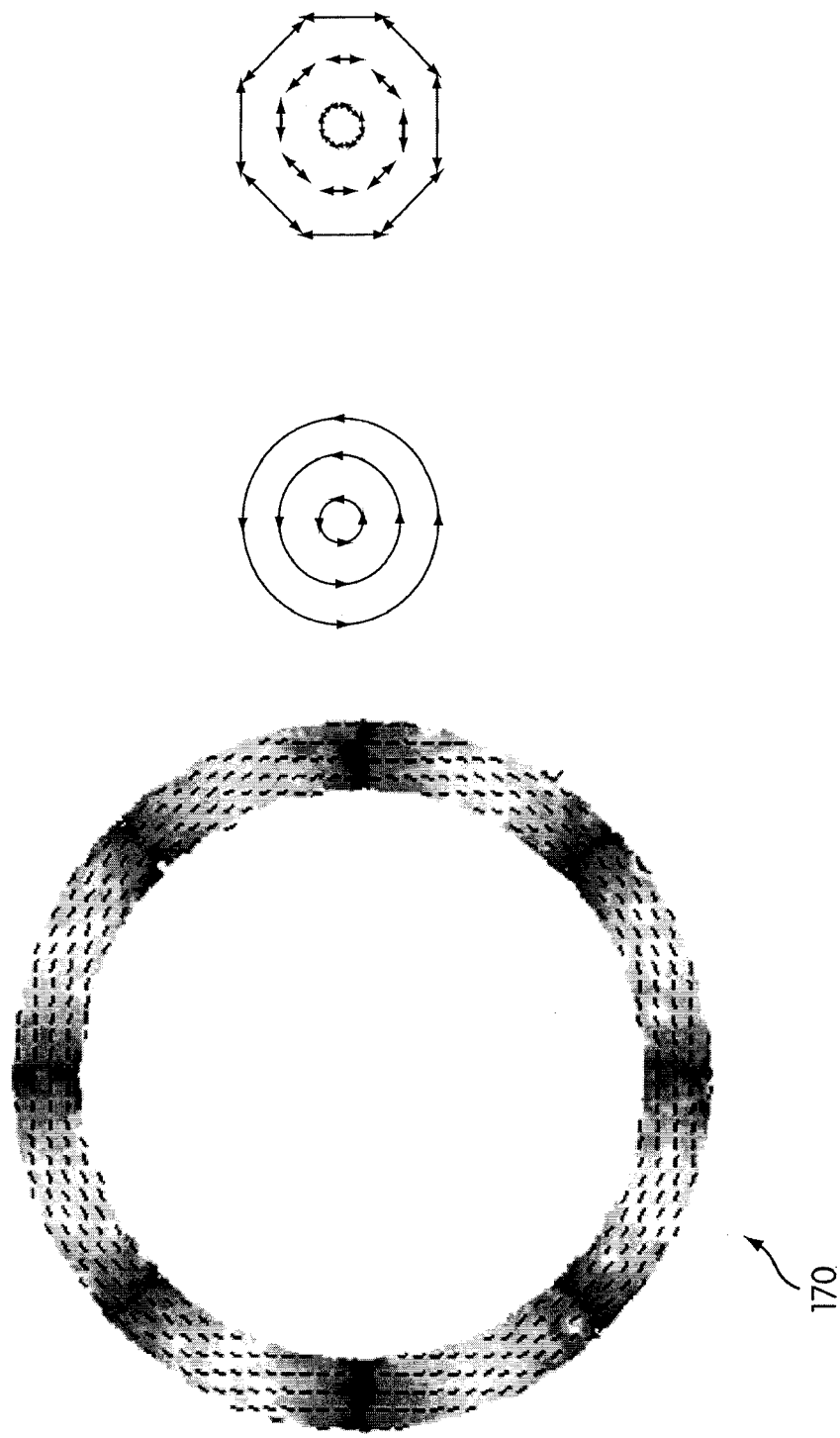
FIG. 17 shows an illumination pattern 170 that can be generated in the pupil plane with the illumination system of FIG. 2 in accordance with an embodiment of the invention.

FIG. 17 shows an illumination pattern 170 that can be generated in the pupil plane using the illumination system of FIG. 2 in accordance with an embodiment of the invention. The illumination pattern 170 includes an azimuthal polarization (170*b*) that mimics the theoretical TE polarization (shown at 170*a*). The polarization is done by steps of 45°. The theoretical limit IPS (intensity in a preferred state) is 85%.

It will be appreciated that the programmable polarization discussed above provides more flexibility as the polarization for each mask layer can be independently optimized. Furthermore, because any polarization (e.g. both X/Y, TE and TM polarizations) can be obtained with the freeform polarization, it is possible to significantly improve the process window and the critical dimension uniformity.

In an embodiment, the illumination shape in the pupil plane can be tuned or optimized with freeform polarization in conjunction with, or independently from, the source optimization.

Figure 18:
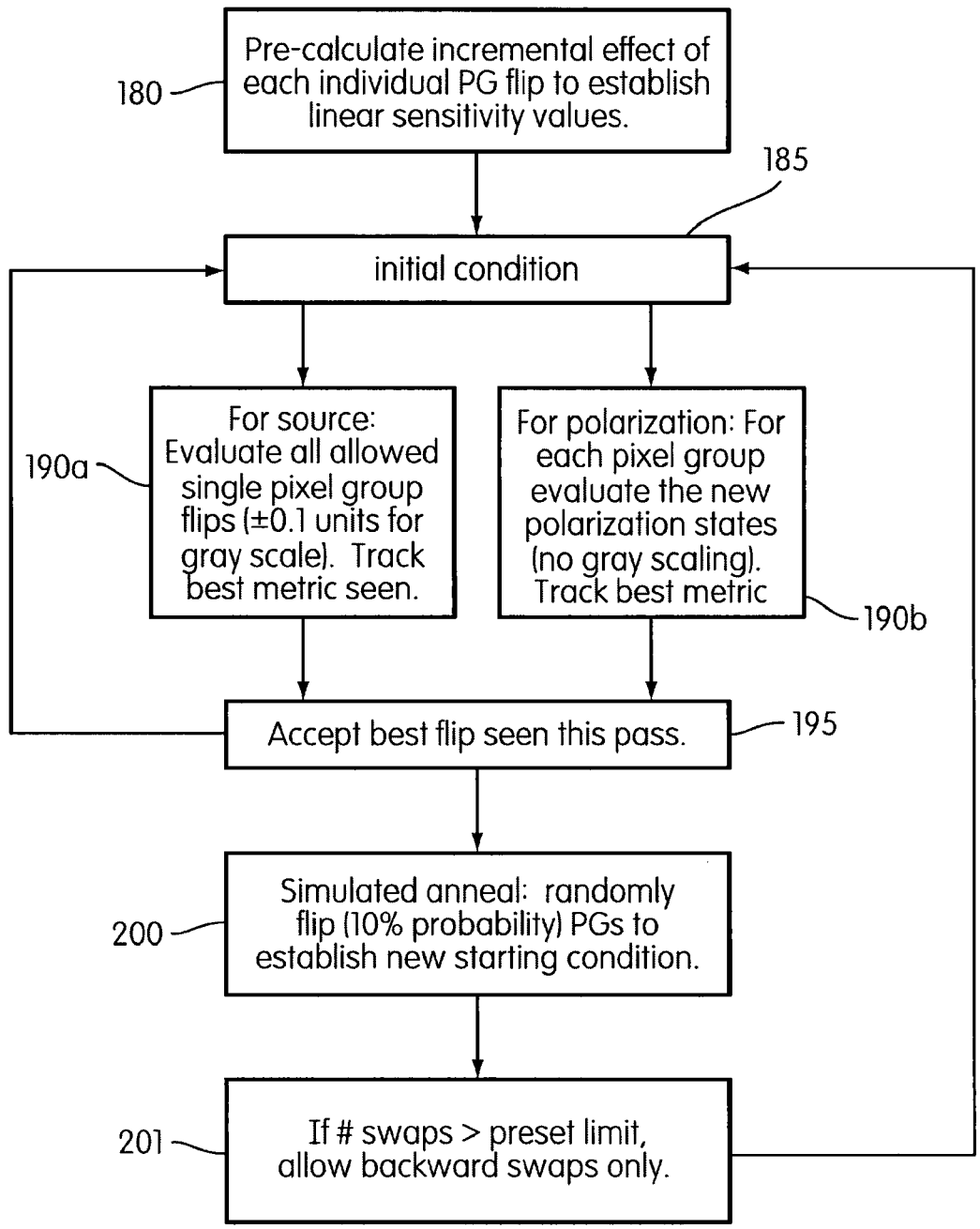
FIG. 18 shows a source mask polarization optimization (SMPO) method in accordance with an embodiment of the invention.

Referring now to FIG. 18, this figure shows a source mask polarization optimization (SMPO) method in accordance with an embodiment of the invention.

The method begins at step 180 where the incremental effect of each individual pixel group (or illumination source point) is calculated to establish linear sensitivity coefficients or sensitivities. The sensitivity coefficients or sensitivities provide an estimate of how the effect of a change in polarization effects a further metric such as a lithographic metric which in this case may be critical dimensions of structures in the mask pattern, uniformity of the critical dimensions, dimension of a process window (including depth of focus and dose latitude), a Mask Error Enhancement Factor (MEEF), and Image Log Slope (ILS) or a Normalized Image Log Slope (NILS). A pixel group includes one or more illumination source points within the pupil plane of the illumination system. In an embodiment, the state of the pixel group may be changed by incremental steps (e.g. by increasing or decreasing the intensity of a pixel group (e.g. by 10% increment) or changing the direction of the polarization, for example by 45°) as opposed to adding the pixel group to, or completely removing the pixel group from, the initial illumination shape (i.e. binary approach). Additional information regarding source optimization with pixel groups using a binary approach can be gleaned from U.S. patent application Ser. No. 12/000,092, the content of which is incorporated herein in its entirety by reference.

In an embodiment, at step 180, the source optimization involves calculating the incremental effect, on each critical dimension (CD) of a selected pattern, of adding and subtracting pixel groups to small source regions within the pupil plane.

In an embodiment, the illumination source can be optimized in a selected part (e.g. a quadrant) of the pupil plane. The optimized illumination source can be determined in the remaining parts of the pupil plane by symmetry. In an embodiment, pre-defined pixel groups (e.g. 117 pixel groups/quadrant) can be selected to carry out the source optimization.

In an embodiment, in order to calculate the sensitivity coefficients or sensitivities for the source optimization method, the intensity of each pixel group is incrementally increased by a pre-determined amount, for example +/−10%, and the effect of such an incremental change on all of the CDs is determined. Therefore, assuming there are 117 pixel group to be considered, in an embodiment, for each CD measurement, there will be 234 sensitivity coefficients or sensitivities calculated (117 pixel groups*2 (corresponding to +/−10%)=234). For example, if the CDs of the pattern are reduced by 0.1 nm as a result of a change of −10% intensity for a given pixel group, then, the sensitivity for that pixel group is 0.1 nm per 10% intensity reduction.

The calculation of the sensitivity coefficients or sensitivities for the polarization tuning method proceeds in a similar manner as for the source tuning method. That is, in order to calculate the sensitivity coefficients or sensitivities for the polarization optimization method, the polarization of each pixel group is incrementally changed (e.g. rotated) by a pre-determined angle, for example +/−45°, and the effect of such an incremental change on all of the CDs is determined. For example, if the CDs of the pattern are reduced by 0.1 nm as a result of a polarization rotation of 45° for a given pixel group, then, the sensitivity for that pixel group is 0.1 nm per 45° rotation change. In an embodiment, the polarization optimization of step 180 involves calculating the incremental effect, on each CD of the selected pattern, of three polarization alterations for each pixel group. The evaluation is carried out for each pixel group and for different polarization states (for example, ±45° polarization rotation and unpolarized, though 90° polarization rotation and, circular polarization could also be used). In this embodiment, assuming there are 117 pixel groups, there will be 351 sensitivity coefficients or sensitivities calculated for each CD measurement (117 pixel groups*3 (corresponding to ±45° polarization rotation and unpolarized state)=351).

The sensitivity coefficients or sensitivities determined at step 180 can be used to define two linear models: one for the source and one for the polarization. In essence, each sensitivity coefficient or sensitivities represents the change in CD resulting from a change in the state of a pixel group (by changing its intensity by +/−10% or by changing its polarization to ±45° polarization or unpolarized).

Then, after determining the sensitivity coefficients at step 180, the method proceeds to step 185 where an initial illumination source (in terms of illumination shape, intensity and polarization condition) is selected for its aptitude to correctly print the selected pattern. In an embodiment, the initial source may be a measured source. Alternatively, the initial source may be a source that has been pre-optimized using conventional optimization methods. As will be appreciated by one skilled in the art, the initial illumination source may have been pre-optimized using, for example, lithographic simulations or measurements.

After selecting the initial illumination source and polarization condition, the method proceeds to steps 190*a* and/or 190*b* where the initial source is modified by sequentially evaluating the impact of all single step source intensity (e.g. by increment of 10%) and polarization alterations. That is, in steps 190*a-b*, each CD of the selected pattern is calculated for the modified source/polarization condition.

The evaluation of the impact of all single step source intensity (e.g. by increment of 10%) and polarization alterations is done by multiplying the sensitivity coefficients or sensitivities by a number or multiplier "n" during a pass or iteration of the iterative procedure and by calculating the lithographic metric. During one iteration, all of the sensitivity coefficients are considered sequentially and the multiplier/pixel group that improves the lithographic metric the most is kept. This process is iteratively repeated until no further improvement in the metric is found. It will be appreciated that the use of linear sensitivity coefficients provides fast calculations in FIG. 18. In an embodiment, the process can be repeated 100-1000 times.

For example, in an embodiment, the impact of a pixel group on CD variations in terms of source intensity (by increments of +/−10% using different multipliers) or polarization (±45° polarization state and unpolarized state using different multipliers) is sequentially evaluated for each pixel group. This process is iteratively repeated for various pixel group intensities (by increments of +/−10% using different multipliers) in step 190a and for various polarization states (±45° polarization and unpolarized using different multipliers) in step 190b. After all possible single step alterations (for example, a pixel group with an increased intensity of 10% or a polarization rotation of 45°) have been evaluated by multiplying the sensitivity coefficients or sensitivities by multipliers, the one (i.e. the multiplier) which gives greatest reduction in CD variations is kept and the pixel group defined by that sensitivity coefficient and multiplier is added to the initial source group (step 195).

It will be appreciated that the optimization process of steps 190a and 190b can be done separately. For example, the method can proceed first to step 190a to optimize the source and then proceed to step 190b to optimize the polarization of each pixel group in the pupil plane or vice versa.

Furthermore, it will be appreciated that the selected pattern could be modified (e.g. further optimized) in conjunction with the source during the iterative process. Such a modification may occur concurrently or after determining the optimized source at step 195 (for example after sequentially evaluating all of the pixel groups in the source). For example, the dimensions of the selected pattern and optical proximity effects (OPCs) features could be changed at step 185 after an optimized source has been found for an initial selected pattern. The procedure shown at FIG. 18 may be repeated for the optimized source determined at step 195 and a modified pattern (e.g. including different OPCs).

In one embodiment, the optimized illumination source can be further optimized by performing a simulated anneal at step 200. The simulated anneal attempts to escape local minima by randomly altering some of the coefficients found for the previous optimum and re-starting the linear sensitivity optimization at step 185 (and step 201). This can be done a plurality of times (e.g. 100-1000 times) and lead to a better solution. In one embodiment, the extrapolation length is minimized to preserve accuracy.

Figure 19:
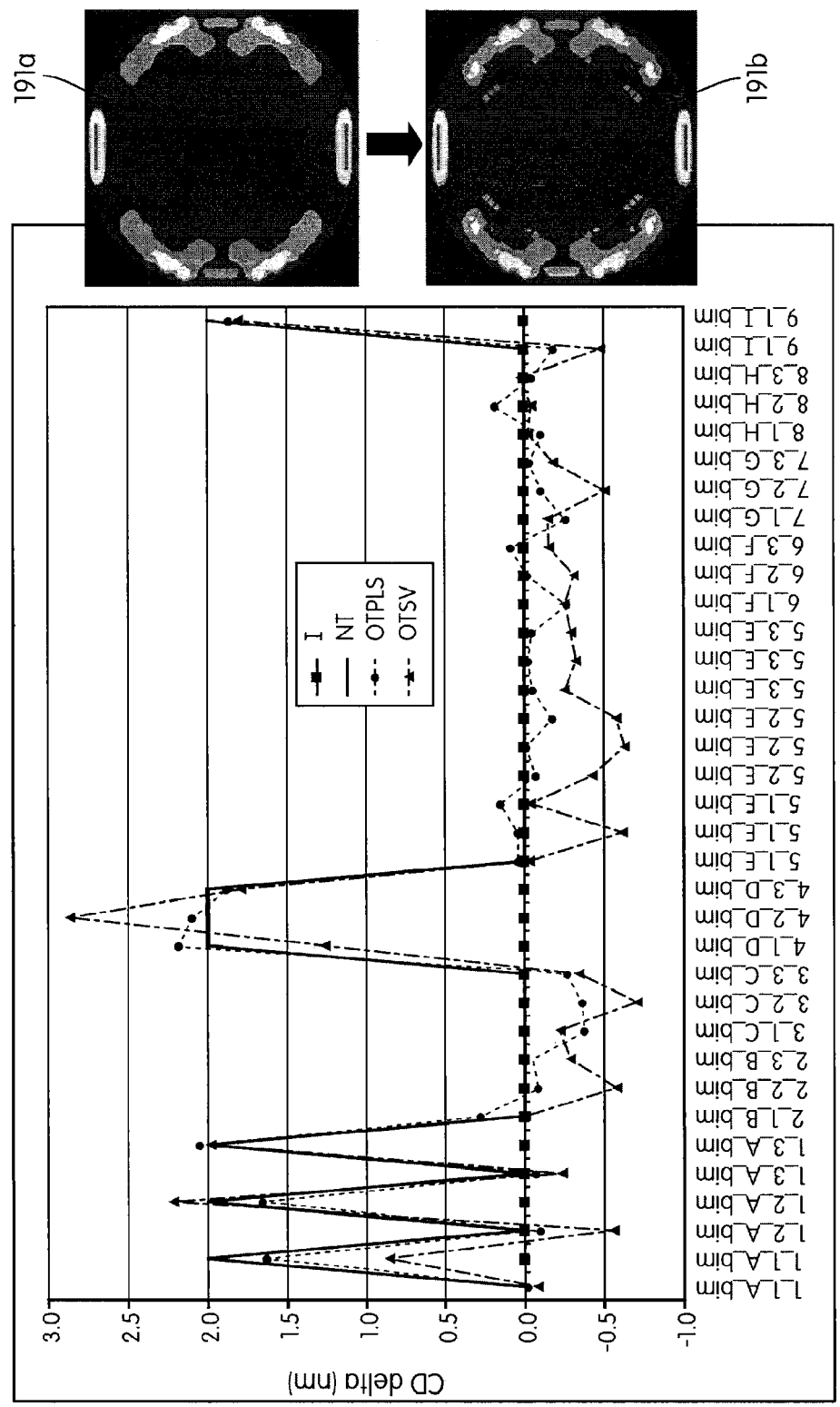
FIG. 19 shows CD variations of a selected pattern optimized with a source optimization only in accordance with an embodiment of the invention.

Referring now to FIG. 19, this figure shows CD variations for 35 CD measurements of a selected pattern obtained with the source optimization 190a of FIG. 18. Each of the CD measurements is 35 nm. No polarization optimization was performed in FIG. 19. The initial source 191a is configured to print all of the CDs at 45 nm. Consider the case where the CDs of 7 of the features are now retargeted to print 2 nm larger while not affecting the other 28. The initial source 191a can be modified using the method of FIG. 18 so that these 7 CDs of the selected pattern are largely pushed toward their new target CD values. As can be seen in FIG. 19, it is possible to selectively print those 7 identified CDs near 47 nm by optimizing or tuning the initial source using the method of FIG. 18. The standard deviation error (RMS) was 0.18 nm. The RMS determined by full simulation was 0.26 nm. Furthermore, it can be seen that the results obtained by linear sensitivity calculation of FIG. 18 corroborate the results obtained by conventional simulation (see "optimized tuning, simulation verification"). In FIG. 19, there were 183 total pixel group flips (1% intensity/flip). The optimized source is shown at 191b. In FIG. 19, the legend is as follows: initial "I", new target "NT", optimized tuning prediction (linear sensitivity "OTPLS", optimized tuning simulation verification "OTSV".

Figure 20:
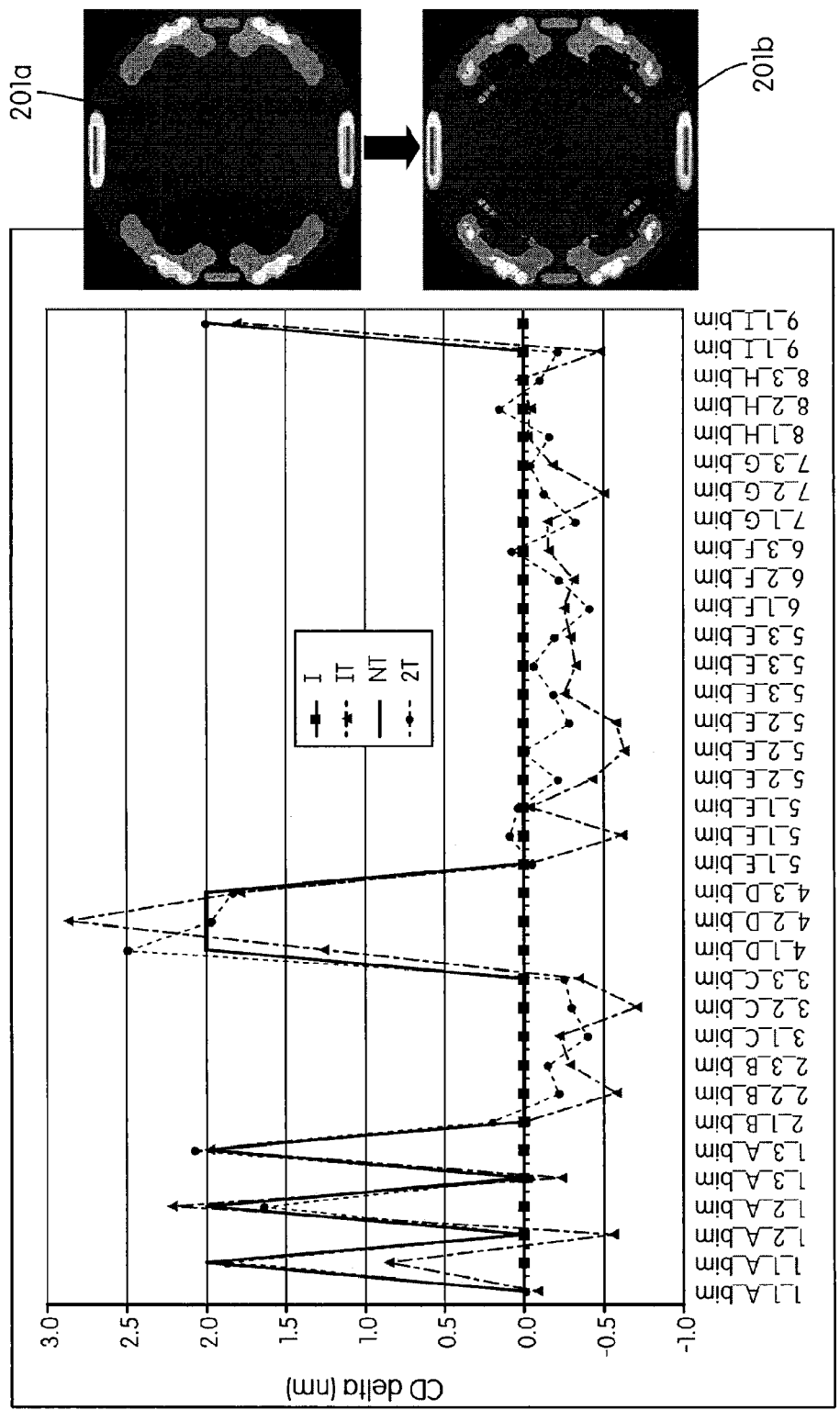
FIG. 20 shows CD variations of a selected pattern optimized with a source optimization only in accordance with an embodiment of the invention.

FIG. 20 shows CD variations for 35 CD measurements of a selected pattern obtained with the source optimization 190a of FIG. 19. In FIG. 20, the tuned or optimized illumination source 201a was further tuned using the method of FIG. 18. The standard deviation error (RMS) was 0.21 nm. It can be seen that additional tuning using full simulations give further improvement. Polarization is fixed at X+Y. The optimized source is shown at 201b. In FIG. 20, the legend is as follows: initial "I", initial tuning "IT", new target "NT", 2$^{nd}$ tuning "2T".

In an embodiment, the method of FIG. 18 can be carried out with polarization tuning only. With polarization tuning, small changes (even one pixel group) can give a large improvement in meeting the new target.

Figure 21:
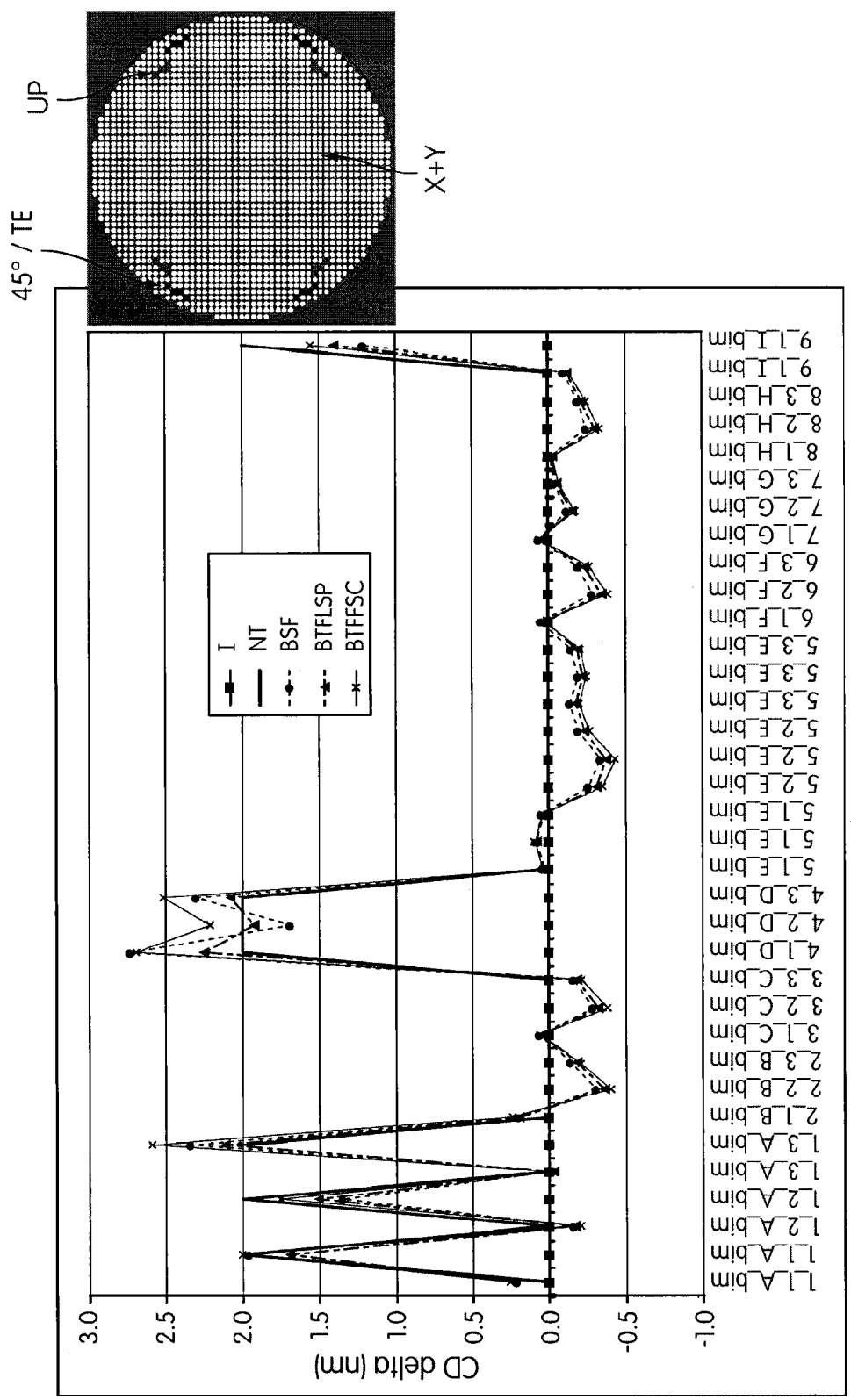
FIG. 21 shows CD variations of a selected pattern optimized with a polarization optimization only in accordance with an embodiment of the invention.

Referring now to FIG. 21, this figure shows CD variations for 35 CD measurements of a selected pattern obtained with the polarization optimization 190b of FIG. 18 (i.e. polarization tuning only). In FIG. 21, the source shape is fixed (no optimization) and the polarization of individual pixel groups are modified. The initial polarization was X/Y. The exact diagonals of the illumination source are kept unpolarized ("UP"). Similarly to FIG. 19, the initial source is modified using the method of FIG. 18 (step 190b) so that 7 of the CDs of the selected pattern have a value of 47 nm (i.e. 45+2 nm) instead of 45 nm. The initial RMS (i.e. all 35 CD measurements at 45 nm) is 0.89 nm. As can be seen in FIG. 21, it is possible to selectively print those 7 identified CDs near the 37 nm target by optimizing or tuning the polarization of the initial source using the method of FIG. 18 (step 190b). The standard deviation error (RMS) was reduced from 0.89 nm to 0.28 nm. In FIG. 21, the legend is as follows: initial "I", new target "NT", best single flip "BSF", best two flips (linear sensitivity prediction "BTFLSP", best two flips (full simulation check) "BTFFSC".

Figure 22:
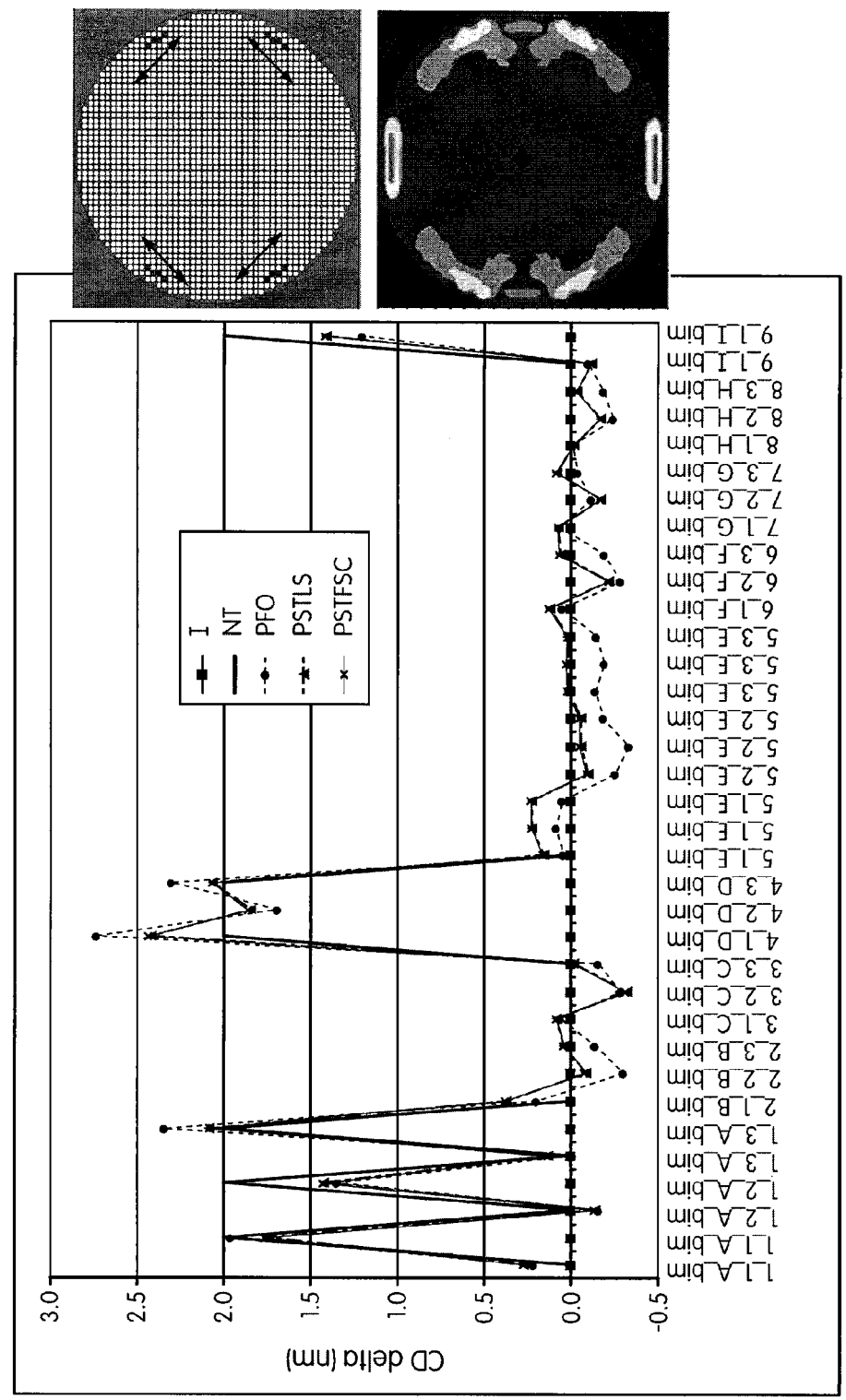
FIG. 22 shows CD variations of a selected pattern optimized with a source optimization and a polarization optimization in accordance with an embodiment of the invention.

FIG. 22 shows CD variations for 35 CD measurements of a selected pattern obtained with simultaneous source and polarization optimization. As can be seen in FIG. 22, the combination of source optimization 190a and polarization optimization 190b of FIG. 18 can further reduce RMS by 0.07 nm (see reduction from 0.28 nm to 0.21 nm). That is, the RMS obtained with the uncorrected initial was 0.89 nm. The RMS obtained after one polarization flip was 0.28 nm. The RMS obtained after polarization flip and source tuning was reduced to 0.21 nm. The optimization method of FIG. 22 includes using best single polarization pixel group change (metric 0.89→0.28 nm); calculating source tuning pixel group sensitivities with this fixed polarization; performing an analysis to find the best source tuning and verifying the results, and performing minor source adjustment. As can be seen in FIG. 22, linear sensitivity prediction is nearly perfect. In FIG. 22, the fixed polarization was set to X+Y with one 45° pixel group change and only 10 total pixel group flips were done (1% intensity/flip). In FIG. 22, the legend is as follows: initial "I", new target "NT", polarization flip only "PFO", plus source tuning (linear sensitivity) "PSTLS" and plus source tuning (full simulation check") "PSTFSC".

Figure 23:
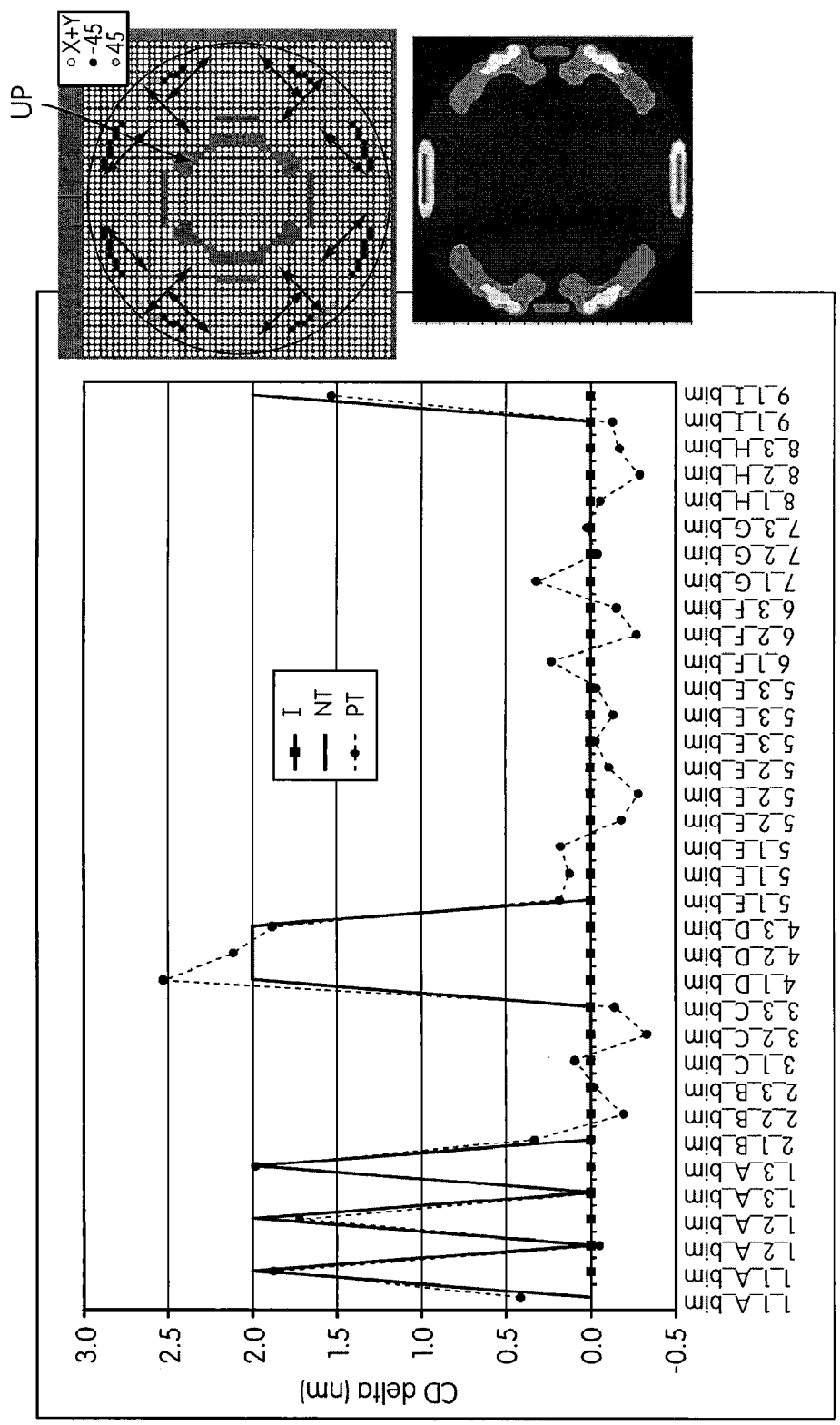
FIG. 23 shows CD variations of a selected pattern optimized using polarization optimization only in accordance with an embodiment of the invention.

FIG. 23 shows CD variations of a selected pattern optimized obtained with a polarization optimization only in accordance with an embodiment of the invention. The source was fixed at the initial setting. As can be seen in FIG. 23, the RMS is further reduced, from 0.89 nm to 0.22 nm. The optimization method of FIG. 23 includes using a fixed source, and evaluating the effect of fixed pixel group swaps (±45° and unpolarized) on the metric. Favorable changes were kept. In FIG. 23 the legend is as follows: initial "I", new target "NT", polarization tuned "PT".

Because it may be difficult to find an optimum solution when changing various parameters (e.g. source shape, polarization angle, mask features) at once during the SMPO procedure and because initial polarization assumption(s) might lead to incorrect SMPO solutions, a multi-step approach may be pursued in one embodiment of the invention. Indeed, it was noticed that optimization procedures are challenged when adding polarization as an extra degree of freedom to source mask optimization. In part, this is because of the coupling of polarization state, required optical proximity corrections, and diffraction pattern.

In the new approach according to one embodiment, the source is configured or optimized without first taking into account polarization. This is done using scalar imaging only, which, as will be appreciated by one skilled in the art, does not prejudice against "non-intuitive" polarization conditions. As known in the art, scalar imaging disregards polarization and models the electric and magnetic field of the electromagnetic wave that propagates through the lithographic apparatus using a scalar function. The scalar function represents either the electric or the magnetic field amplitude and is used to calculate the aerial image of the mask pattern.

Figure 24:
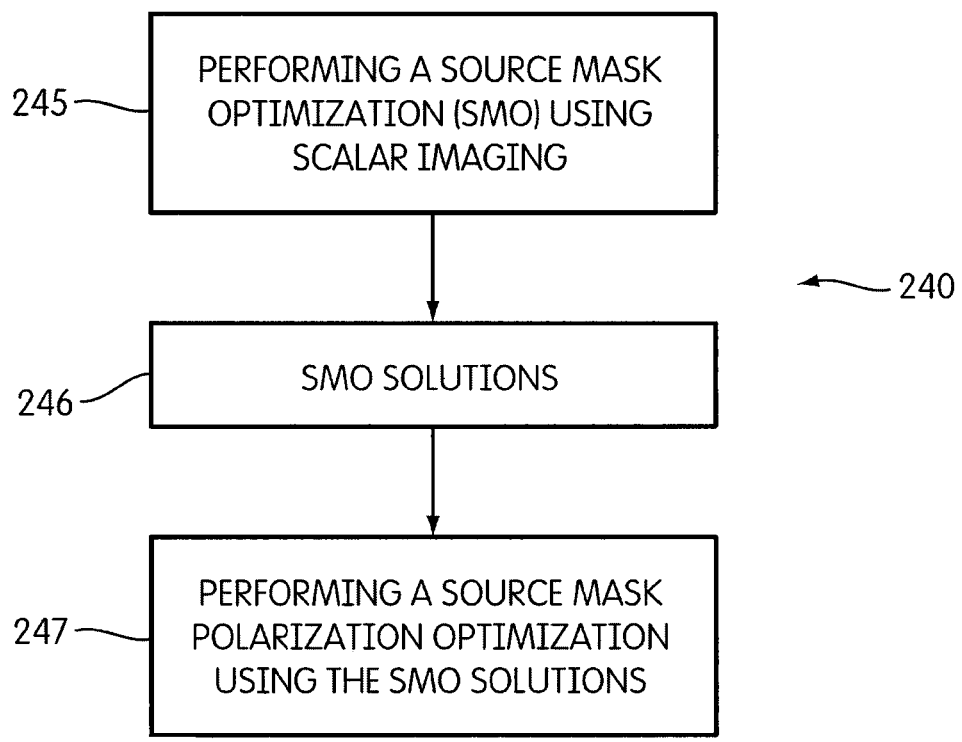
FIG. 24 shows a method for configuring the illumination source in accordance with an embodiment of the invention.

For example, referring to FIG. 24, this figure shows a method 240 for configuring the illumination source in accordance with an embodiment of the invention. The method 240 includes performing a source mask optimization (SMO) procedure using scalar imaging at step 245 to find SMO solutions (step 246), which correspond to a preliminary optimized illumination source and a preliminary optimized mask pattern. The SMO solutions 246 are then inputted as initial solutions of a source mask polarization optimization procedure (SMPO) at step 247. It will be appreciated that the polarization-optimized vector solution of step 247 should approach the performance metric of the scalar calculation.

In one embodiment, the SMO procedure using scalar imaging can be performed in a similar manner as the optimization procedure shown in FIG. 18, but without performing step 190b. Likewise, the SMPO procedure of step 247 may be performed in a similar manner as the optimization procedure shown in FIG. 18. In one embodiment, the SMO solutions of step 246 are used as the initial conditions 185 (see FIG. 18) for the SMPO procedure of step 247.

Figure 25:
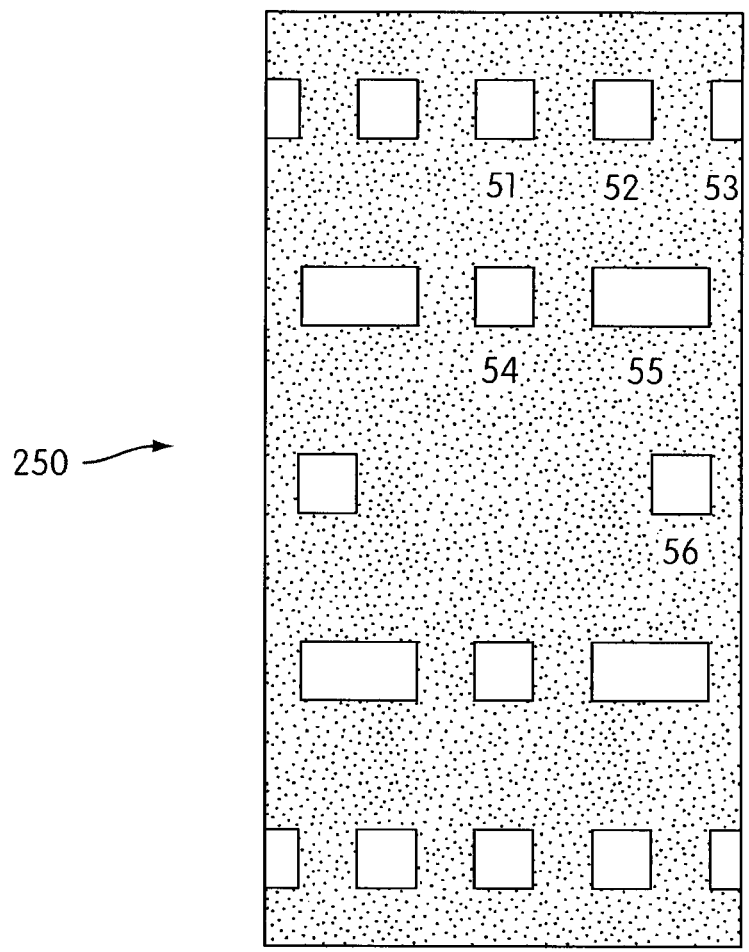
FIG. 25 shows a SRAM hole pattern to be optimized in accordance with an embodiment of the invention.
Figures 26A, 26B:
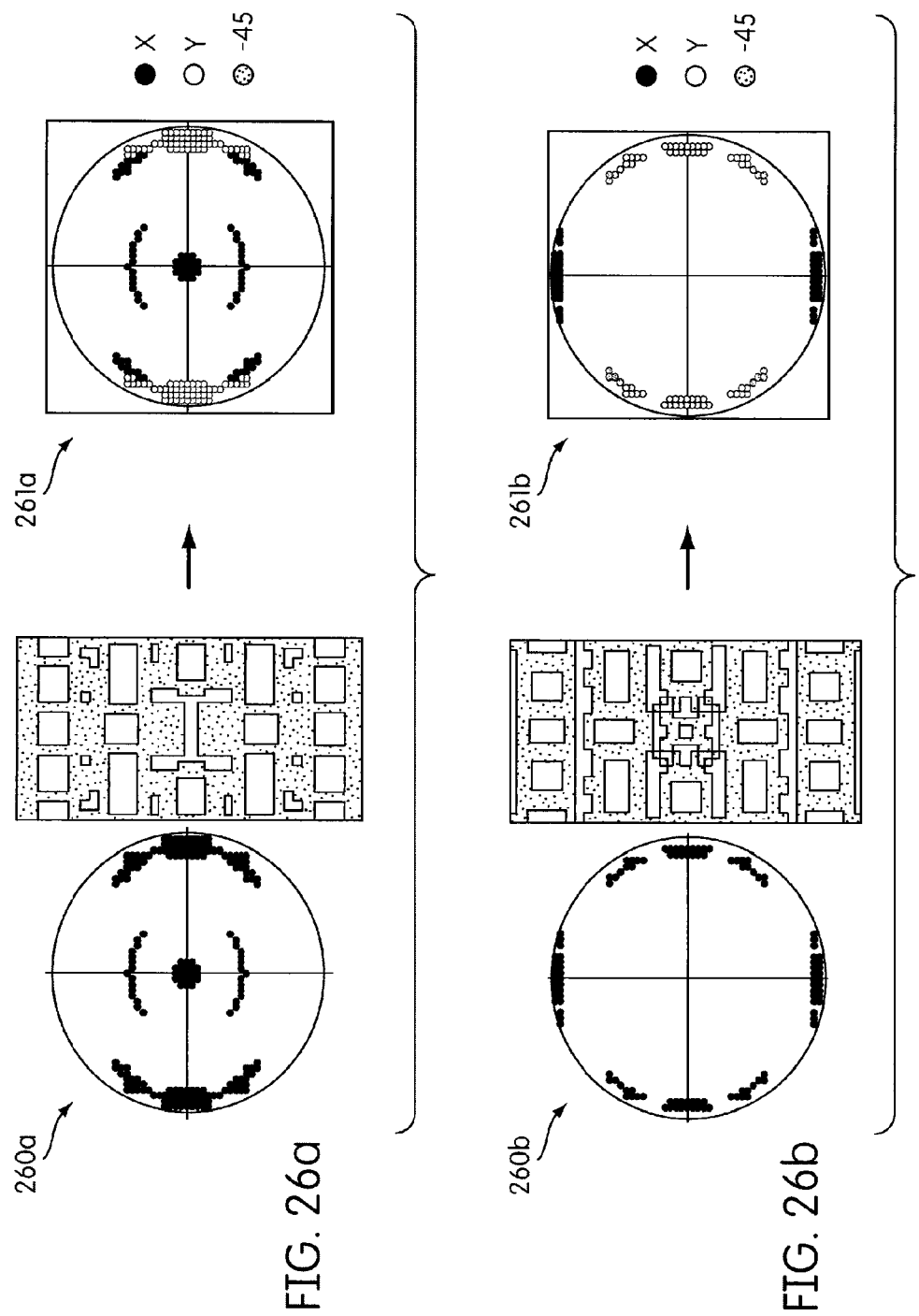
FIGS. 26a, b show two SMO solutions found for a SRAM hole pattern using the scalar imaging approximation (left), and subsequent polarization optimization with vector imaging (right) in accordance with an embodiment of the invention

In one embodiment, using the scalar imaging procedure of step 245, two distinct minima were found for a SRAM hole pattern 250 shown at FIG. 25. The measured features of the SRAM pattern are the horizontal and vertical cuts of the six indicated holes 51-56. The results of the SMO using scalar imaging are shown in FIGS. 26a, b (left portion). The optimization metric minimized CD variation (in nm) for the 12 cuts of FIG. 25 with the following error budget: 6% dose, 80 nm focus, 1 nm mask CD. Four fixed polarization angles were included in the optimization (0, ±45°, 90°). In both cases the procedure started with the target pattern as the mask selection and annular illumination. FIG. 26a is the minimum found when source optimization is emphasized initially and FIG. 26b results when mask optimization is emphasized initially. When mask optimization is emphasized initially, more weigh is given to the mask parameters and the assist features (as opposed to the source parameters) that optimize the lithographic metric (e.g. minimize CD errors) during scalar imaging calculations. This is why the SRAM pattern has significantly changed from FIG. 25 to FIG. 26b. Conversely, when source optimization is emphasized initially, more weigh is given to the source parameters (as opposed to the mask parameters) that optimize the lithographic metric (e.g. minimize CD errors). For example, in one embodiment, during "initial source emphasis" the source pixel groups are sequentially considered first (with no added mask assist features) before considering the mask assist features. By contrast, during "initial mask emphasis," the mask tiles are sequentially considered first (with possible mask assist features additions) with an initial fixed source before considering source changes.

The scalar results 260a, 260b well represent the best source shapes and continuing with the vector SMPO procedure (assist features patterns fixed) results in the final polarized sources 261a, 261b shown on the right side of FIGS. 26a, b. The metrics of scalar sources 260a, 260b are, respectively, 6.34 nm and 5.31 nm for the studied pattern. The metrics of polarized sources 261a, 261b are, respectively, 6.96 nm and 5.82 nm for the studied pattern. These two solutions represent distinct minima on the response surface and based on the large difference in the amount of mask decoration can be referred to as the "weak" and "strong" mask solutions respectively. Depending on the pattern to be printed, one mask solution may be favored over the other one for its aptitude to provide better lithographic performances (e.g. exposure latitude, CD variations, . . . ).

Source mask optimization (SMO) and source mask polarization optimization (SMPO) procedures are generally performed using a flat mask approximation, also referred to as the Kirchoff approximation. However, as feature sizes and process windows shrink, the size of the overlapping process window of various mask patterns is often significantly degraded by feature-dependent best focus shifts and focus tilts which are usually caused by 3 dimensional (3D) mask effects. Thus, the resultant solutions of the SMO and SMPO procedures may be impacted by the 3D mask effects. According to one aspect of the invention, 3D mask effects are accounted for during configuration of the illumination source.

Figure 27:
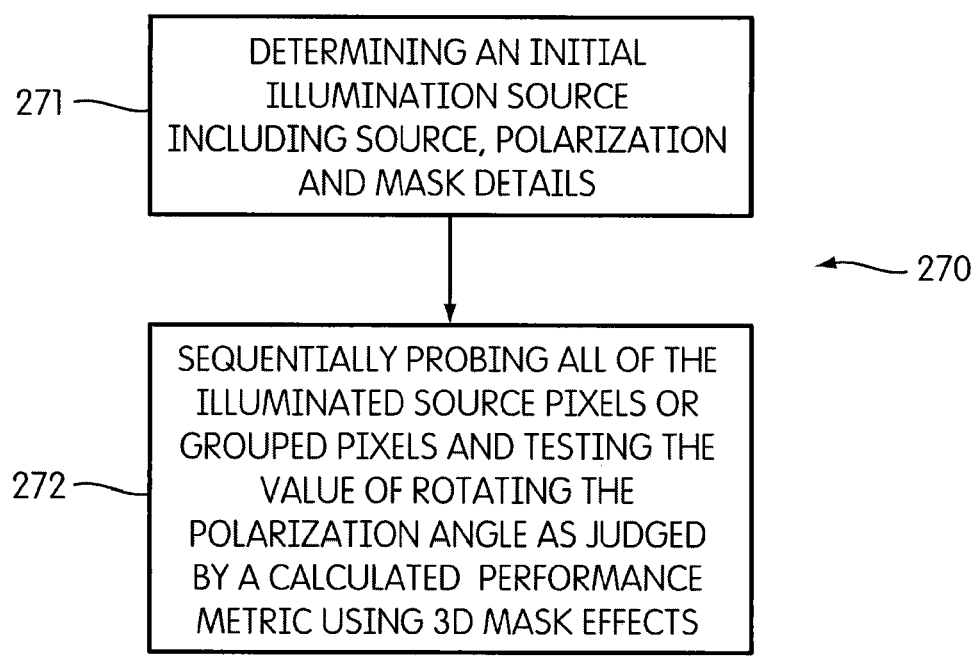
FIG. 27 shows a method for configuring the illumination source in accordance with an embodiment of the invention.

Referring to FIG. 27, this figure shows a method 270 for configuring the illumination source in accordance with an embodiment of the invention. Specifically, method 270 can be used to configure a transfer of an image of a pattern onto a substrate in a lithographic apparatus, the pattern to be illuminated by an illumination source of the lithographic apparatus. The method 270 can be carried out using lithographic simulations. The method 270 includes determining an initial or first illumination source including source, polarization and mask or pattern details (step 271). The illumination source of step 271 can be the solution of, for example, the SMPO procedure shown in FIG. 18. However, this is not limiting. The illumination source of step 271 can be the solution of a source mask optimization procedure with or without taking into account the three dimensional effects or any other optimization procedures.

Once the initial illumination source is selected, the method proceeds to step 272 where all of the illuminated source pixels or grouped pixels of the initial illumination source are sequentially evaluated by testing, for example, the impact of their polarization and intensity (e.g. "on" or "off") on a lithographic performance metric using 3D effects associated with the pattern. The lithographic performance may be represented by the critical dimensional uniformity (CDU) of the one or more patterns under consideration. For example, in step 272, the critical dimensional uniformity (CDU) may be calculated over an assumed budget of focus, dose and mask errors using 3D mask effects. In one embodiment, 3D mask effects are accounted for in the calculation using various parameters of the mask. Examples of mask parameters include the thickness and the materials of the mask. However, this is not limiting. For example, in one embodiment, the pattern is arranged on a support of a programmable patterning device (e.g. a programmable mirror array) and the three dimensional effects are taken into account by using a thickness of the support and/or a material of the support.

In method 270, if a change of polarization or intensity of the source pixel or grouped pixels under evaluation improves the metric, then that change is retained. Conversely, if the change of polarization or intensity does not improve the metric, then the initial polarization and/or intensity is/are kept and another pixel or group of pixels is evaluated. The procedure 270 ends once all of the pixels or groups of pixels have been evaluated.

Figure 28A:
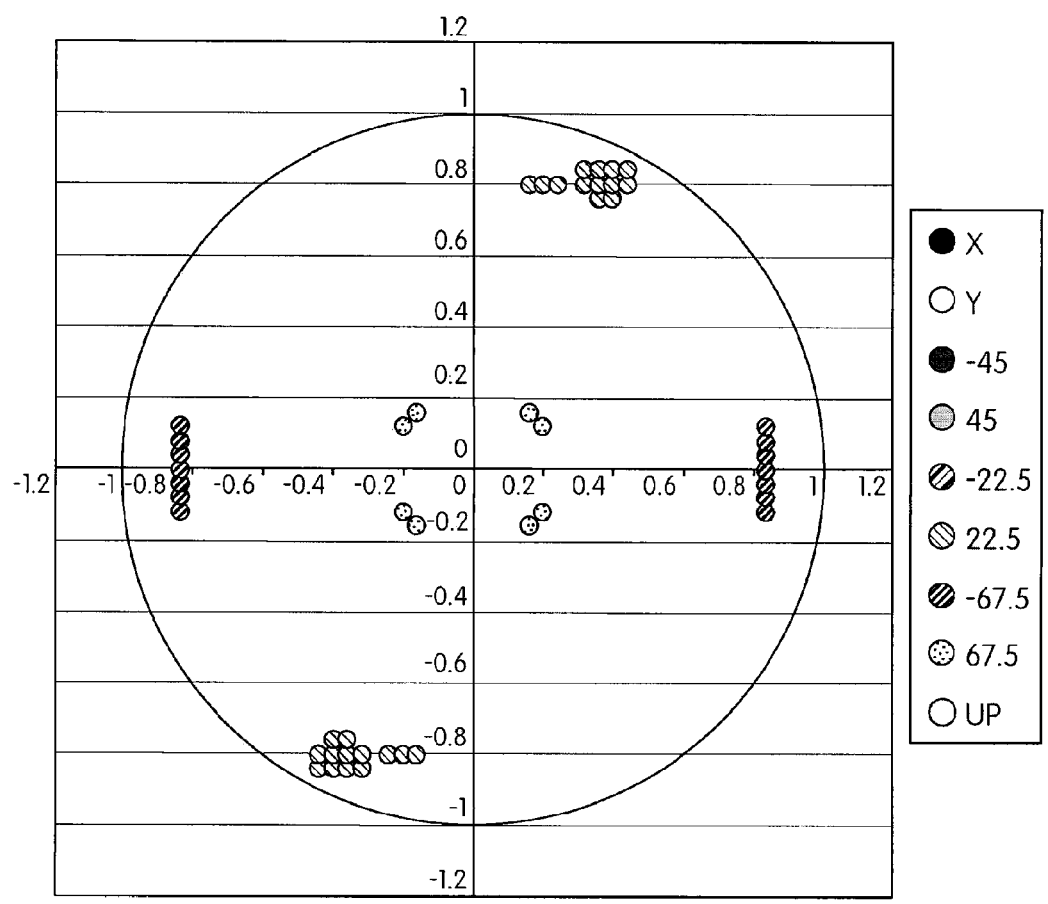
FIG. 28a shows an initial source shape obtained using the method of FIG. 18.

Referring to FIG. 28a, this Figure shows an initial source shape that is configured to print an array of five patterns/cuts: (1) 40 nm tilted 1:1 lines (arranged in a 80 nm pitch), (2) 100 nm (180 nm pitch) V lines, (3) 1000 nm iso V lines, (4) 80 nm iso V trench, and (5) 80 nm iso H trenches. The initial source shape of FIG. 28a is optimized to print the five patterns with maximum latitude. FIG. 28a was the result of a preliminary Kirchoff optimization.

As can be seen in FIG. 28a, the initial illumination source includes various groups of pixels that each have a different polarization (−22.5°, 22.5°, −67.5°, 67.5°). The lithographic metric is critical dimensional uniformity (CDU), which is defined as follows: For each pattern or cut, the CDU is calculated as follows:

$$CDU = \left( \sum_{process\_errors} (CD_{range})^2 \right)^{0.5} / 2$$

The ranges of process errors are: 80 nm defocus, 6% dose, and 1 nm mask

The total optimization metric for the 5 patterns or cuts is represented as follows:

$$CDU_{total} = (avg(CDU_{cut}) + max(CDU_{cut}))/2$$

It will be appreciated that other metrics could be used in other embodiments of the invention to optimize the initial illumination source shape.

Figure 28B:
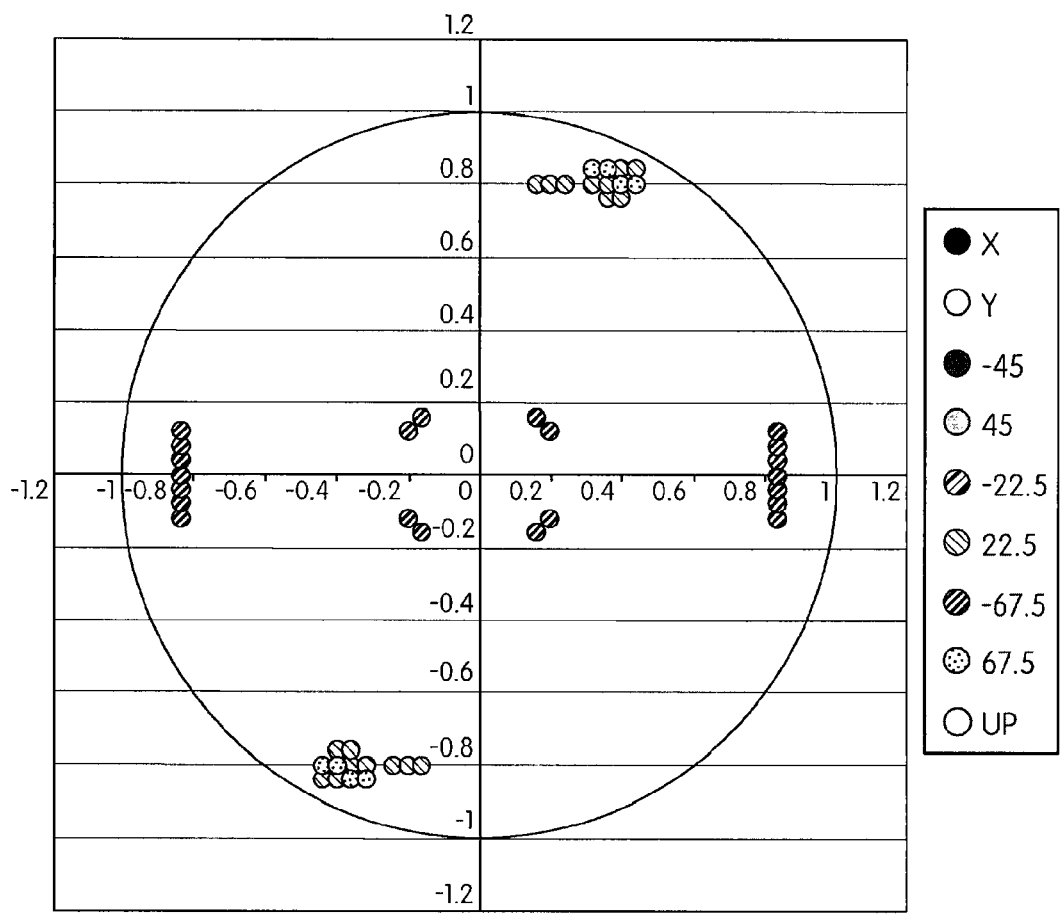
FIG. 28b shows a source shape optimized using the method of FIG. 27.

Referring now to FIG. 28b, this figure shows a modified illumination source after performing step 272 of FIG. 27. In FIG. 28a, the pixels of the illumination source have been sequentially evaluated using 3D mask effects to determine the impact of their polarization and their intensity ("on" or "off") on the lithographic metric (CDU). The impact is measured in terms of reduction of $CDU_{total}$. As can be seen in FIG. 28b, the polarization of the pixels located near the center of the source has changed from 67.5° to −67.5°. Furthermore, the polarization of some of the pixels located in the off-axis pixel groups has changed from 22.5° to 67.5°. The intensity of the pixel groups remains the same (i.e. all "on"). Thus, when 3D mask effects are taken into account, it can be seen that some of the pixels (4 pixels) in the off-axis pixel groups have a different optimum polarization than their neighbors.

Figure 28C:
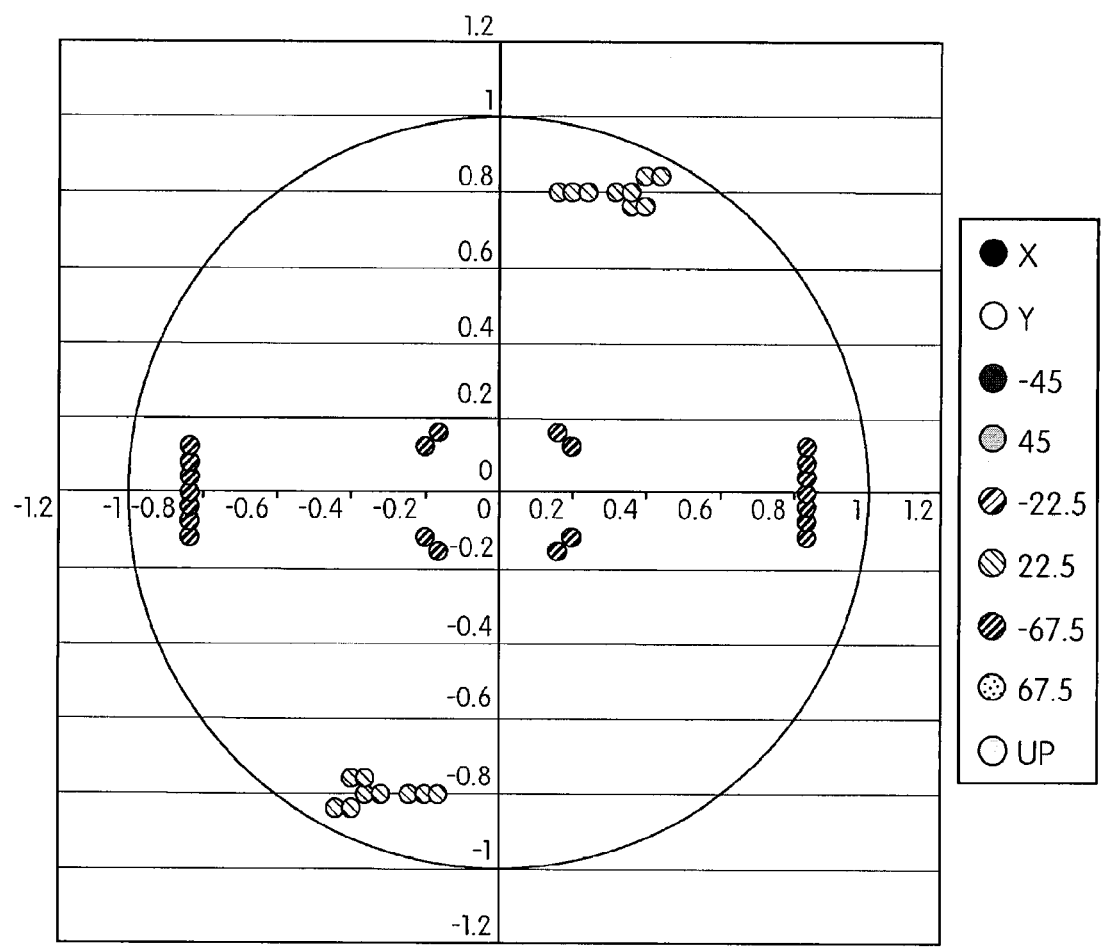
FIG. 28c shows a source shape optimized using the Kirchoff optimization.

By comparison, FIG. 28c shows a modified illumination source after performing a Kirchoff optimization on the initial illumination source. Thus, FIG. 28c is obtained using the same calculations as in step 272 without taking into account 3D mask effects. Rather, calculations are performed for a flat mask. As can be seen in FIG. 28c, the polarization of the pixels located at the center of the source has also changed from 67.5° to −67.5°. However, the 4 pixels in the off-axis pixel groups that had a different optimum polarization than their neighbors in FIG. 28b are now "off" or dark.

Figure 29:
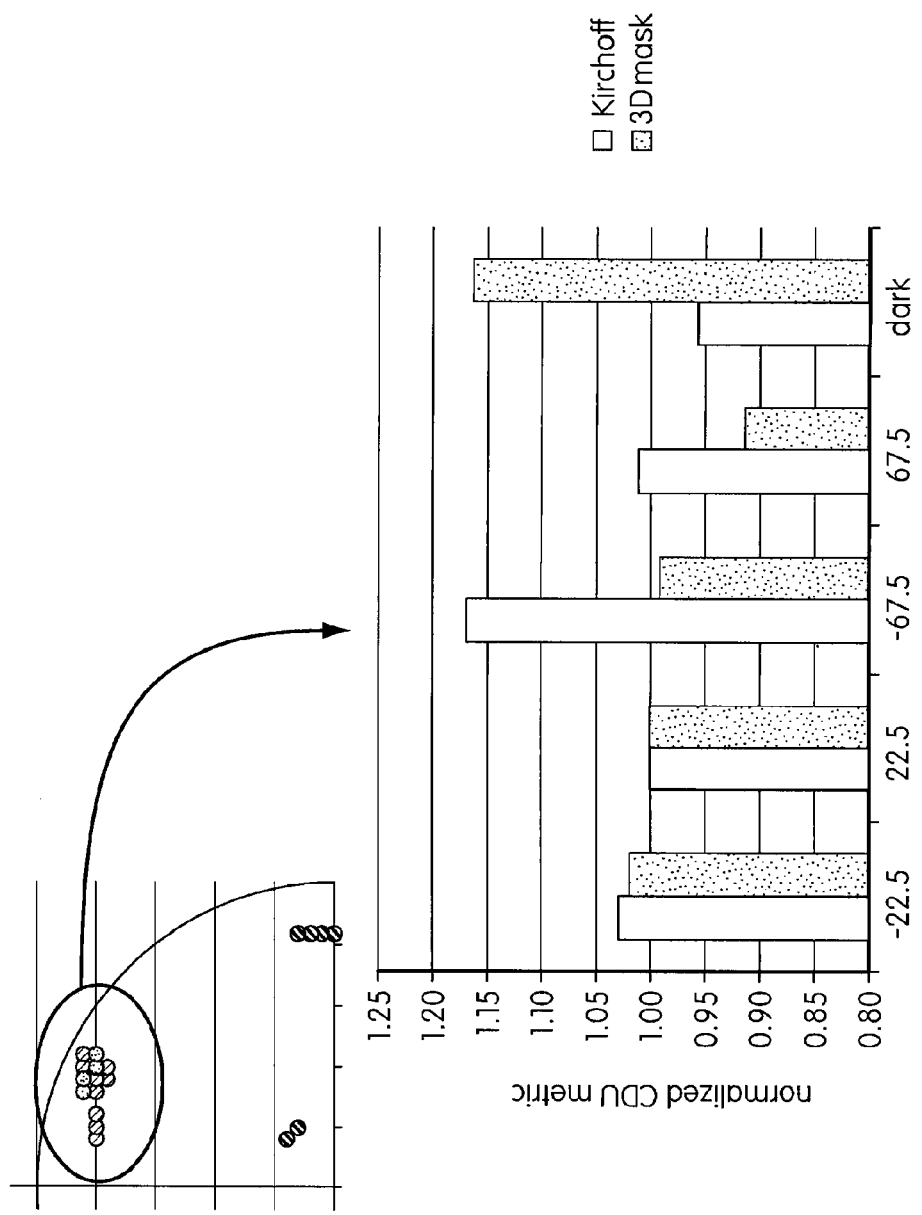
FIG. 29 shows the normalized CDU for 4 pixel groups in accordance with an embodiment of the invention.

Referring to FIG. 29, this Figure shows the normalized CDU for the 4 pixel groups that had a different optimum polarization than their neighbors in FIG. 28b for various polarizations (−22.5°, 22.5°, −67.5°, 67.5°). As can be seen in FIG. 29, the normalized CDU of the 4 pixel groups for the 3D mask effects optimization and the Kirchoff optimization is 1. As can also be seen in FIG. 29, the reduction of the normalized CDU is greater for the 3D mask effects optimization than for the Kirchoff optimization (see 67.5° vs. dark).

Figure 30A:
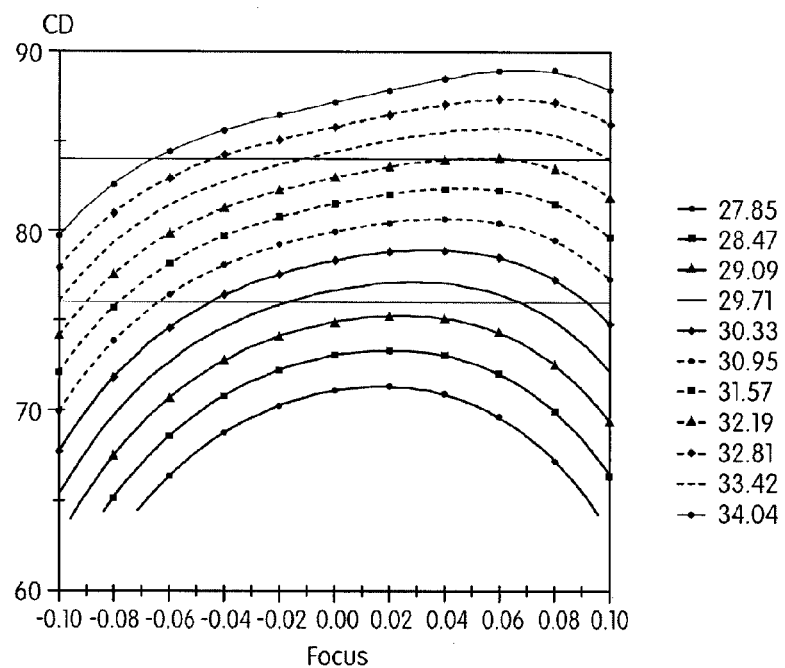
FIGS. 30a-b show focus exposure graphs (FEM) obtained for the 80 nm H iso trench pattern using, respectively, the optimized illumination source of FIG. 28b (with 3D mask effects) and the optimized illumination source of FIG. 28c (Kirchoff optimization) in accordance with an embodiment of the invention.
Figure 30B:
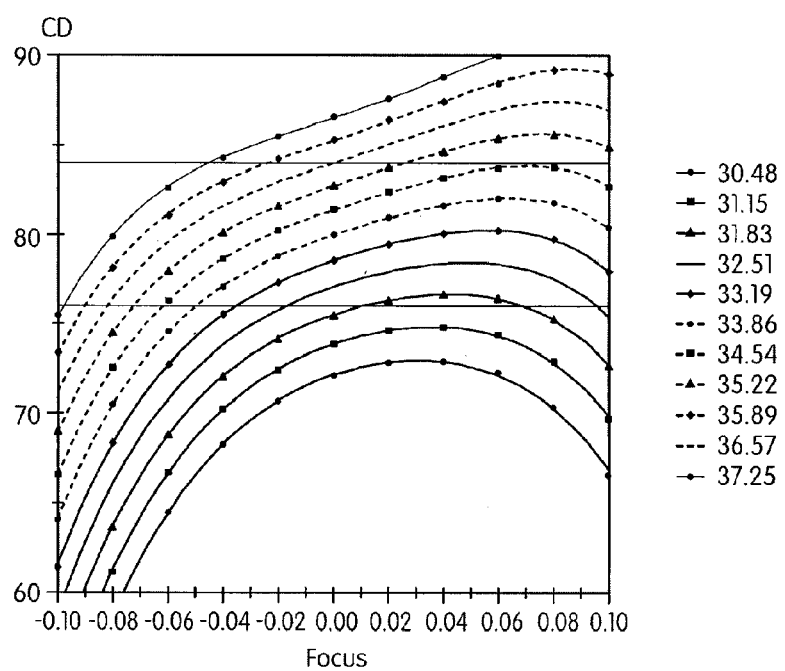

FIGS. 30a-b show focus exposure graphs (FEM) obtained for the 80 nm H iso trench pattern using, respectively, the optimized illumination source of FIG. 28b (with 3D mask effects) and the optimized illumination source of FIG. 28c (Kirchoff optimization). As can be seen in FIG. 30a, the FEM is less tilted when the illumination source is optimized using 3D mask effects. This drives the metric improvement.

Figure 31A:
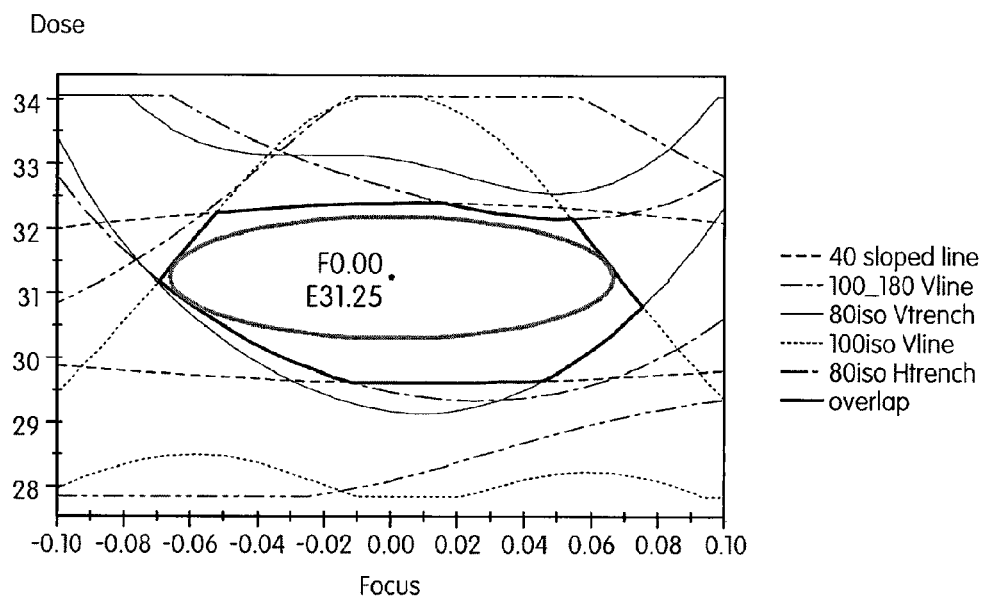
FIGS. 31a-b show process windows (PW) of 5 patterns using, respectively, the optimized illumination source of FIG. 28b (with 3D mask effects) and the optimized illumination source of FIG. 28c (Kirchoff optimization) in accordance with an embodiment of the invention.
Figure 31B:
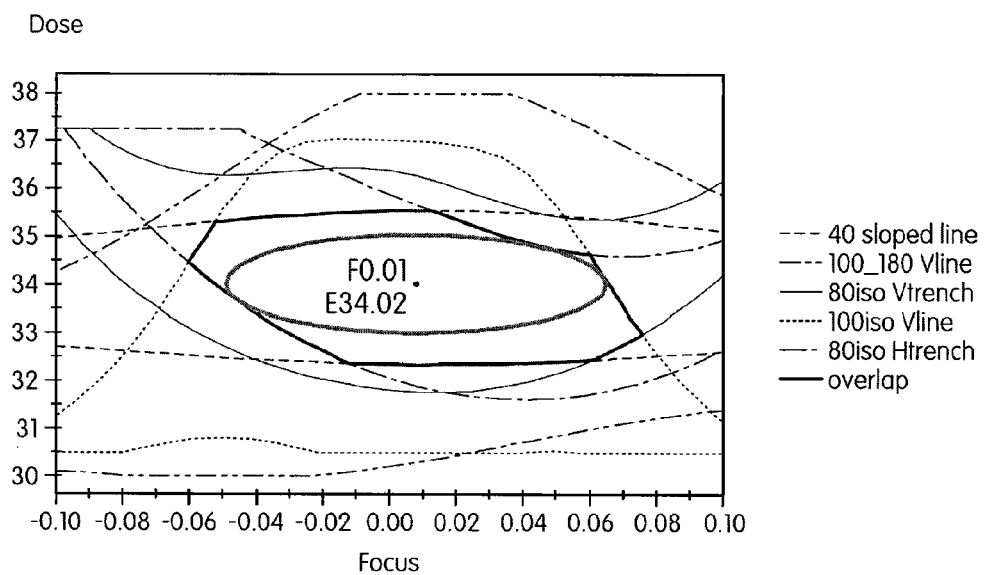

FIGS. 31a-b show the corresponding process windows (PW) of the 5 patterns using, respectively, the optimized illumination source of FIG. 28b (with 3D mask effects) and the optimized illumination source of FIG. 28c (Kirchoff optimization). FIGS. 31a-b also show the overlapping process window. As can be seen in FIG. 31a, the overlapping process window is substantially centered and larger when the illumination source is optimized using 3D mask effects.

Figure 32A:
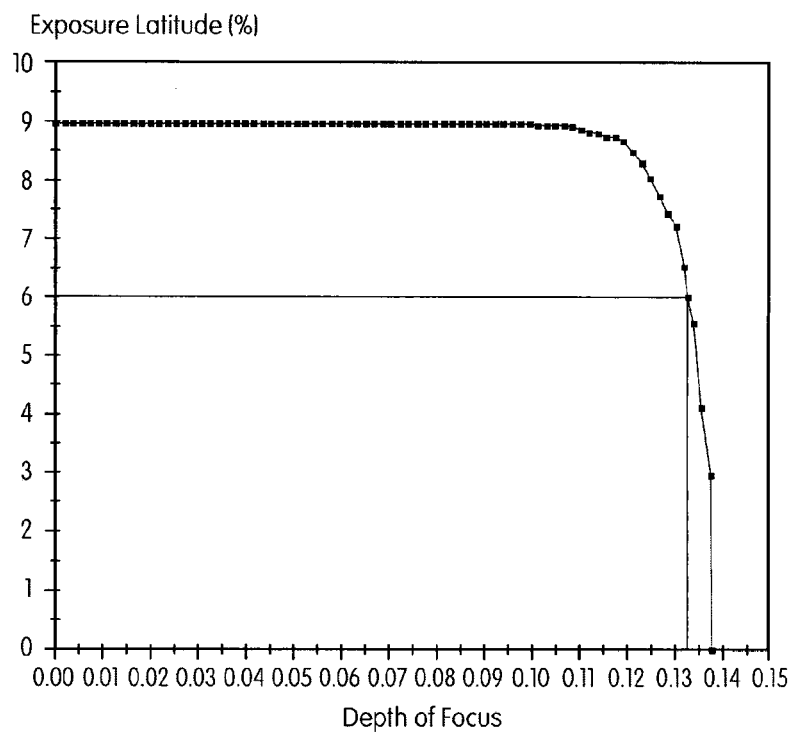
FIGS. 32a-b show the exposure latitude as a function of depth of focus graphs for 5 patterns using, respectively, the optimized illumination source of FIG. 28b (with 3D mask effects) and the optimized illumination source of FIG. 28c (Kirchoff optimization) in accordance with an embodiment of the invention.
Figure 32B:
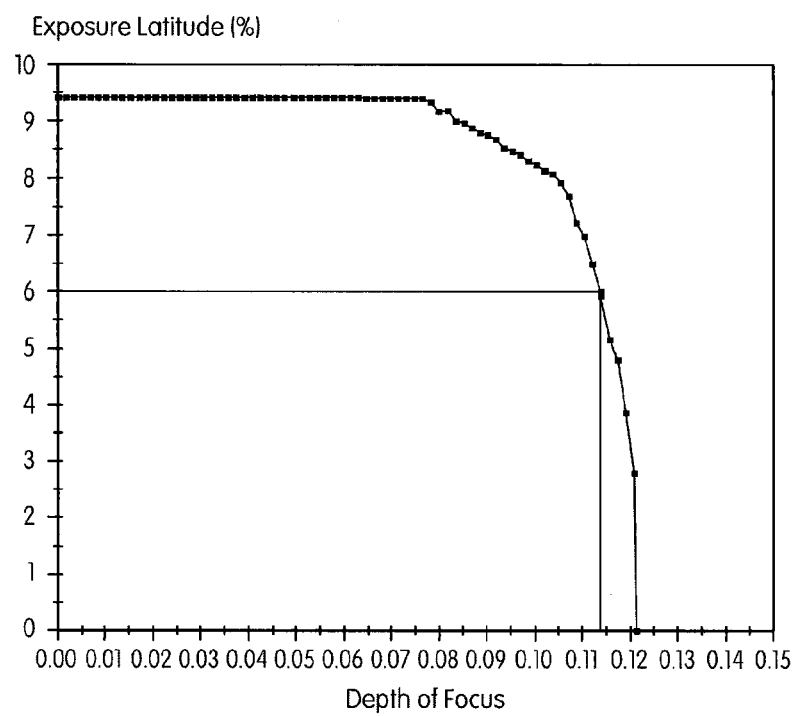

FIGS. 32a-b show the exposure latitude vs. depth of focus graphs for the combined 5 patterns using, respectively, the optimized illumination source of FIG. 28b (with 3D mask effects) and the optimized illumination source of FIG. 28c (Kirchoff optimization). As can be seen in FIG. 32a, the exposure latitude vs. depth of focus is larger when the illumination source is optimized using 3D mask effects (133 nm @ 6% exposure latitude vs. 114 nm @ 6% exposure latitude).

It will be appreciated that in step 271 of method 270, the initial illumination source can be determined by performing a first source mask polarization optimization procedure, or performing a source mask optimization procedure with or without taking into account three dimensional mask effects in various embodiments of the invention.

Figure 33:
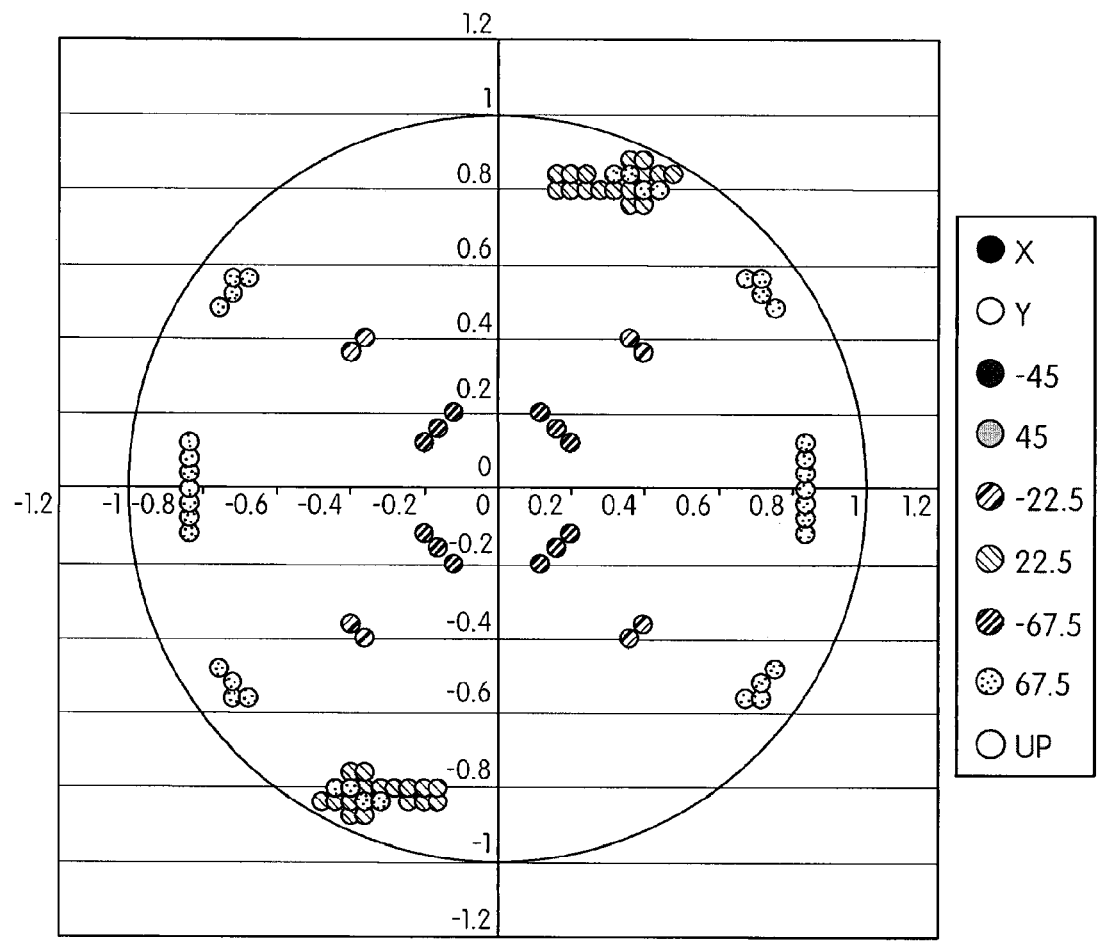
FIG. 33 shows the illumination source obtained with the procedure of FIG. 18 using 3D mask effects in accordance with an embodiment of the invention.

In method 270, 3D mask effects have been accounted for by probing the illuminated pixels from a previously found optimum illumination source. However, this is not limiting. It will be appreciated that 3D mask effects can be directly accounted for during the SMPO procedure described at FIG. 18. That is, instead of interrogating or probing only a limited number of pixel groups using 3D effects, all of the pixel groups of the illuminator can be evaluated using 3D mask effects in an embodiment. In an embodiment, 3D mask effects can be accounted for when calculating the sensitivity coefficients. For example, FIG. 33 shows the illumination source obtained with the procedure of FIG. 18 using 3D mask effects. As will be appreciated, when 3D mask effects are accounted for during the SMPO procedure of FIG. 18, the resulting illumination source may differ significantly from those of FIGS. 29a-b.

Figure 34A:
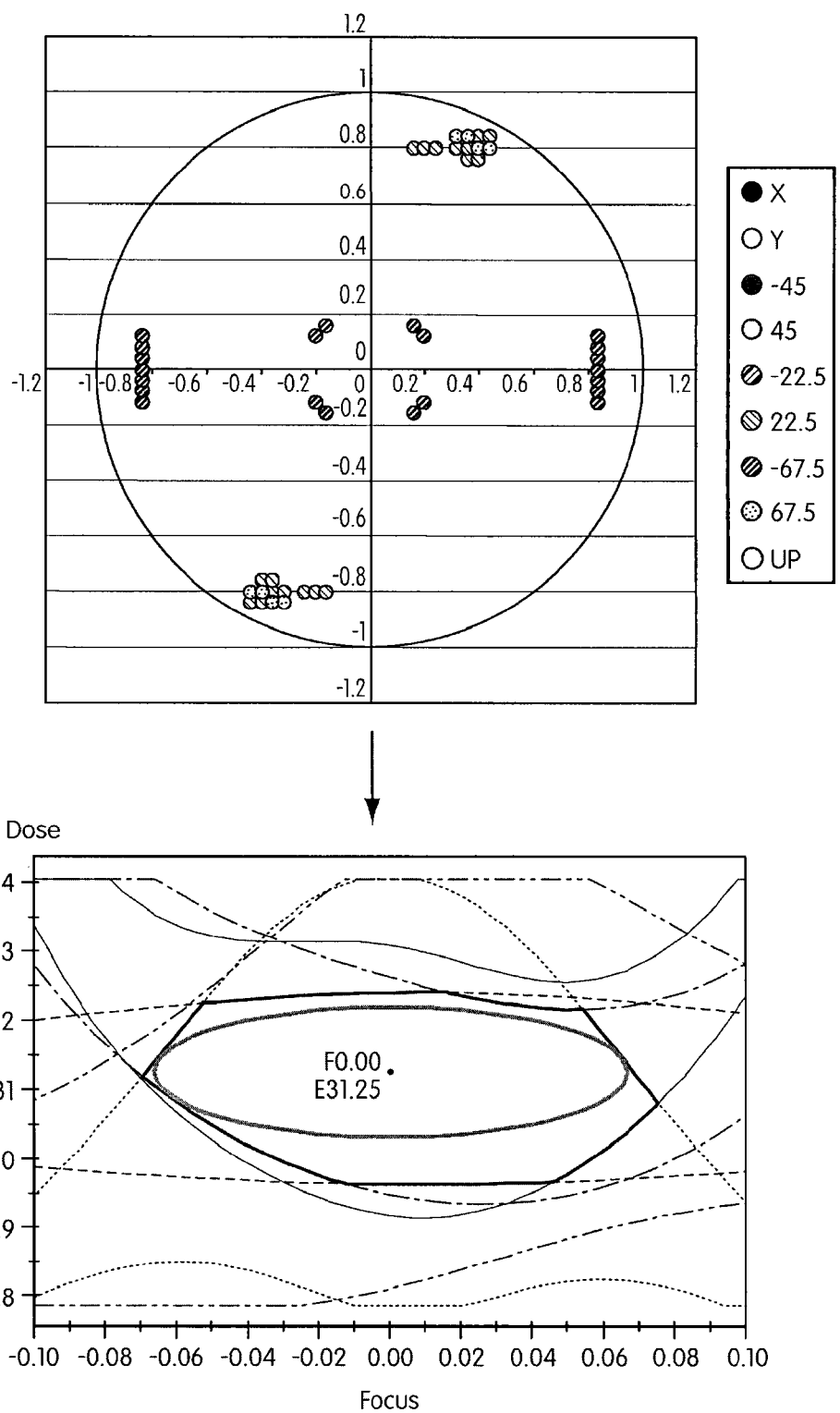
FIGS. 34a-b show the total process windows for the illumination source of FIGS. 28b and 33 in accordance with an embodiment of the invention.
Figure 34B:
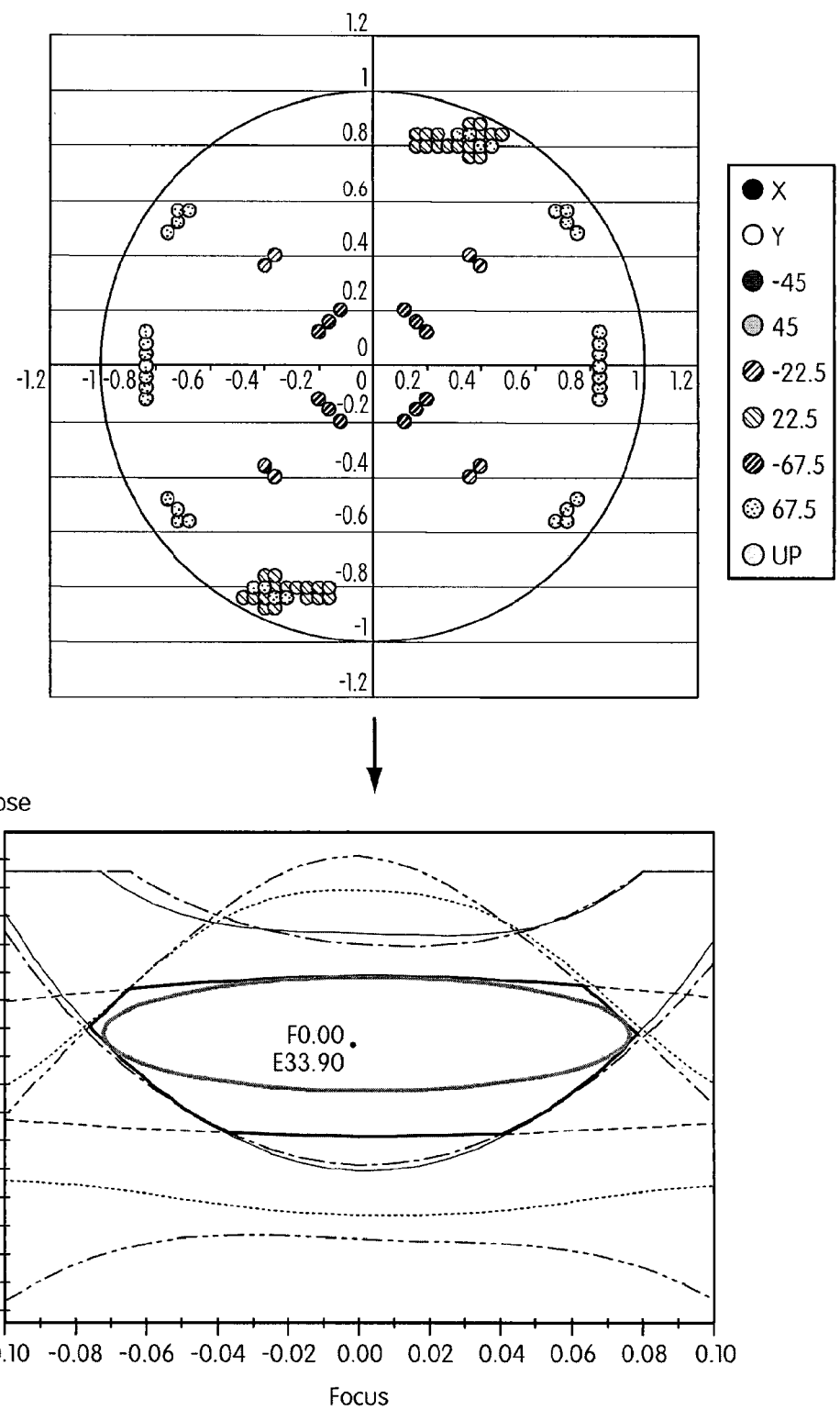

FIGS. 34a-b show the total process windows for the illumination source of FIGS. 28b and 33. As can be seen in FIG. 34b, the focus shift is reduced when 3D mask effects are accounted for during the SMPO procedure.

Figure 35A:
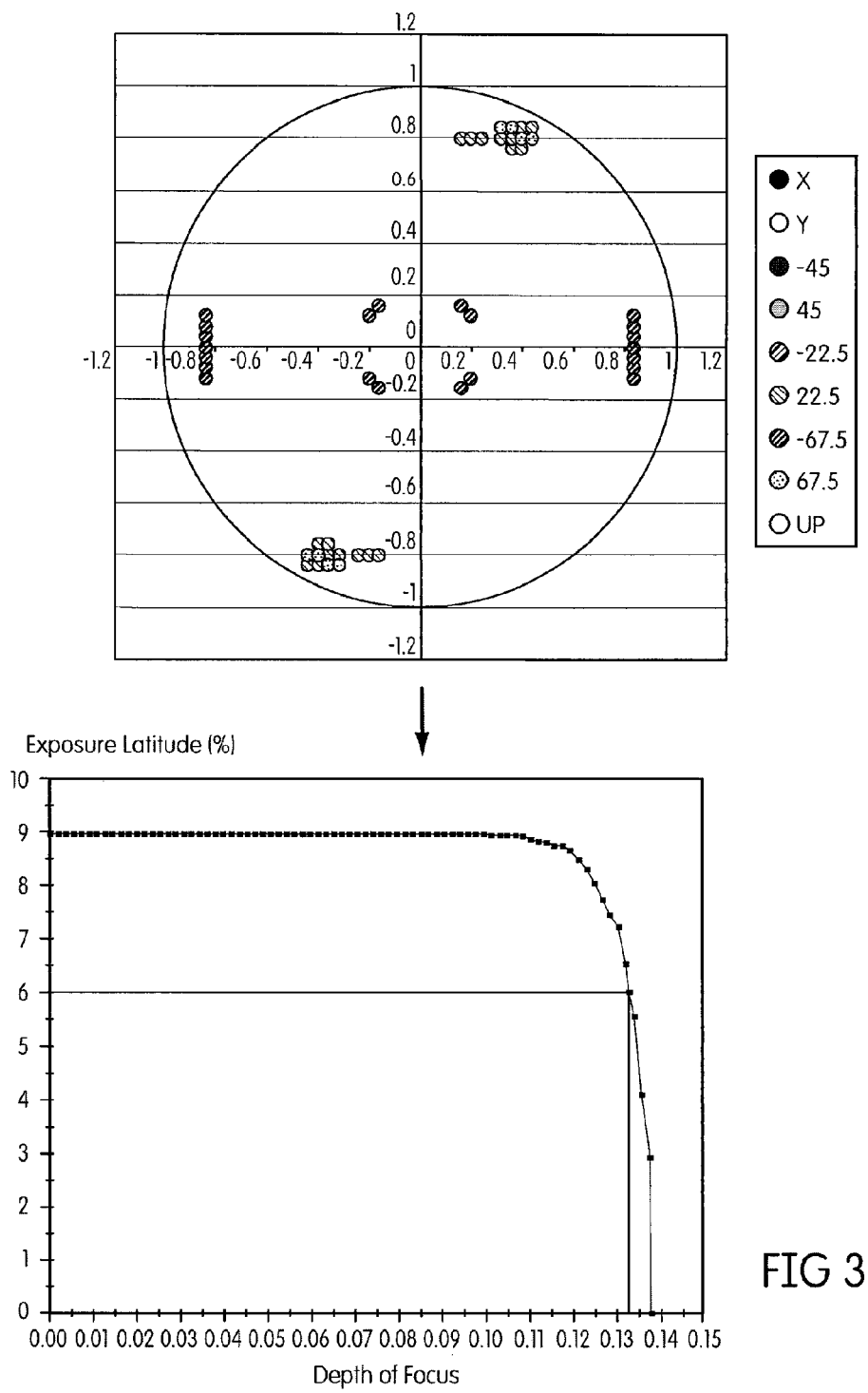
FIGS. 35a-b show the combined exposure latitude for the illumination source of FIGS. 28b and 33 in accordance with an embodiment of the invention.
Figure 35B:
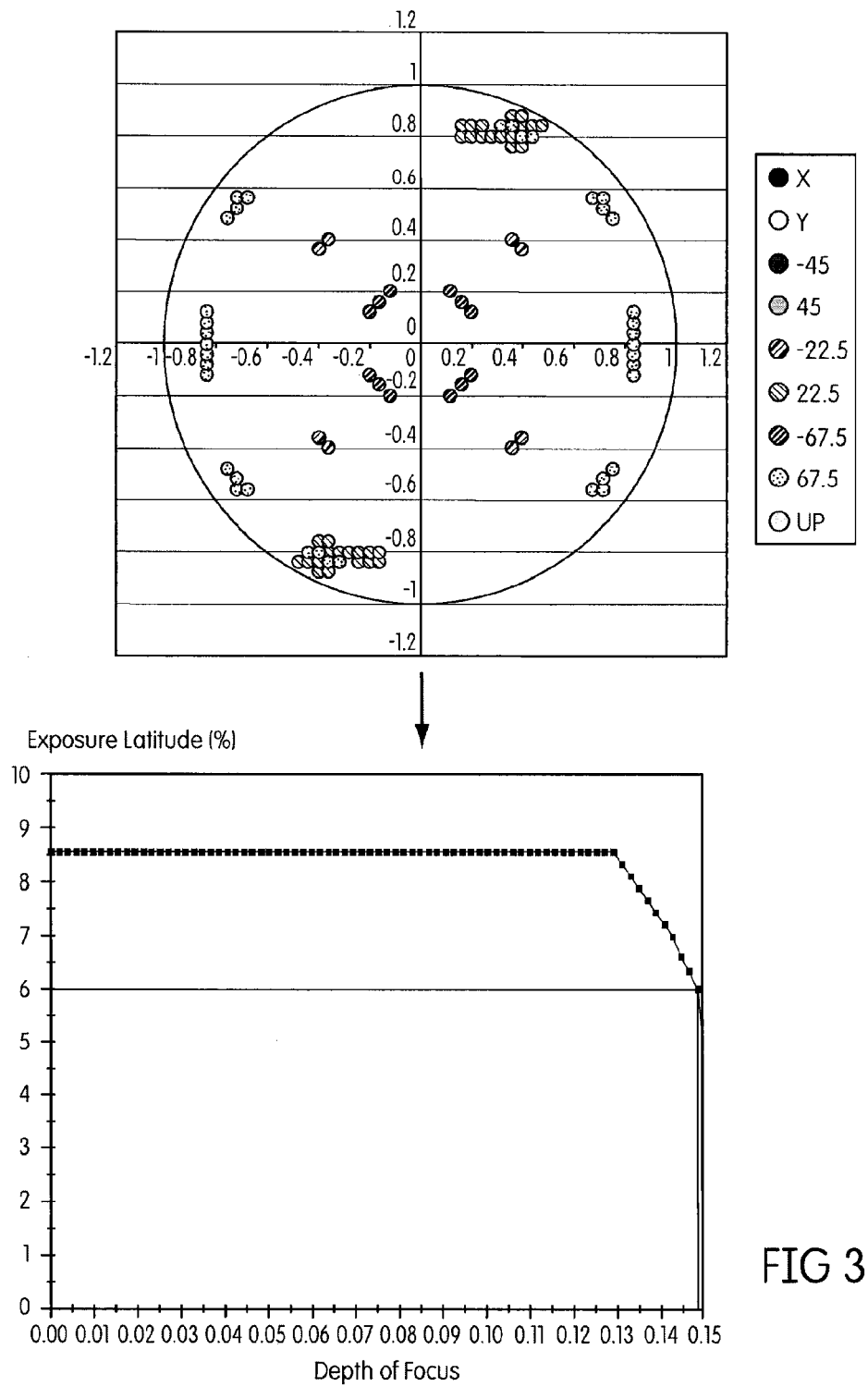

FIGS. 35a-b show the combined exposure latitude vs. depth of focus graph for the illumination source of FIGS. 28b and 33. As can be seen in FIG. 35b, the exposure latitude vs. depth of focus is increased from 133 nm (133 nm @ 6% EL) to 148 nm (148 nm @ 6% EL) when 3D mask effects are accounted for during the SMPO procedure.

Figure 36A:
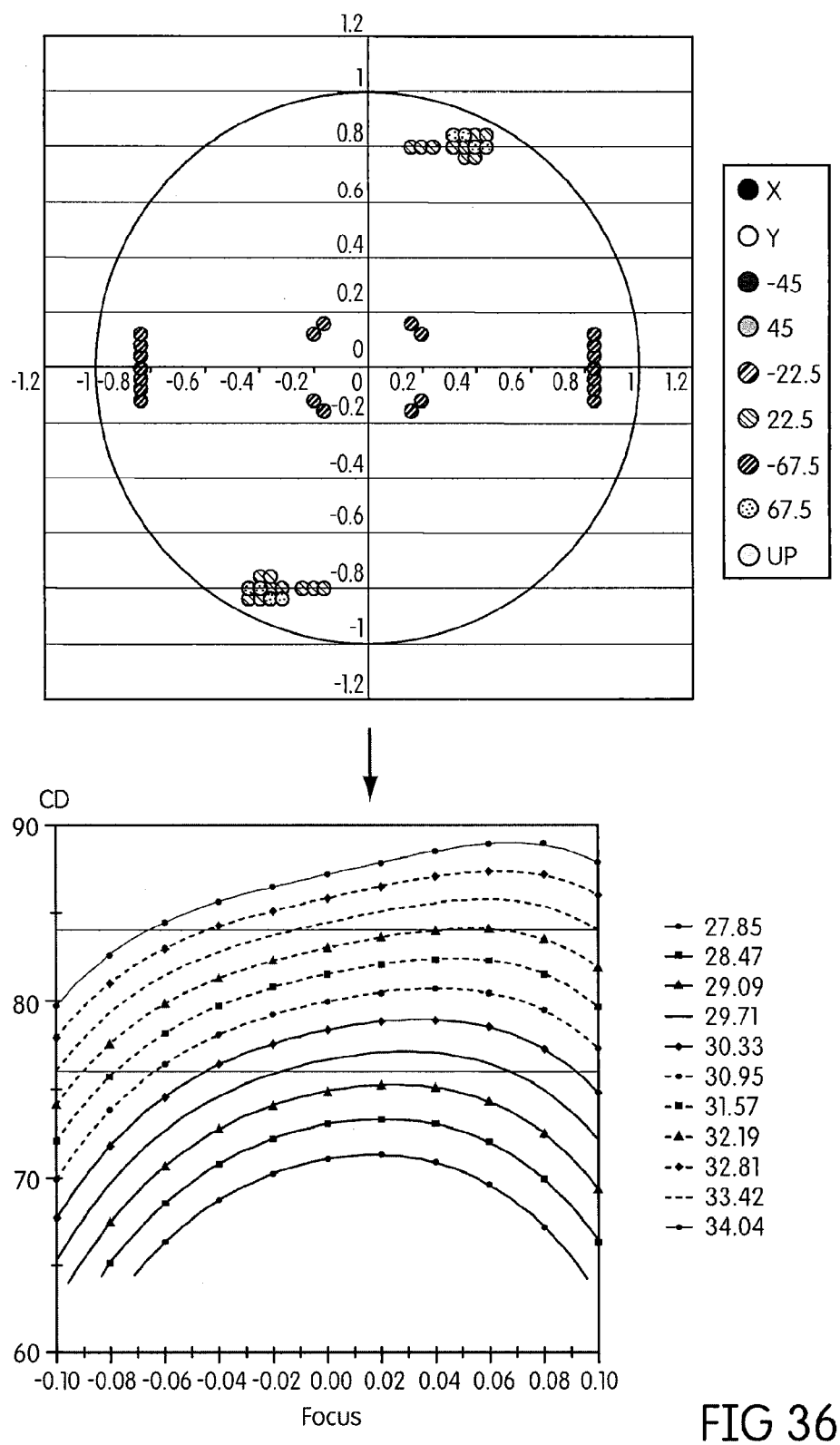
FIGS. 36a-b show focus exposure graphs (FEM) obtained for the 80 nm H iso trench pattern using, respectively, the optimized illumination source of FIG. 28b and the illumination source of FIG. 33 in accordance with an embodiment of the invention.
Figure 36B:
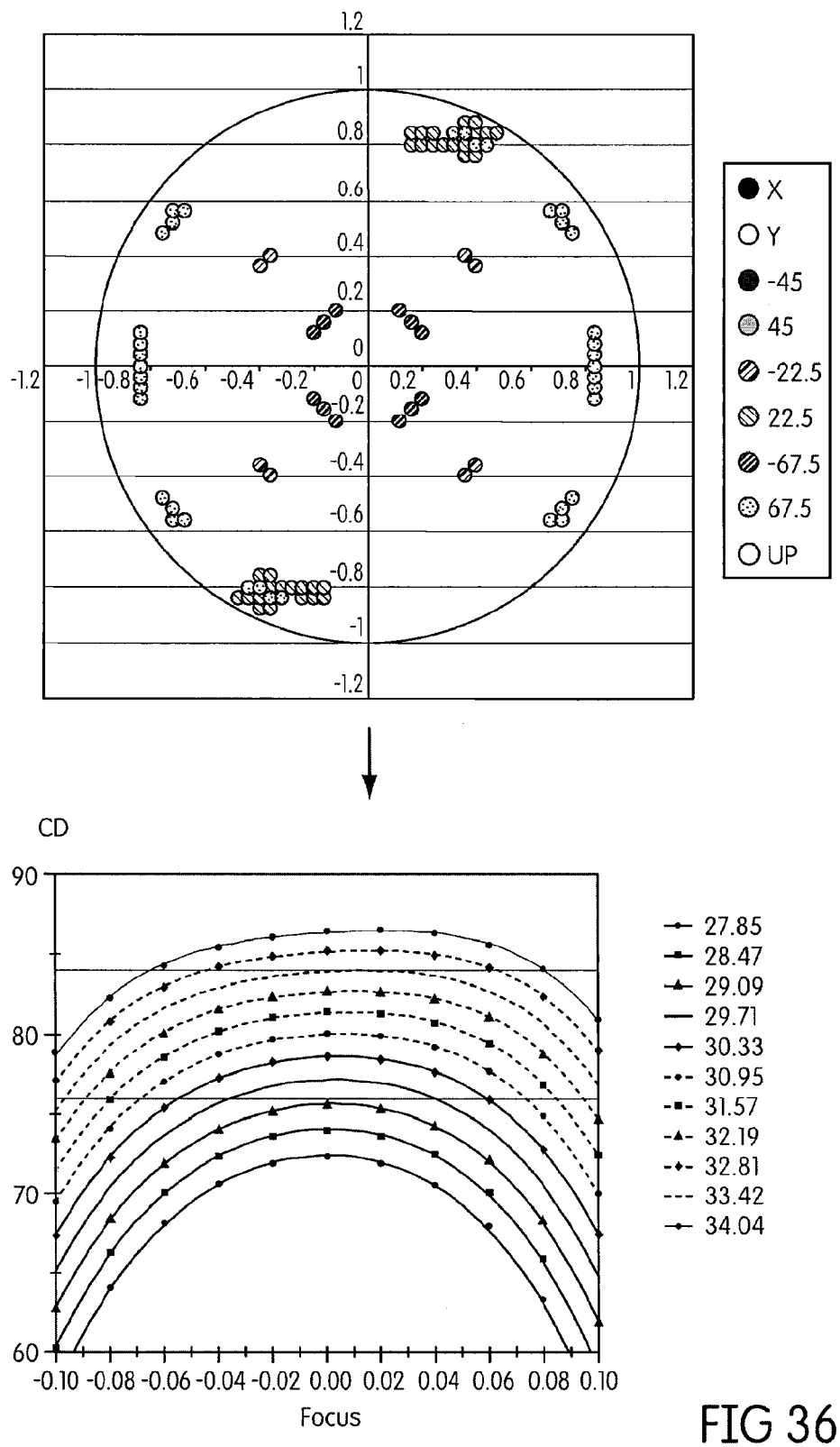

FIGS. 36a-b show focus exposure graphs (FEM) obtained for the 80 nm H iso trench pattern using, respectively, the optimized illumination sources of FIGS. 28b and 33. As can be seen in FIG. 36b, the FEM is less tilted when 3D mask effects are accounted for during the SMPO procedure.

It will be appreciated that the different acts involved in configuring the illumination source may be executed according to machine executable instructions or codes. These machine executable instructions may be embedded in a data storage medium, e.g., of a control unit of the lithographic apparatus or in a computer system that is separate from the lithographic apparatus. The control unit or computer system may include a processor. The processor may be configured to control the adjusting device AM and to modify the cross-sectional intensity distribution in the beam exiting the illumination system IL. The processor may be configured to execute the instructions.

While much of the description has been in terms of optimization, optimization need not be performed all or part of the time or for all parts of the illumination and/or pattern/patterning device. For example, the source and/or polarization optimization may be performed completely or partially "sub-optimally" for expedience, due to imaging requirements, for parts of the patterning device/pattern, etc.

Software functionalities of a computer system involving programming, including executable codes, may be used to implement the above described imaging model. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157, 126 nm) or extreme ultraviolet (EUV) radiation (e.g. having a wavelength of or about 13.5 nm).

The term "lens", where the context allows, may refer to any one or combination of various types of optical components, including refractive, reflective, magnetic, electromagnetic and electrostatic optical components.

Embodiments of the invention may further be described using the following clauses:

1. A method for configuring an illumination source of a lithographic apparatus to enhance the imaging of a mask pattern onto a substrate, the image of the mask pattern on the substrate having a plurality of critical dimensions, the method comprising:

dividing the illumination source into pixel groups, each pixel group including one or more illumination source points in a pupil plane of the illumination source;

changing a polarization state of each pixel group and determining an incremental effect on each of the plurality of critical dimensions resulting from the change of polarization state of each pixel group;

calculating a first plurality of sensitivity coefficients for each of the plurality of critical dimensions using the determined incremental effects;

selecting an initial illumination source;

iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source; and adjusting the initial illumination source based on the iterative results of calculations.

2. The method of clause 1, wherein the iteratively calculating comprise multiplying the first plurality of sensitivity coefficients by multipliers.

3. The method of clause 1, wherein the polarization state of each pixel group is changed to at least two different polarization states.

4. The method of clause 1, wherein the polarization state of each pixel group is incrementally rotated by a predetermined amount.

5. The method of clause 4, wherein the amount is +/−45°.

6. The method of clause 1, comprising changing an intensity of each pixel group and determining an incremental effect on each of the plurality of critical dimensions resulting from the change of intensity of each pixel group;

calculating a second plurality of sensitivity coefficients for each of the plurality of critical dimensions using the incremental effects determined by the change of intensity of each pixel group; and iteratively calculating the lithographic metric as a result of a change of intensity of a pixel group in the initial illumination source using the calculated second plurality of sensitivity coefficients, the change of intensity of the pixel group in the initial illumination source creating another modified illumination source.

7. The method of clause 6, wherein the intensity of each pixel group is changed by a predetermined increment.

8. The method of clause 7, wherein the predetermined increment is +/−10%.

9. The method of clause 6, wherein the lithographic metric is a critical dimension uniformity of the pattern, a process window, a dimension of the process window, MEEF, maximum NILS, maximum NILS in defocus, depth of focus or an exposure latitude.

10. The method of clause 1, wherein the lithographic metric is calculated using 3 dimensional mask effects.

11. The method of clause 1, comprising modifying the adjusted illumination source to account for 3 dimensional mask effects.

12. The method of clause 11, wherein the modifying includes for each pixel group of the adjusted illumination source, calculating the lithographic metric as a result of a change of polarization state or the illumination state of the pixel group using the calculated first plurality of sensitivity coefficients, the lithographic metric being calculated using 3 dimensional mask effects.

13. A computer product having machine executable instructions, the instructions being executable by a machine to perform a method for configuring an illumination source of a lithographic apparatus to enhance the imaging of a mask pattern onto a substrate, the image of the mask pattern onto the substrate having a plurality of critical dimensions, the method comprising:

dividing the illumination source into pixel groups, each pixel group including one or more illumination source points in a pupil plane of the illumination source;

changing a polarization state of each pixel group and determining an incremental effect on each of the plurality of critical dimensions resulting from the change of polarization state of each pixel group;

calculating a first plurality of sensitivity coefficients for each of the plurality of critical dimensions using the determined incremental effects;

selecting an initial illumination source;

iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source; and adjusting the initial illumination source based on the iterative results of calculations.

14. The computer product of clause 13, wherein the polarization state of each pixel group is incrementally rotated by a predetermined amount.

15. The computer product of clause 14, wherein the amount is +/−45°.

16. The computer product of clause 13, wherein the lithographic metric is a critical dimension uniformity of the pattern, a process window, a dimension of the process window, MEEF, maximum NILS, maximum NILS in defocus, depth of focus or an exposure latitude.

17. The computer product of clause 13, wherein the method comprises changing an intensity of each pixel group and determining an incremental effect on each of the plurality of critical dimensions resulting from the change of intensity of each pixel group;

calculating a second plurality of sensitivity coefficients for each of the plurality of critical dimensions using the incremental effects determined by the change of intensity of each pixel group; and iteratively calculating the lithographic metric as a result of a change of intensity of a pixel group in the initial illumination source using the calculated second plurality of sensitivity coefficients, the change of intensity of the pixel group in the initial illumination source creating another modified illumination source.

18. The computer product of clause 17, wherein the intensity of each pixel group is changed by a predetermined increment.

19. The computer product of clause 18, wherein predetermined increment is +/−10%.

20. The computer product of clause 17, wherein the lithographic metric is a critical dimension uniformity of the pattern, a process window, a dimension of the process window, MEEF, maximum NILS, maximum NILS in defocus, depth of focus or an exposure latitude.

21. A method for configuring an illumination source of a lithographic apparatus to enhance the imaging of a mask pattern, the method comprising:

performing a source mask optimization procedure using scalar imaging to provide a preliminary optimized illumination source and a preliminary optimized mask pattern, and performing a source mask polarization optimization procedure using, as initial conditions, the preliminary optimized illumination source and the preliminary optimized mask pattern.

22. A method for configuring a transfer of an image of a pattern onto a substrate in a lithographic apparatus, said pattern to be illuminated by an illumination source of the lithographic apparatus, the method comprising:

determining a first illumination source configured to illuminate said pattern;

performing a source mask polarization optimization procedure that takes into account three dimensional effects associated with said pattern, said source mask polarization optimization procedure performed using said first illumination source as an initial illumination source in said source mask polarization optimization procedure.

23. The method of clause 22, wherein the pattern is arranged on a support and the three dimensional effects are taken into account by using a thickness of the support and/or a material of the support in said source mask polarization optimization procedure.

24. The method of clause 23, wherein the support is a lithographic mask.

25. The method of clause 22, wherein said determining and said performing are carried out by computer simulations.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for configuring an illumination source of a lithographic apparatus to enhance the imaging of a mask pattern onto a substrate, the image of the mask pattern on the substrate having a plurality of critical dimensions, the method comprising:
dividing the illumination source into pixel groups, each pixel group including one or more illumination source points in a pupil plane of the illumination source;
changing a polarization state of each pixel group and determining an incremental effect on each of the plurality of critical dimensions resulting from the change of polarization state of each pixel group;
calculating a first plurality of sensitivity coefficients for each of the plurality of critical dimensions using the determined incremental effects;
selecting an initial illumination source including a plurality of pixel groups;
iteratively calculating a lithographic metric as a result of a change of polarization state of a single pixel group in the initial illumination source using the calculated first plurality of sensitivity coefficients, the lithographic metric in each iteration being calculated with the selected plurality of pixel groups in which the polarization state of the single pixel group has been changed and in which a polarized or unpolarized state of another pixel group of the selected plurality of pixel groups is unchanged, the change of the polarization state of the pixel group in the initial illumination source creating a modified illumination source; and
adjusting the initial illumination source based on the iterative results of calculations.

2. The method of claim 1, wherein the lithographic metric is a critical dimension uniformity of the pattern, a process window, a dimension of the process window, MEEF, maximum NILS, maximum NILS in defocus, depth of focus or an exposure latitude.

3. The method of claim 1, comprising
changing an intensity of each pixel group and determining an incremental effect on each of the plurality of critical dimensions resulting from the change of intensity of each pixel group;
calculating a second plurality of sensitivity coefficients for each of the plurality of critical dimensions using the incremental effects determined by the change of intensity of each pixel group; and
iteratively calculating the lithographic metric as a result of a change of intensity of a pixel group in the initial illumination source using the calculated second plurality of sensitivity coefficients, the change of intensity of the pixel group in the initial illumination source creating another modified illumination source.

4. The method of claim 1, comprising modifying the adjusted illumination source to account for 3 dimensional mask effects, wherein the modifying includes
for each pixel group of the adjusted illumination source, calculating the lithographic metric as a result of a change of polarization state or the illumination state of the pixel group using the calculated first plurality of sensitivity coefficients, the lithographic metric being calculated using 3 dimensional mask effects.

5. A non-transitory computer product having machine executable instructions, the instructions being executable by a machine to perform a method for configuring an illumination source of a lithographic apparatus to enhance the imaging of a mask pattern onto a substrate, the image of the mask pattern onto the substrate having a plurality of critical dimensions, the method comprising:
dividing the illumination source into pixel groups, each pixel group including one or more illumination source points in a pupil plane of the illumination source;
changing a polarization state of each pixel group and determining an incremental effect on each of the plurality of critical dimensions resulting from the change of polarization state of each pixel group;
calculating a first plurality of sensitivity coefficients for each of the plurality of critical dimensions using the determined incremental effects;
selecting an initial illumination source including a plurality of pixel groups;
iteratively calculating a lithographic metric as a result of a change of polarization state of a single pixel group in the initial illumination source using the calculated first plurality of sensitivity coefficients, the lithographic metric in each iteration being calculated with the selected plurality of pixel groups in which the polarization state of the single pixel group has been changed and in which a polarized or unpolarized state of another pixel group of the selected plurality of pixel groups is unchanged, the change of the polarization state of the pixel group in the initial illumination source creating a modified illumination source; and
adjusting the initial illumination source based on the iterative results of calculations.

6. A lithographic apparatus comprising:
an illumination source configured to condition a beam of radiation;
a substrate table configured to hold a substrate;
a projection system configured to project a beam of radiation patterned by a patterning device onto a surface of the substrate; and
a processor configured to perform a method for configuring the illumination source to enhance the imaging of a pattern onto a substrate, the image of the mask pattern onto the substrate having a plurality of critical dimensions, the method comprising:

dividing the illumination source into pixel groups, each pixel group including one or more illumination source points in a pupil plane of the illumination source;

changing a polarization state of each pixel group and determining an incremental effect on each of the plurality of critical dimensions resulting from the change of polarization state of each pixel group;

calculating a first plurality of sensitivity coefficients for each of the plurality of critical dimensions using the determined incremental effects;

selecting an initial illumination source including a plurality of pixel groups;

iteratively calculating a lithographic metric as a result of a change of polarization state of a single pixel group in the initial illumination source using the calculated first plurality of sensitivity coefficients, the lithographic metric in each iteration being calculated with the selected plurality of pixel groups in which the polarization state of the single pixel group has been changed and in which a polarized or unpolarized state of another pixel group of the selected plurality of pixel groups is unchanged, the change of the polarization state of the pixel group in the initial illumination source creating a modified illumination source; and adjusting the initial illumination source based on the iterative results of calculations.

7. A method for configuring an illumination source of a lithographic apparatus to enhance the imaging of a mask pattern, the method comprising:

dividing a pupil plane of the illumination source into pixel groups, each pixel group including one or more illumination source pixels in the pupil plane;

selecting an initial set of pixel groups of the illumination source as an initial illumination source;

iteratively (a) changing a polarization state of a single pixel group from at least a subgroup of the set of selected pixel groups in the initial illumination source while keeping a polarized or unpolarized state of another pixel group of the set of selected pixel groups unchanged, (b) after (a), calculating a lithographic metric associated with at least a part of the mask pattern as a result of the changed polarization state, the lithographic metric being calculated in each iteration with the selected set of pixel groups in which the polarization state of the single pixel group has been changed and in which the polarized or unpolarized state of the other pixel group of the set of selected pixel groups is unchanged and (c) after (b), applying the change of the polarization state of the pixel group to generate a modified illumination source when the calculated lithographic metric is improved due to the changed polarization state; and adjusting the initial set of pixel groups of the illumination source based on the iterative results of calculations.

8. The method of claim 7, wherein the lithographic metric is a critical dimension uniformity of the pattern, a process window, a dimension of the process window, MEEF, maximum NILS, maximum NILS in defocus, depth of focus or an exposure latitude.

9. The method according to claim 7, wherein the method further comprises determining a polarization sensitivity coefficient defining a sensitivity of the polarization change of a pixel group to the lithographic metric associated with the at least part of the mask pattern, the polarization sensitivity coefficient of a pixel group being determined by:

changing a polarization state of the pixel group;

determining an incremental effect on the lithographic metric associated with at least a part of the mask pattern resulting from the change of polarization state of the pixel group;

calculating the polarization sensitivity coefficients for the lithographic metric using the determined incremental effect; and wherein the changing of the polarization state in the iterative process steps include using the calculated polarization sensitivity coefficient to adapt the polarization of the pixel group.

10. The method according to claim 9, wherein the polarization sensitivity coefficient is determined for the selected pixel groups in the initial illumination source.

11. The method according to claim 7, wherein the at least a part of the mask pattern comprises a critical dimension or a plurality of critical dimensions.

12. The method according to claim 7, wherein the method further comprises determining an intensity sensitivity coefficient defining a sensitivity of an intensity change of a pixel group to the lithographic metric associated with the at least part of the mask pattern, the intensity sensitivity coefficient of a pixel group being determined by:

changing an intensity of the pixel group;

determining an incremental effect on the lithographic metric associated with at least a part of the mask pattern resulting from the change of intensity of the pixel group;

calculating the intensity sensitivity coefficients for the lithographic metric using the determined incremental effect; and wherein the method for configuring the illumination source further comprises:

iteratively calculating the lithographic metric as a result of a change of intensity of the pixel group in the initial illumination source using the calculated intensity sensitivity coefficient, the change of intensity of the pixel group in the initial illumination source creating another modified illumination source.

13. The method according to claim 12, wherein the intensity sensitivity coefficient is determined for the selected pixel groups in the initial illumination source.

14. The method according to claim 7, wherein prior to selecting an initial set of pixel groups of the illumination source as an initial illumination source, the method includes performing a source mask optimization procedure using scalar imaging to find a preliminary optimized illumination source and a preliminary optimized mask pattern.

15. The method according to claim 14, wherein the initial illumination source is the preliminary optimized illumination source.

16. A method for configuring an illumination source of a lithographic apparatus to enhance the imaging of a mask pattern, the method comprising:

performing a source mask optimization procedure, with a computer system, using scalar imaging to provide a preliminary optimized illumination source and a preliminary optimized mask pattern, and performing a source mask polarization optimization procedure, with the computer system, using, as initial conditions, the preliminary optimized illumination source and the preliminary optimized mask pattern to provide a configured illumination source and configured mask pattern, and illuminating the configured mask pattern with the configured illumination source using the lithographic apparatus.

17. A method for configuring a transfer of an image of a pattern onto a substrate in a lithographic apparatus, said pattern to be illuminated by an illumination source of the lithographic apparatus, the method comprising:
- determining a first illumination source configured to illuminate said pattern;
- performing a source mask polarization optimization procedure, with a computer system, that takes into account three dimensional effects associated with said pattern, said source mask polarization optimization procedure performed using said first illumination source as an initial illumination source in said source mask polarization optimization procedure, said source mask polarization optimization procedure to provide, after the source mask polarization optimization procedure has ended, a configured illumination source and configured mask pattern, and
- illuminating the configured mask pattern with the configured illumination source using the lithographic apparatus,
- wherein determining the first illumination source comprises performing a first source mask polarization optimization procedure, or performing a source mask optimization procedure, with the computer system, without taking into account the three dimensional effects,
- wherein the source mask polarization optimization procedure that takes into account three dimensional effects associated with said pattern is performed after the first source mask polarization optimization procedure or after the source mask optimization procedure has ended.

18. The method of claim 17, wherein the pattern is arranged on a support and the three dimensional effects are taken into account by using a thickness of the support and/or a material of the support in said source mask polarization optimization procedure.

19. The method of claim 18, wherein said source mask polarization optimization procedure is performed to reduce focus shifts and/or focus tilts due to three dimensional effects generated by said support.

* * * * *